US011205706B2

(12) United States Patent
Yang et al.

(10) Patent No.: US 11,205,706 B2
(45) Date of Patent: Dec. 21, 2021

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Yu-Lin Yang, Hsinchu County (TW); Tung Ying Lee, Hsinchu (TW); Shao-Ming Yu, Zhubei (TW); Chao-Ching Cheng, Hsinchu (TW); Tzu-Chiang Chen, Hsinchu (TW); Chao-Hsien Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 52 days.

(21) Appl. No.: 16/657,873

(22) Filed: Oct. 18, 2019

(65) Prior Publication Data
US 2020/0052086 A1 Feb. 13, 2020

Related U.S. Application Data

(60) Continuation of application No. 16/198,046, filed on Nov. 21, 2018, now Pat. No. 10,636,891, which is a
(Continued)

(51) Int. Cl.
*H01L 29/49* (2006.01)
*H01L 21/02* (2006.01)
(Continued)

(52) U.S. Cl.
CPC .......... *H01L 29/4991* (2013.01); *B82Y 10/00* (2013.01); *H01L 21/0217* (2013.01);
(Continued)

(58) Field of Classification Search
CPC ..... H01L 21/02; H01L 21/0217; H01L 21/31; H01L 21/31111; H01L 21/764;
(Continued)

(56) References Cited

U.S. PATENT DOCUMENTS 9,559,184 B2 1/2017 Ching et al.
9,728,621 B1 8/2017 Cheng et al.
(Continued)

FOREIGN PATENT DOCUMENTS

| CN | 106252410 A | 12/2016 |
| CN | 106847812 A | 6/2017 |
| TW | 201724278 A | 7/2017 |

OTHER PUBLICATIONS

Non-final Office Action issued in related U.S. Appl. No. 16/029,391, dated Feb. 1, 2019.
(Continued)

*Primary Examiner* — Fazli Erdem
(74) *Attorney, Agent, or Firm* — McDermott Will & Emery LLP

(57) ABSTRACT

In a method of manufacturing a semiconductor device, a fin structure, in which first semiconductor layers and second semiconductor layers are alternately stacked, is formed. A sacrificial gate structure is formed over the fin structure. A source/drain region of the fin structure, which is not covered by the sacrificial gate structure, is etched, thereby forming a source/drain space. The first semiconductor layers are laterally etched through the source/drain space. A first insulating layer is formed, in the source/drain space, at least on etched first semiconductor layers. A source/drain epitaxial layer is formed in the source/drain space, thereby forming air gaps between the source/drain epitaxial layer and the first semiconductor layers.

20 Claims, 41 Drawing Sheets

Related U.S. Application Data division of application No. 15/725,655, filed on Oct. 5, 2017, now Pat. No. 10,361,278.

(60) Provisional application No. 62/552,157, filed on Aug. 30, 2017.

(51) Int. Cl.

| | |
|---|---|
| *H01L 21/31* | (2006.01) |
| *H01L 29/66* | (2006.01) |
| *H01L 29/78* | (2006.01) |
| *H01L 29/423* | (2006.01) |
| *H01L 29/786* | (2006.01) |
| *H01L 21/764* | (2006.01) |
| *H01L 21/311* | (2006.01) |
| *H01L 21/3115* | (2006.01) |
| *H01L 29/06* | (2006.01) |
| *H01L 29/10* | (2006.01) |
| *H01L 29/08* | (2006.01) |
| *B82Y 10/00* | (2011.01) |
| *H01L 29/40* | (2006.01) |
| *H01L 29/775* | (2006.01) |

(52) U.S. Cl.
CPC .... *H01L 21/0228* (2013.01); *H01L 21/02164* (2013.01); *H01L 21/02532* (2013.01); *H01L 21/02603* (2013.01); *H01L 21/31111* (2013.01); *H01L 21/31155* (2013.01); *H01L 21/764* (2013.01); *H01L 29/0653* (2013.01); *H01L 29/0673* (2013.01); *H01L 29/0847* (2013.01); *H01L 29/1079* (2013.01); *H01L 29/401* (2013.01); *H01L 29/42376* (2013.01); *H01L 29/42392* (2013.01); *H01L 29/4908* (2013.01); *H01L 29/66439* (2013.01); *H01L 29/66545* (2013.01); *H01L 29/66742* (2013.01); *H01L 29/775* (2013.01); *H01L 29/78618* (2013.01); *H01L 29/78696* (2013.01)

(58) Field of Classification Search
CPC ..... H01L 29/06; H01L 29/0653; H01L 29/08; H01L 29/0847; H01L 29/10; H01L 29/1079; H01L 29/401; H01L 29/42; H01L 29/42376; H01L 29/49; H01L 29/4908; H01L 29/4991; H01L 29/66; H01L 29/66439; H01L 29/775; H01L 29/786; H01L 29/78; H01L 29/78618
USPC ....................................................... 257/347
See application file for complete search history.

(56) References Cited

U.S. PATENT DOCUMENTS

| | | |
|---|---|---|
| 9,887,269 B2 | 2/2018 | Ching et al. |
| 2014/0001441 A1 | 1/2014 | Kim et al. |
| 2017/0069481 A1 | 3/2017 | Doris et al. |
| 2017/0069763 A1 | 3/2017 | Doris et al. |
| 2017/0110554 A1* | 4/2017 | Tak ................... H01L 29/42392 |
| 2017/0194430 A1 | 7/2017 | Wood et al. |
| 2017/0200738 A1* | 7/2017 | Kim .................... H01L 21/845 |
| 2017/0250261 A1 | 8/2017 | Kim et al. |
| 2017/0309719 A1 | 10/2017 | Sun et al. |
| 2018/0190829 A1 | 7/2018 | Song et al. |
| 2018/0331232 A1 | 11/2018 | Frougier et al. |
| 2018/0358435 A1* | 12/2018 | Mochizuki ........ H01L 29/78696 |
| 2019/0027570 A1 | 1/2019 | Ching et al. |

OTHER PUBLICATIONS

Notice of Allowance issued in related U.S. Appl. No. 16/029,391, dated Jun. 12, 2019.
Final Office Action issued in related U.S. Appl. No. 15/725,655, dated Feb. 27, 2019.
Non-Final Office Action issued in related U.S. Appl. No. 16/198,046, dated Jul. 19, 2019.
Non-Final Office Action issued in related U.S. Appl. No. 15/725,655, dated Aug. 30, 2018.

\* cited by examiner

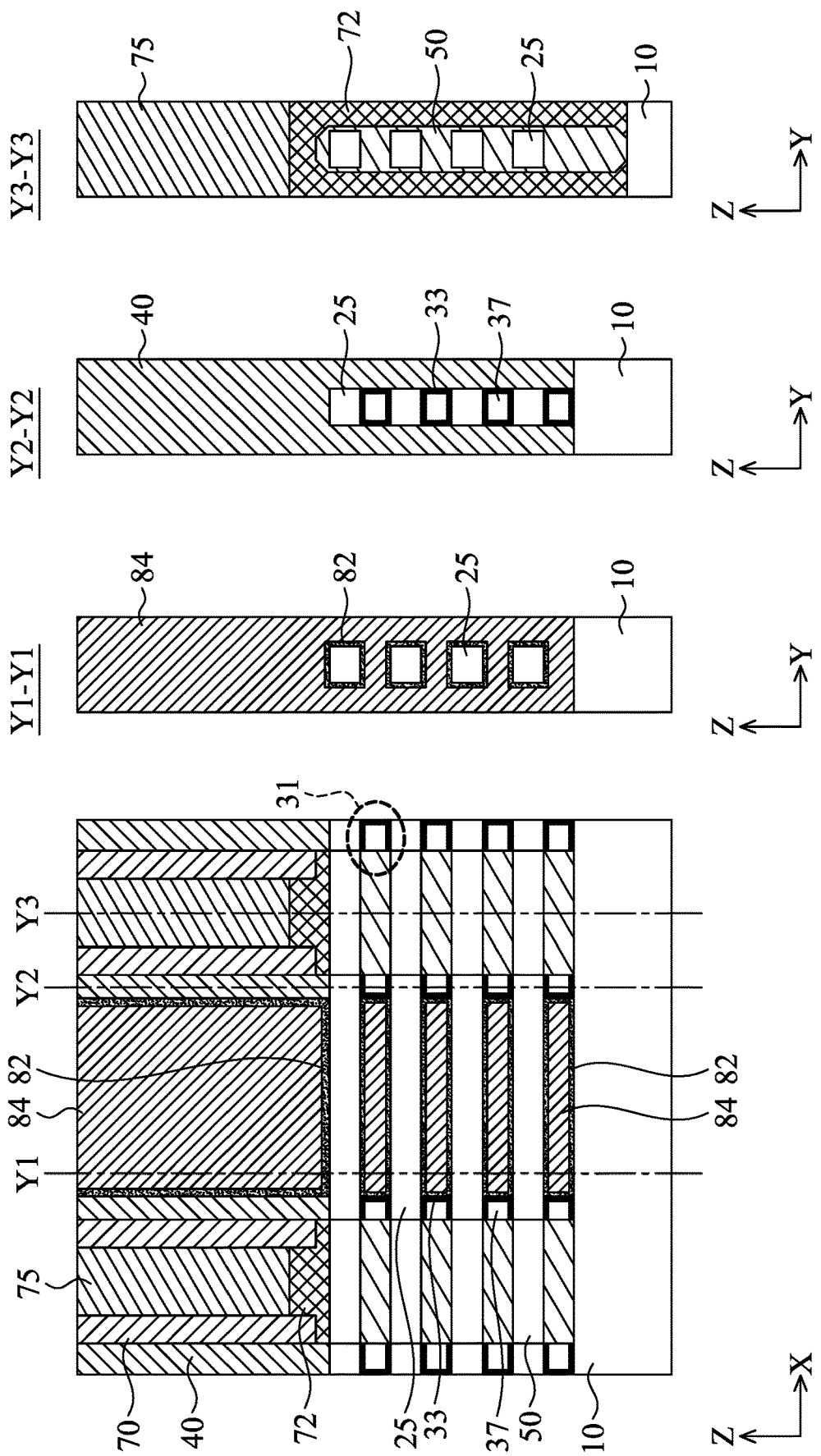

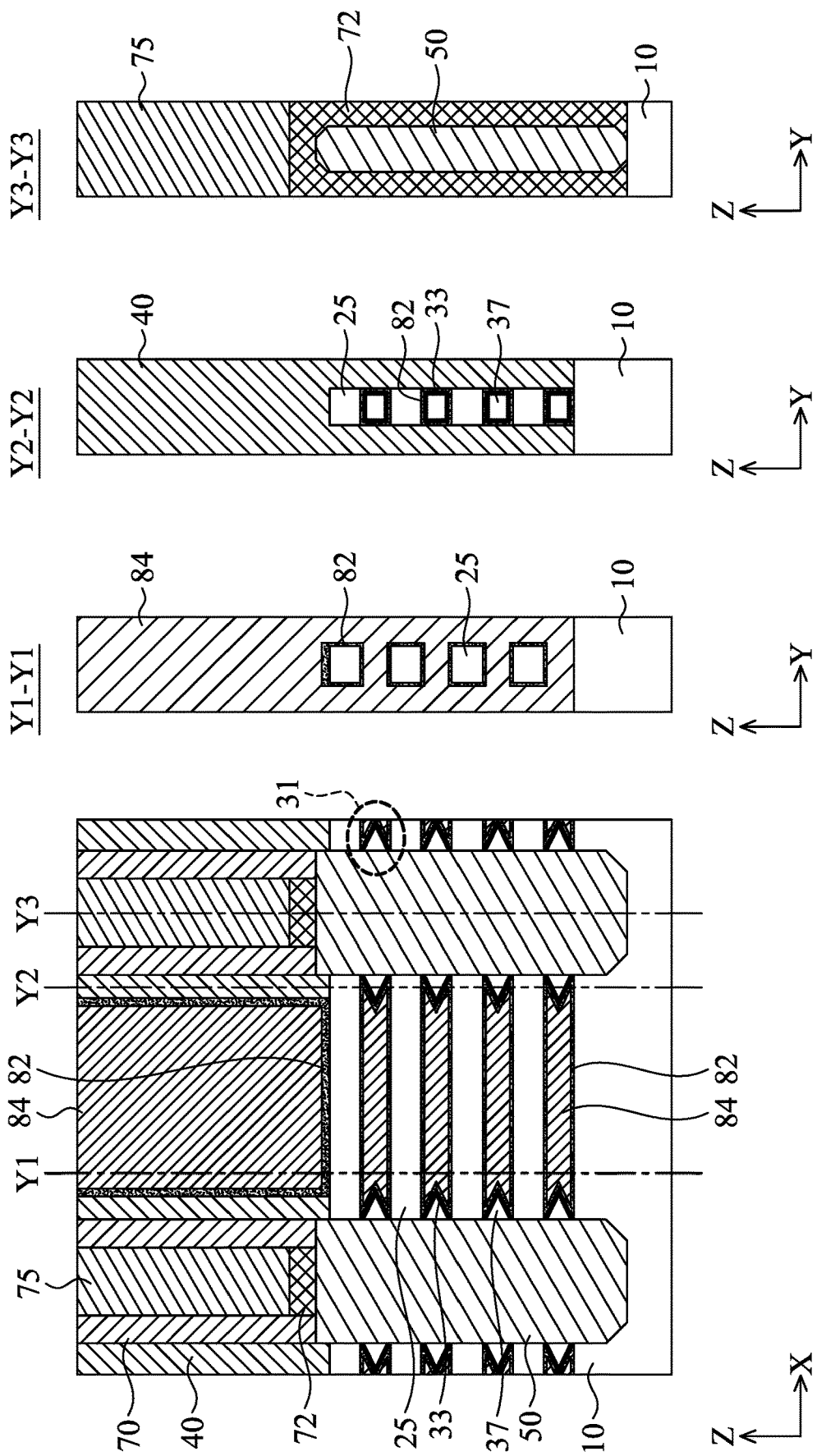

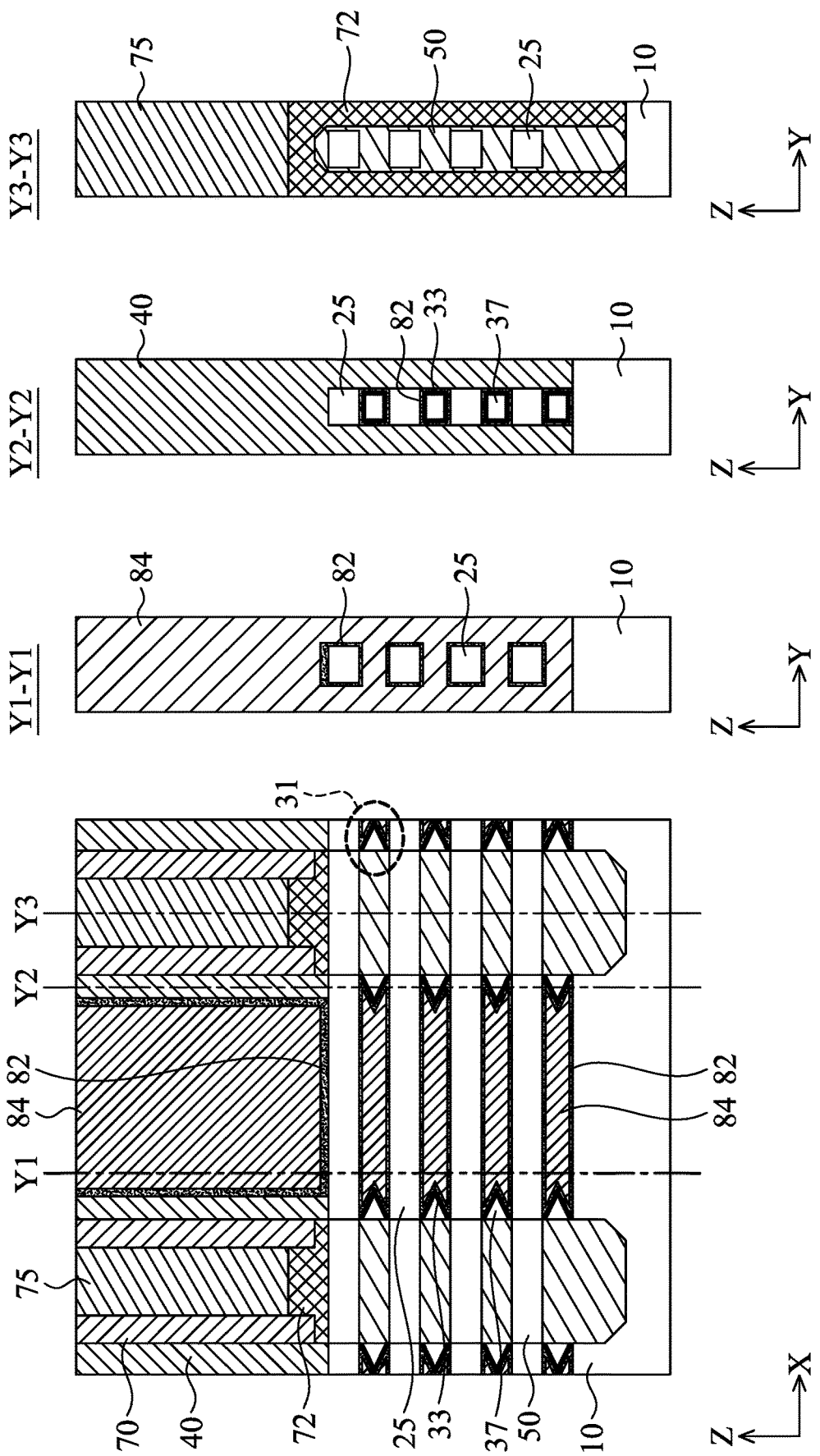

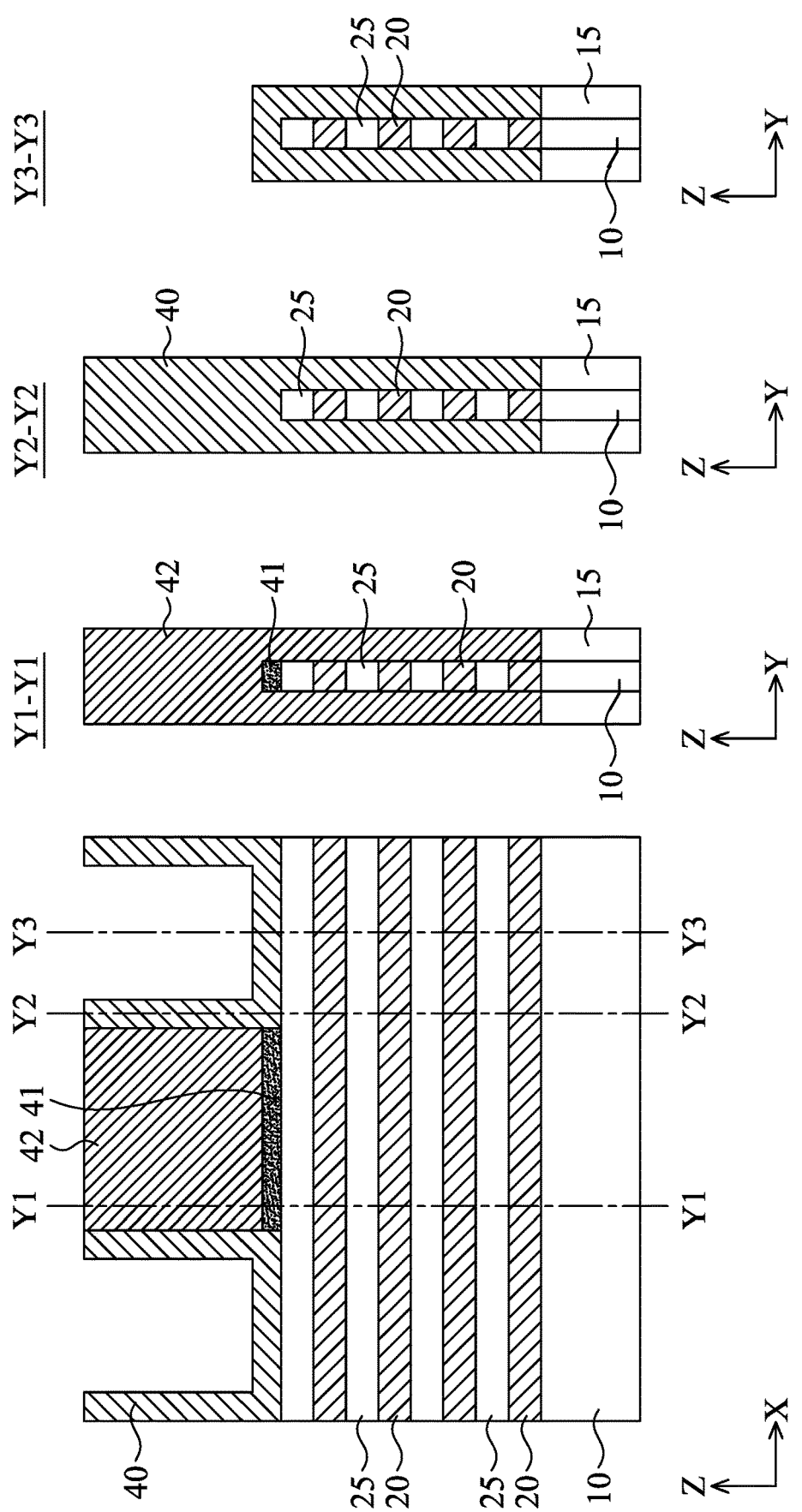

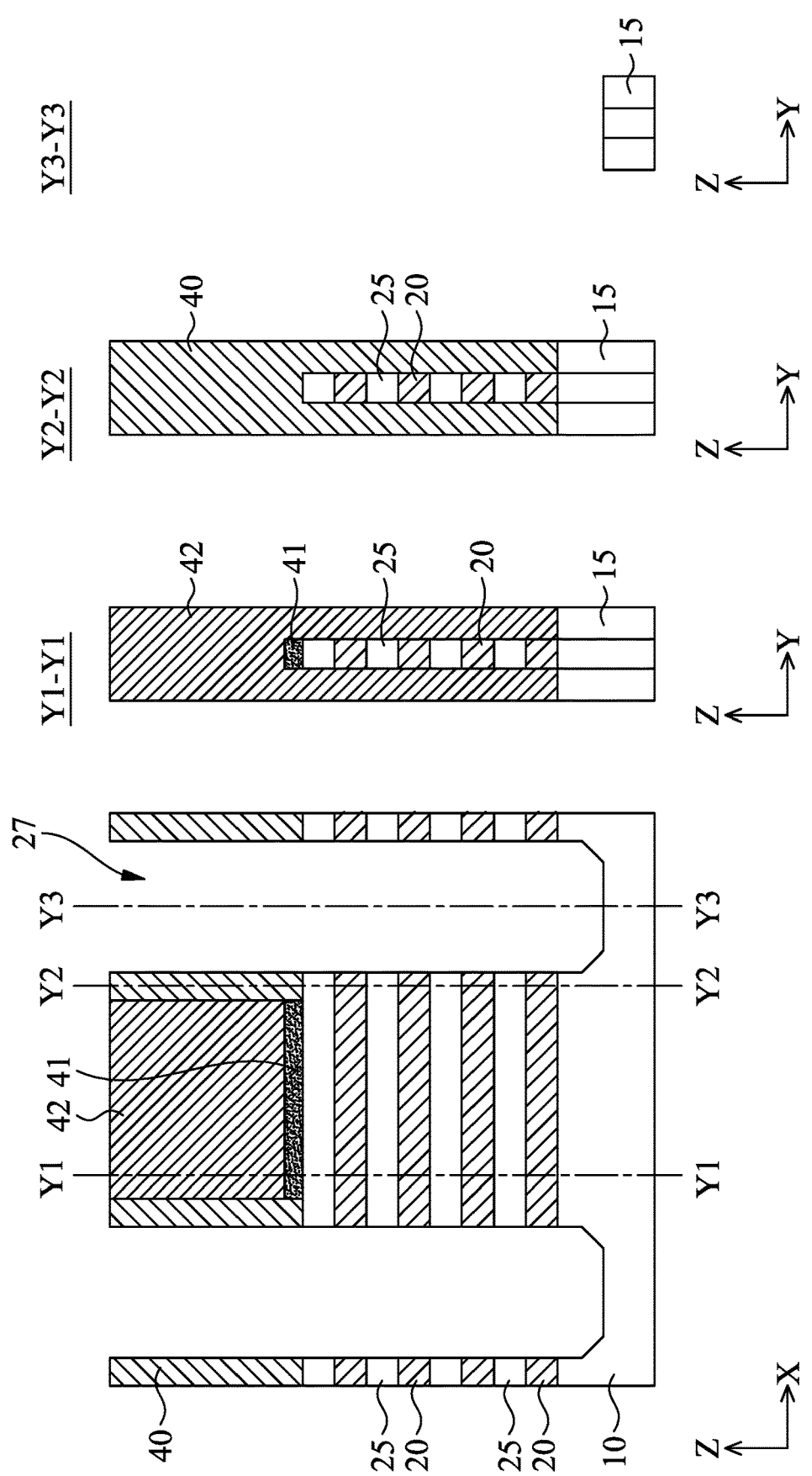

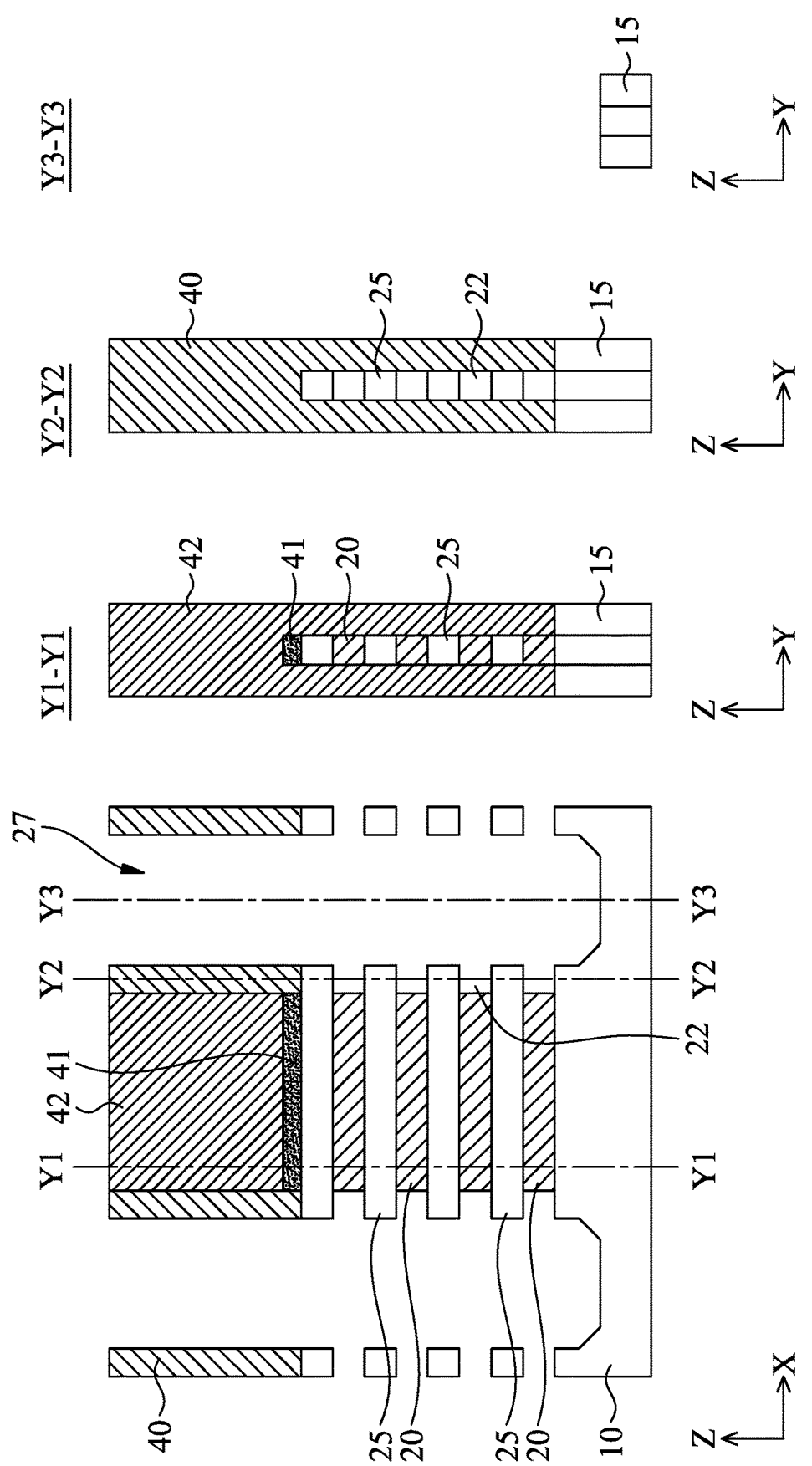

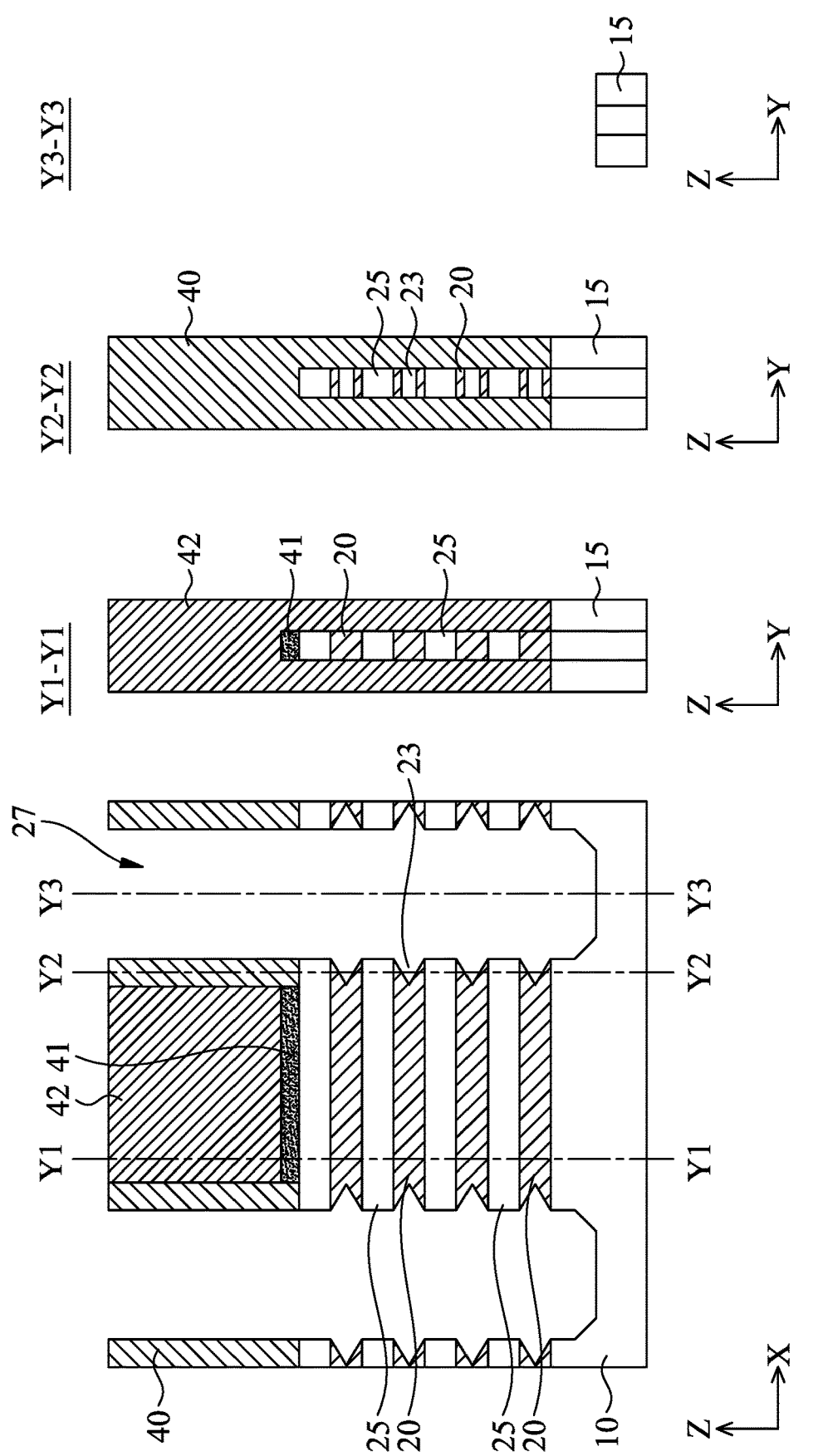

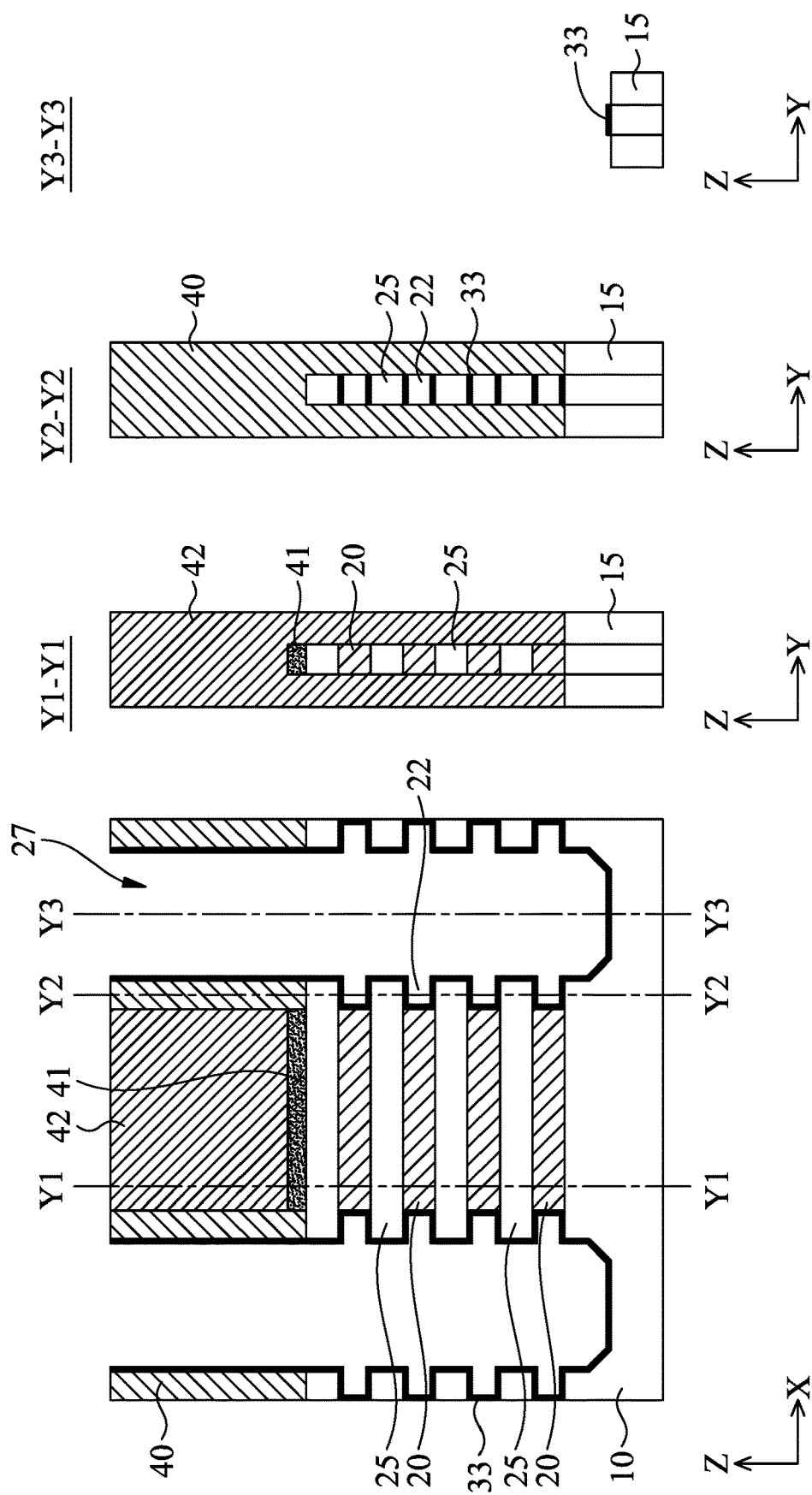

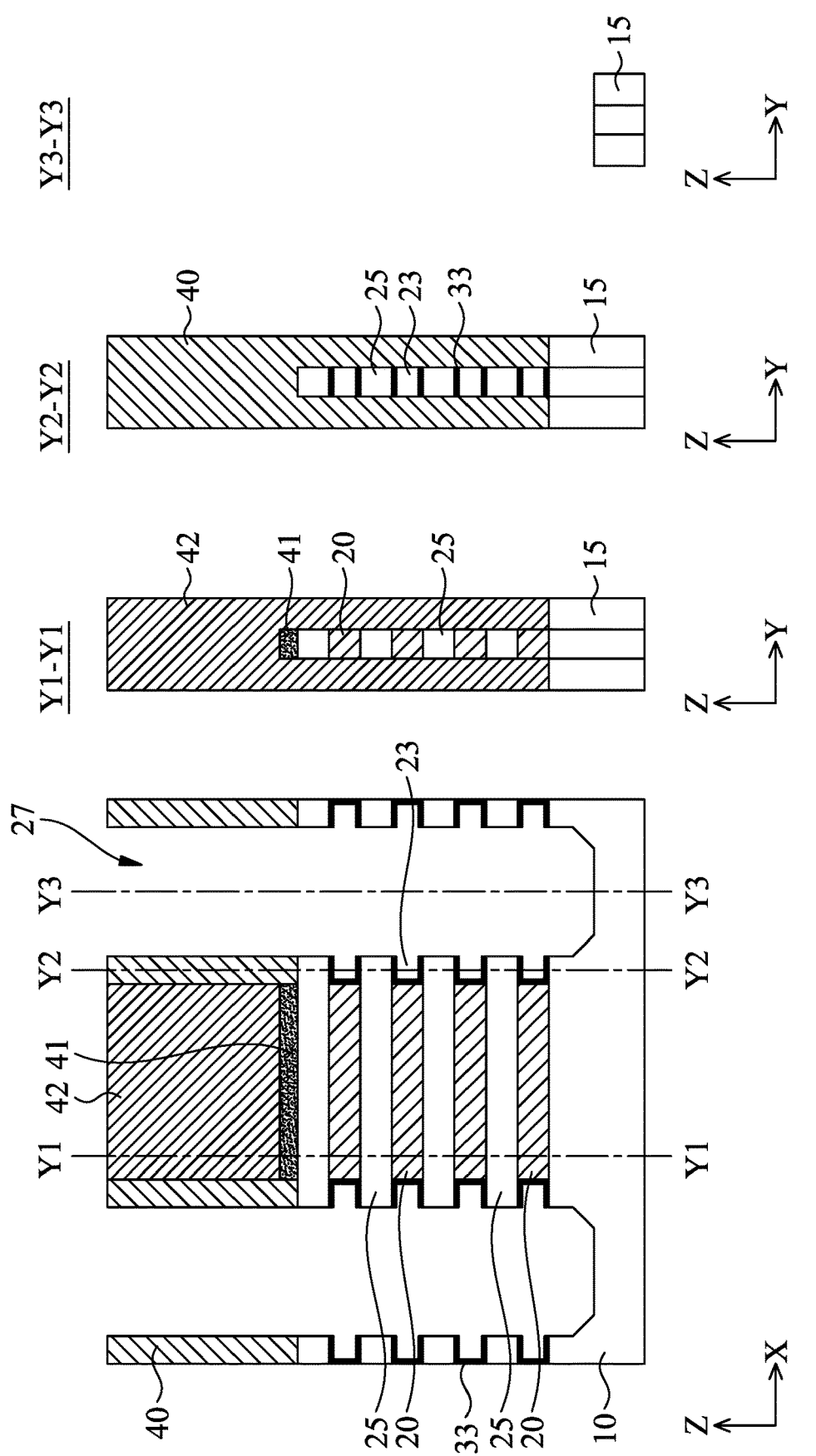

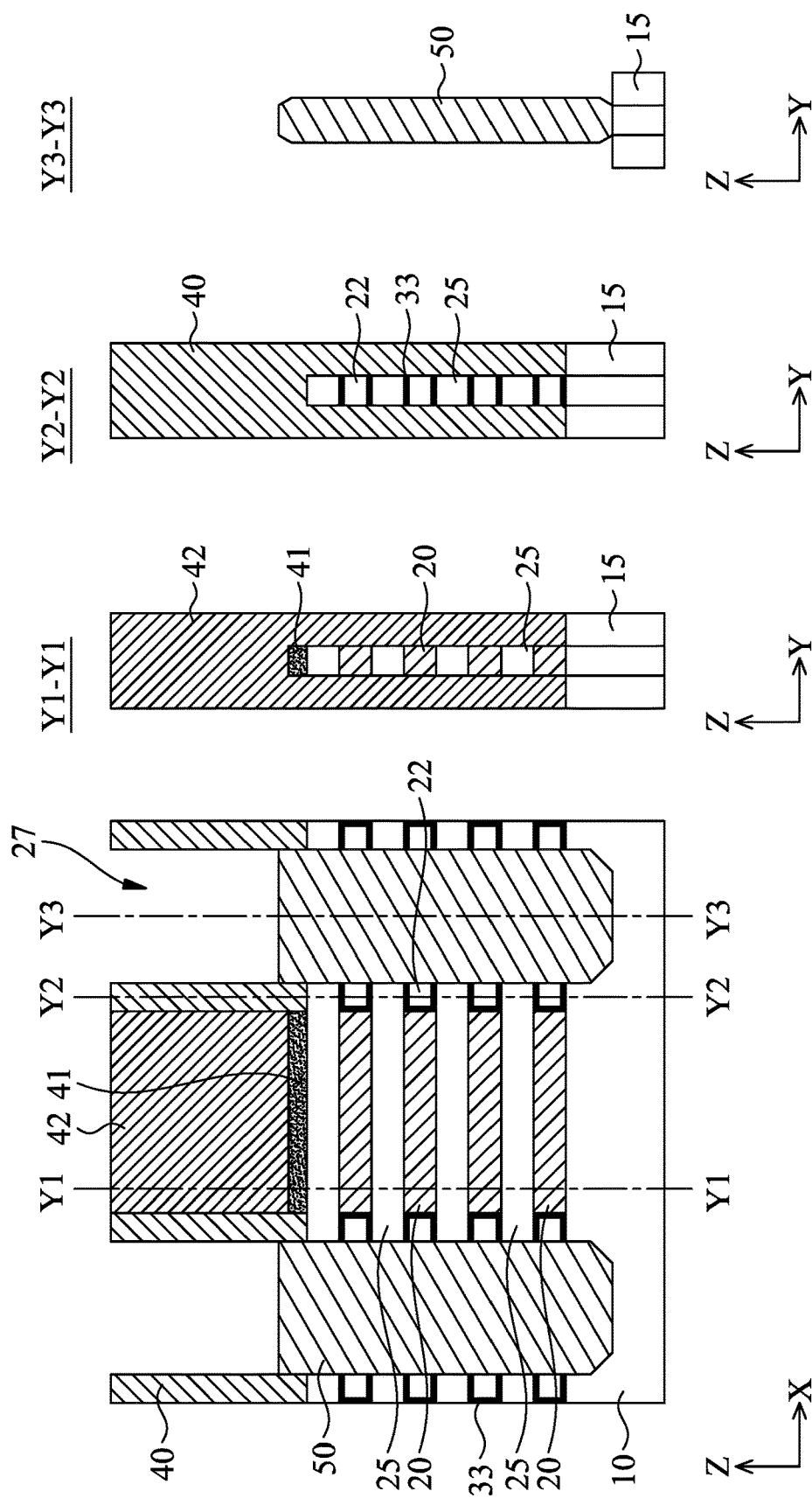

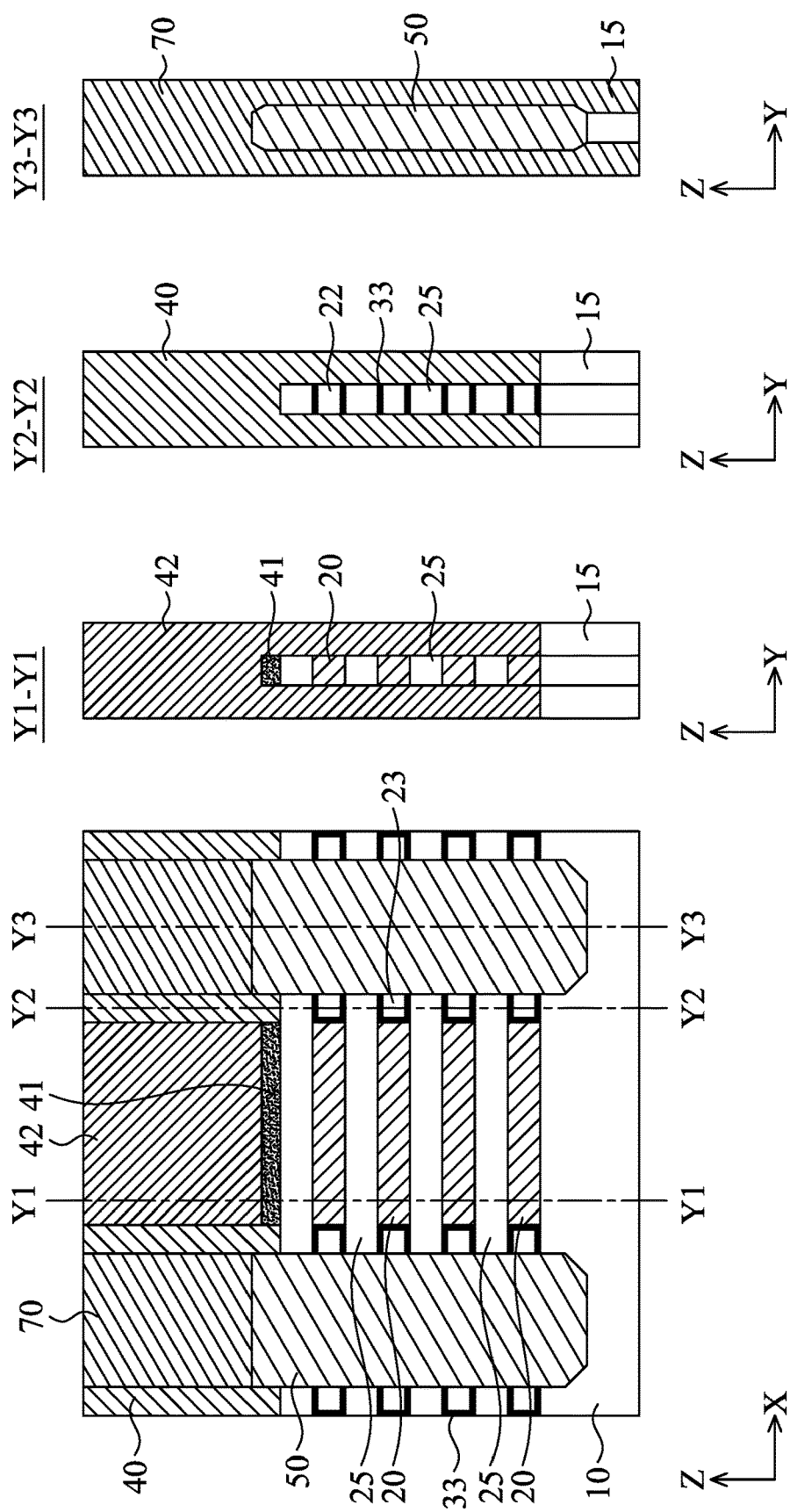

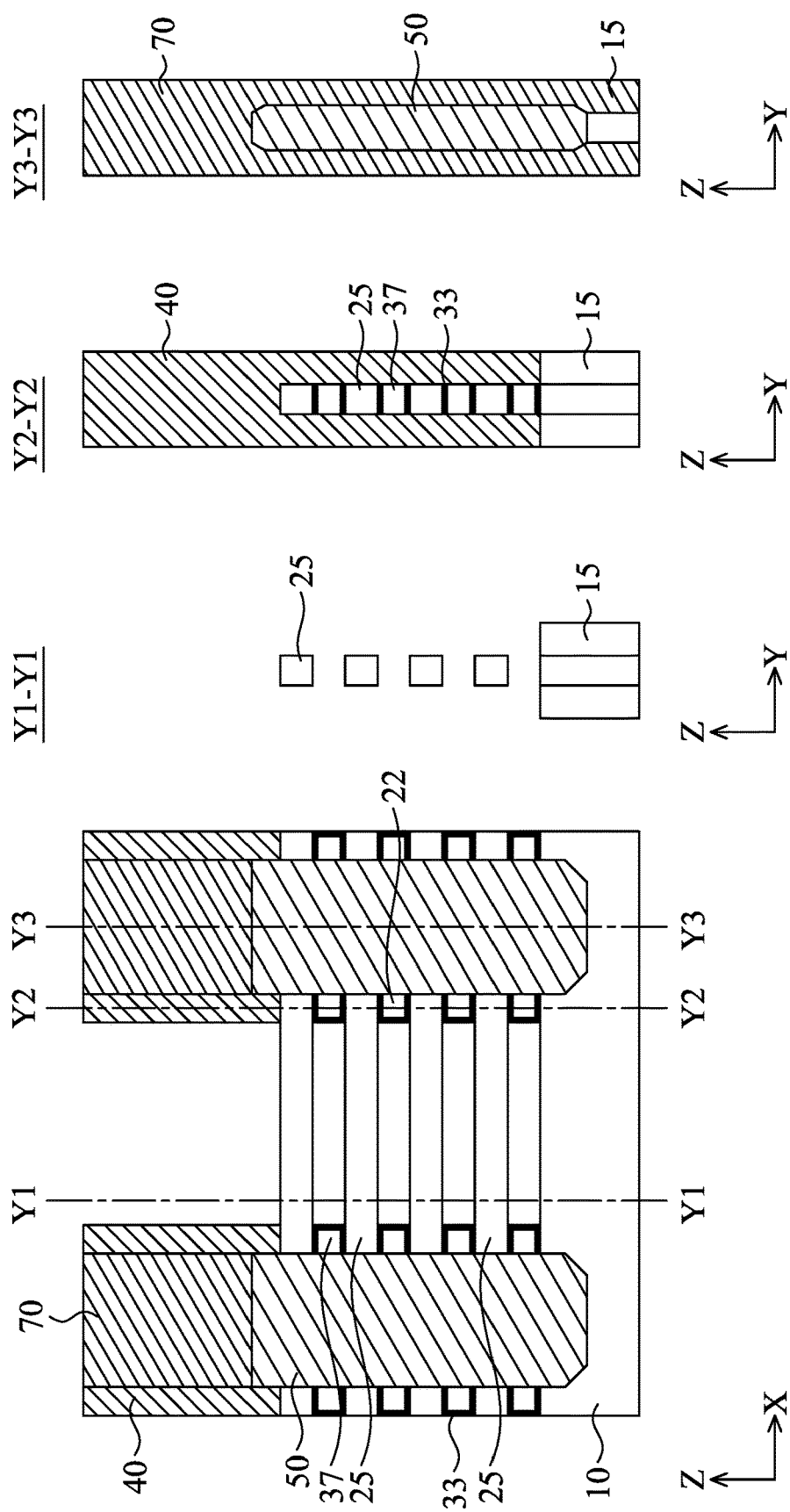

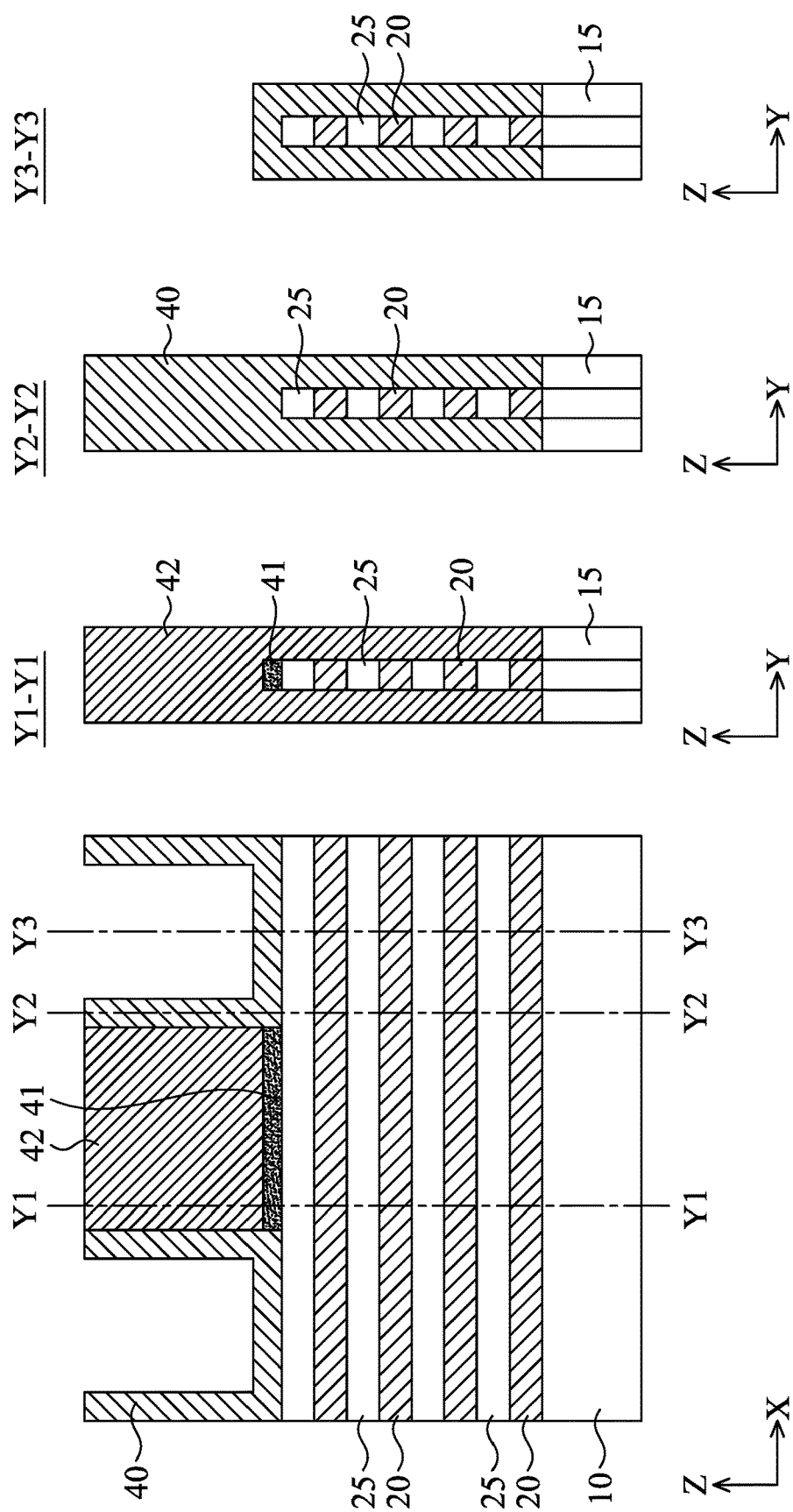

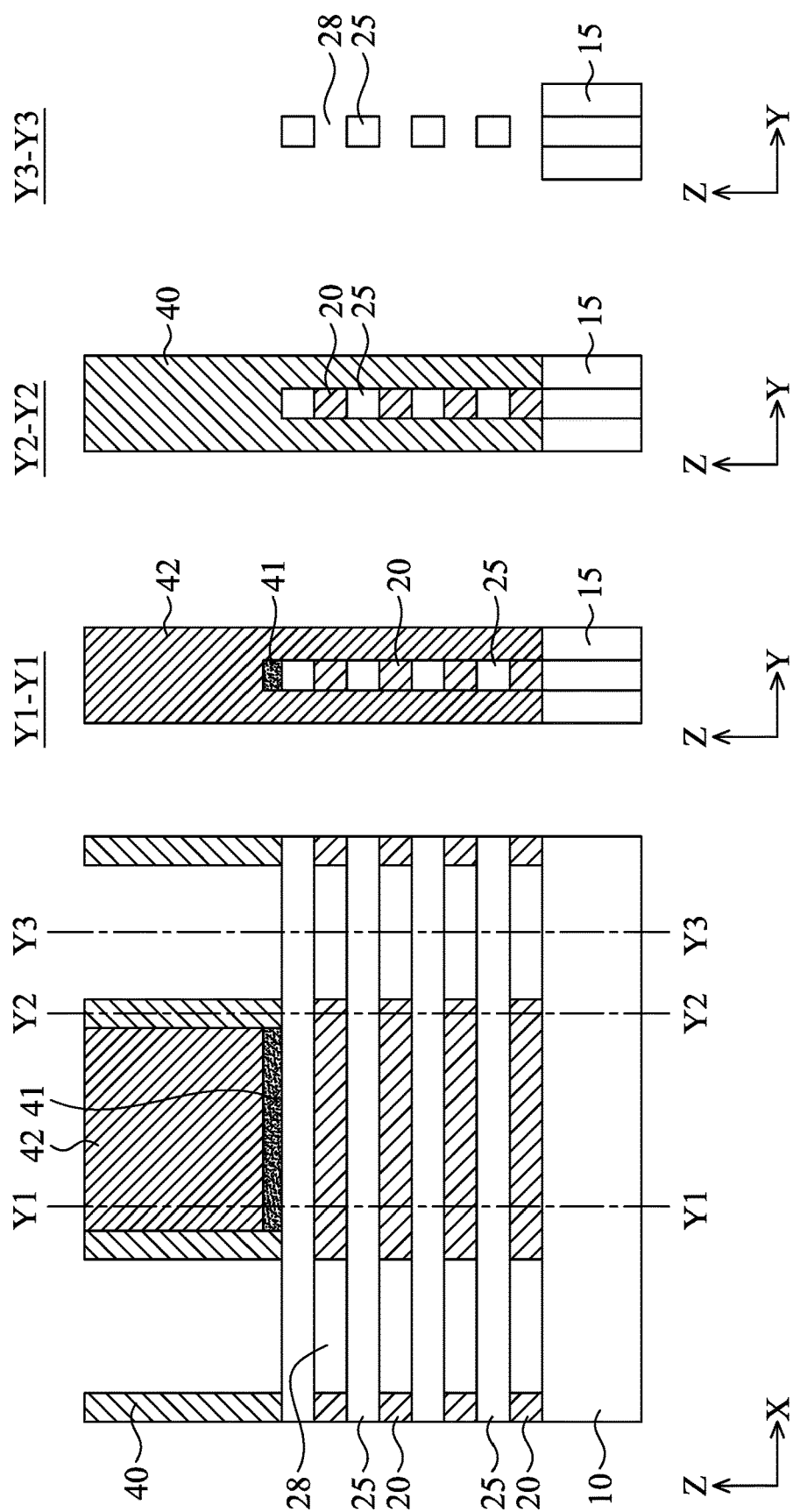

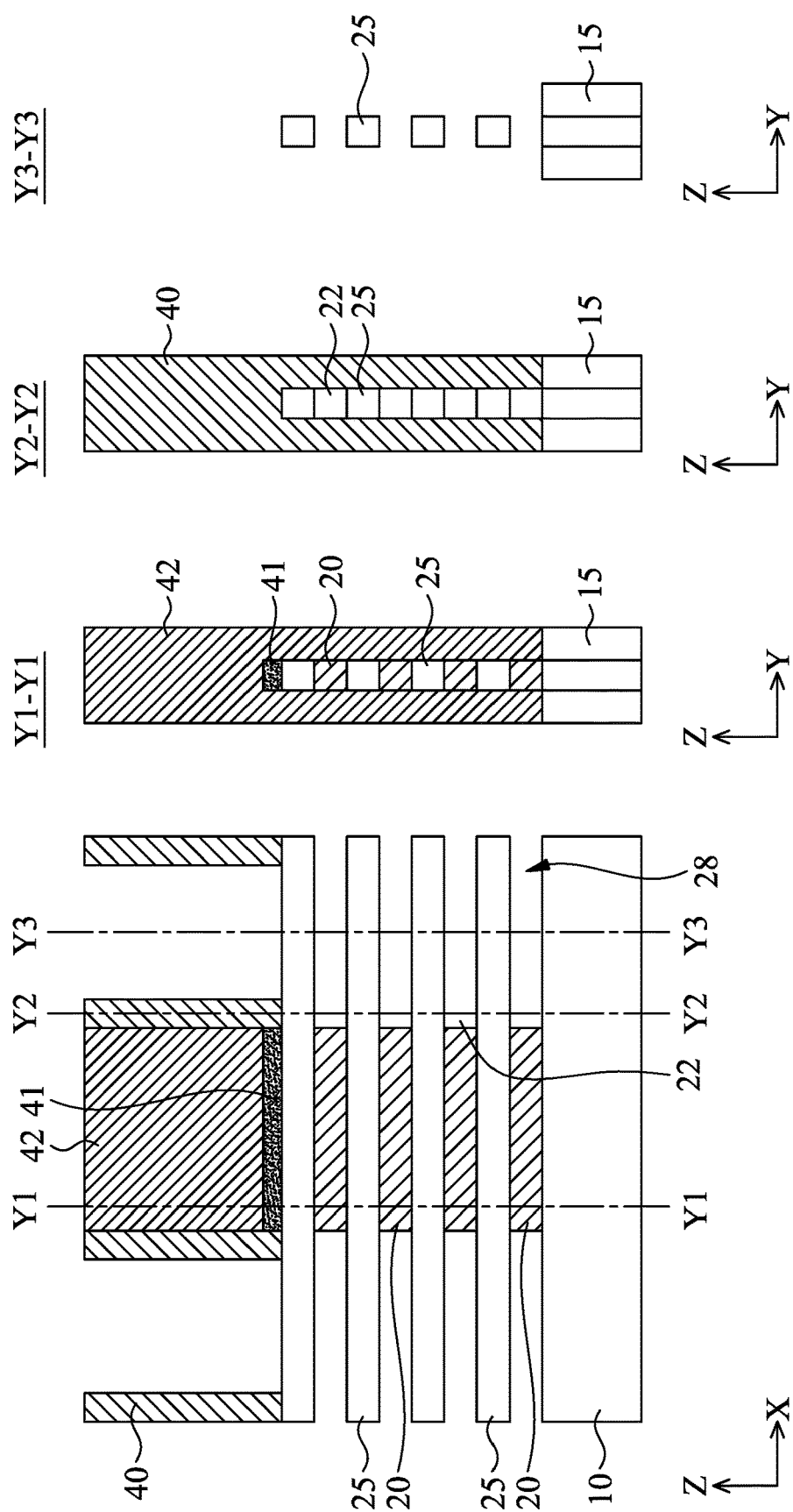

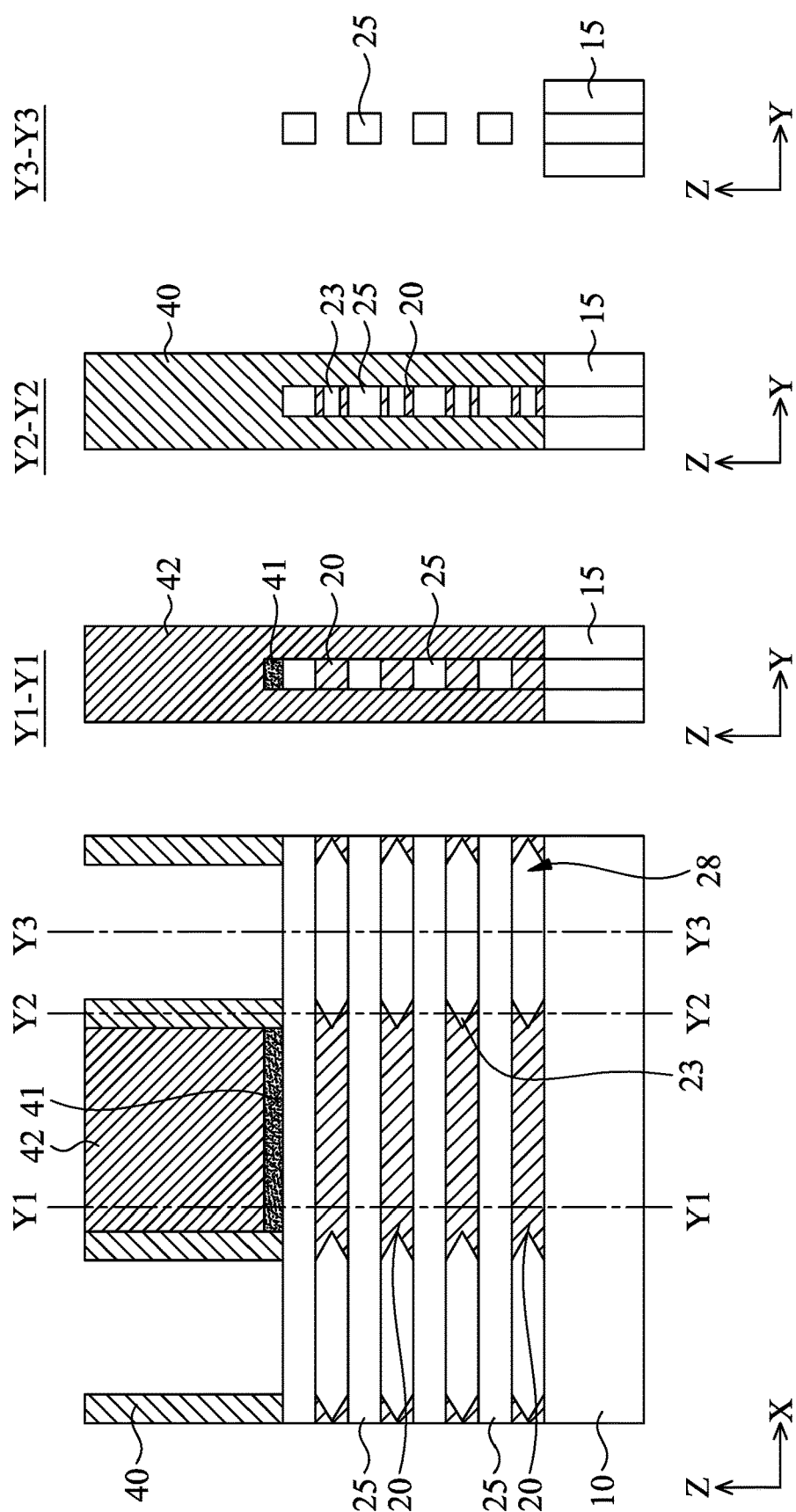

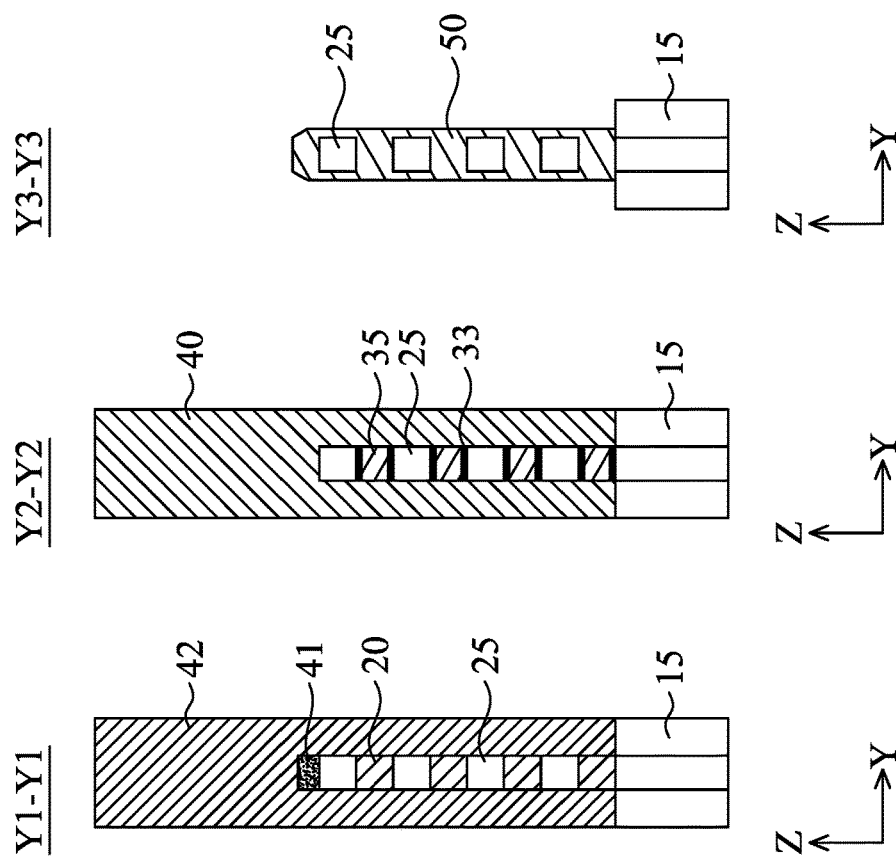
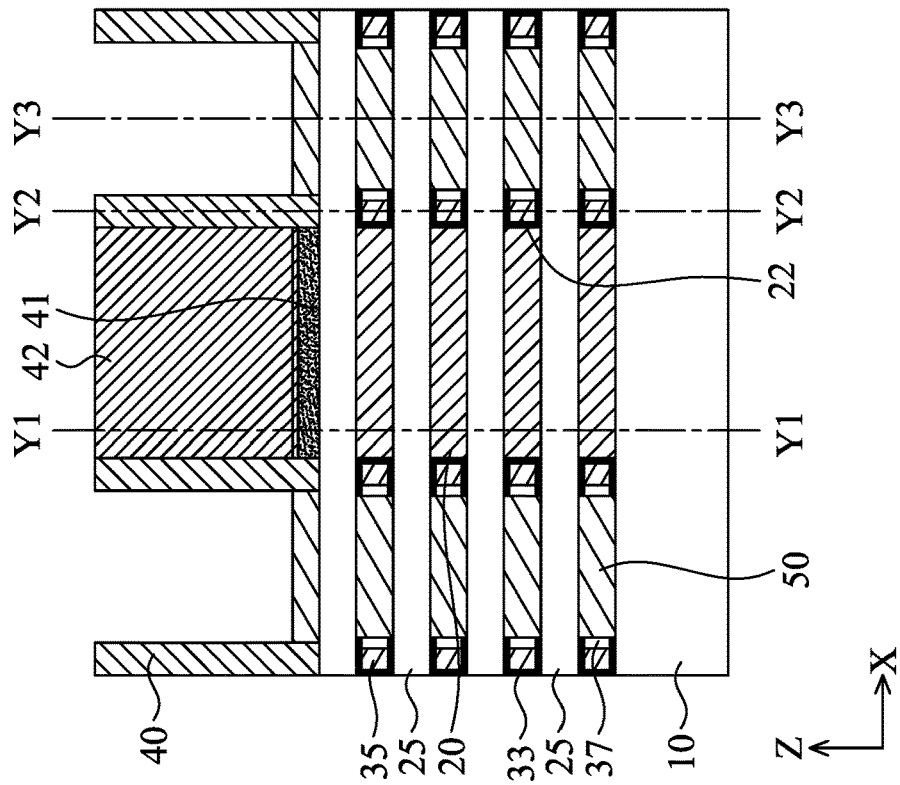
FIG. 22A  FIG. 22B  FIG. 22C  FIG. 22D

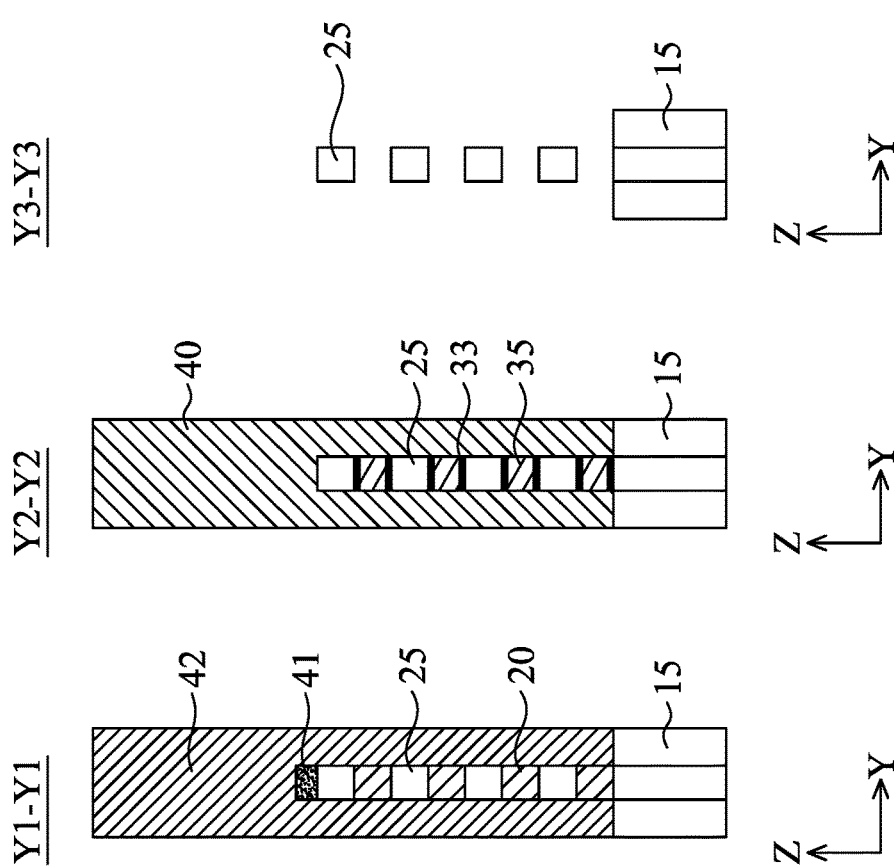
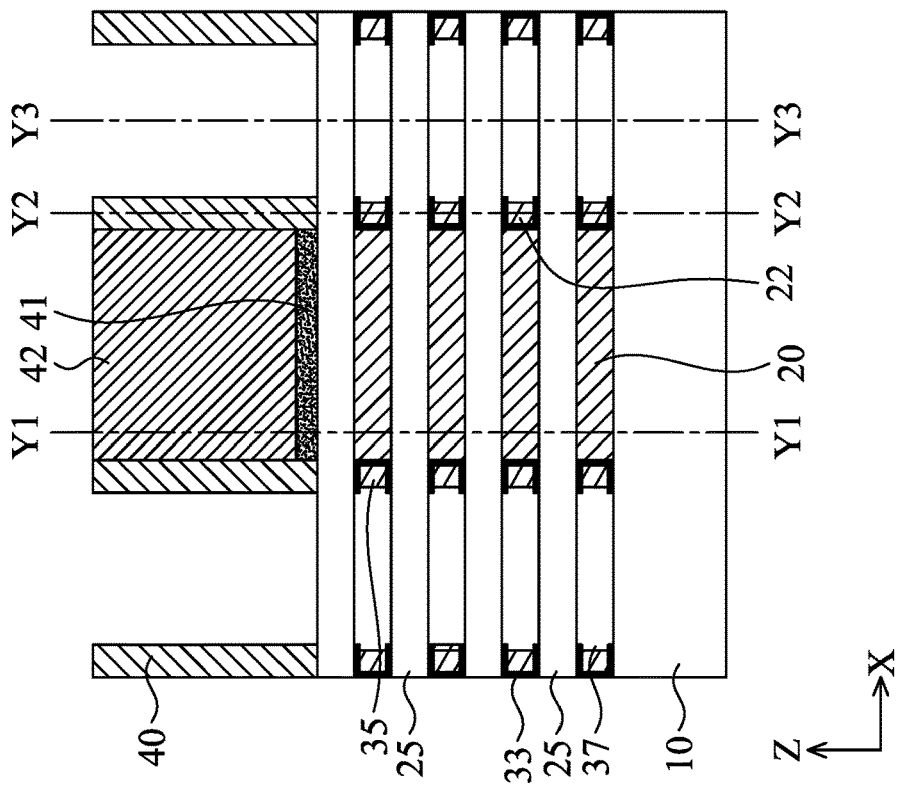
FIG. 29A  FIG. 29B  FIG. 29C  FIG. 29D

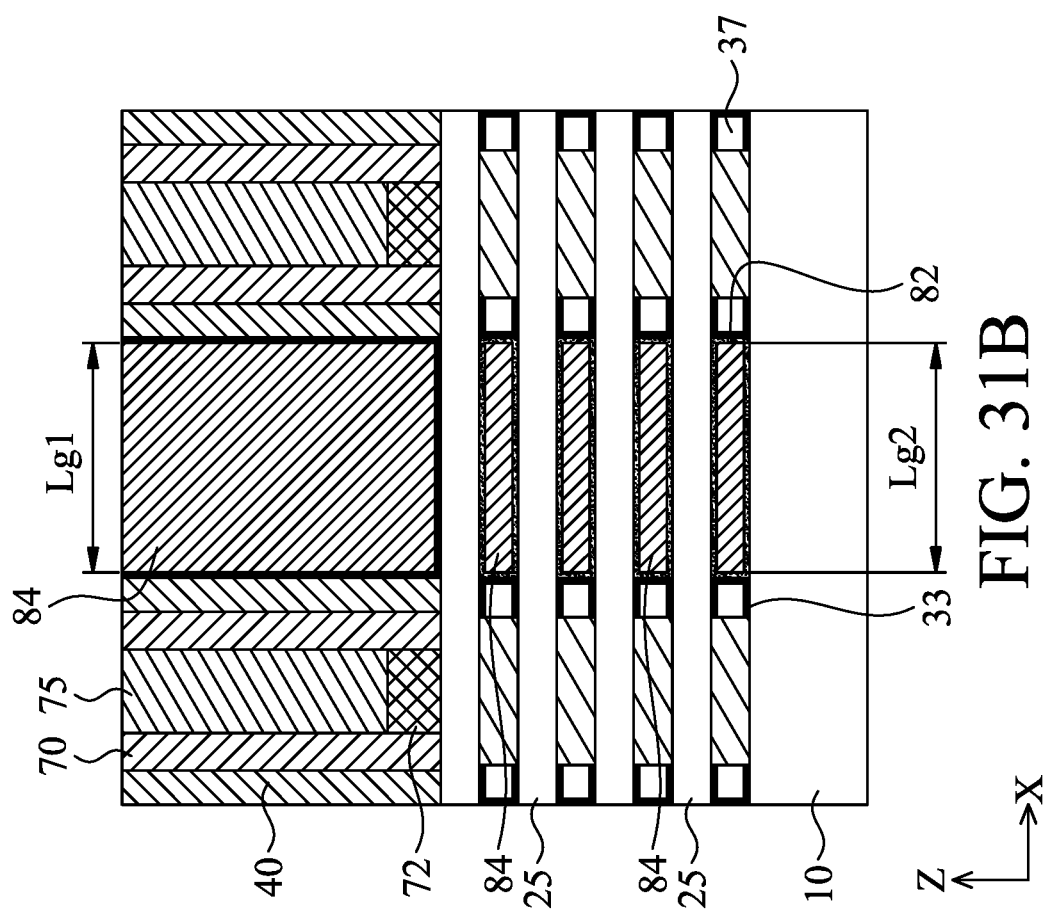
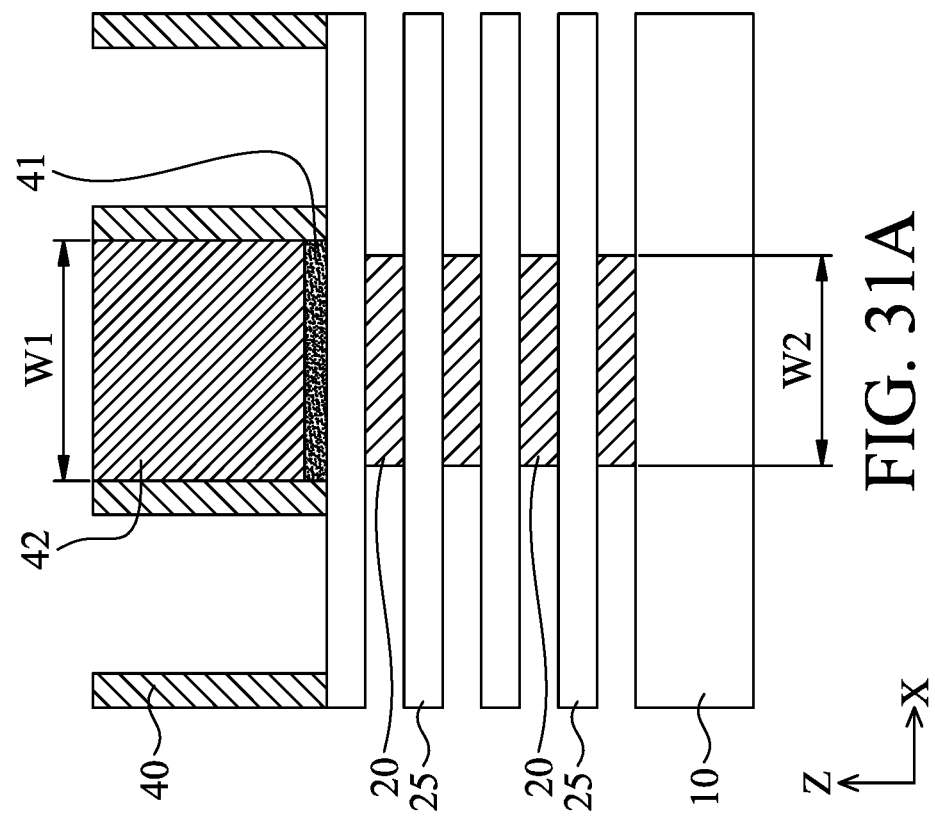
FIG. 31A
FIG. 31B

METHOD OF MANUFACTURING A SEMICONDUCTOR DEVICE AND A SEMICONDUCTOR DEVICE

RELATED APPLICATIONS

This application is a Continuation of application Ser. No. 16/198,046 filed on Nov. 21, 2018, which is a divisional application of application Ser. No. 15/725,655 filed on Oct. 5, 2017, now U.S. Pat. No. 10,361,278, which claims the benefit of priority to U.S. Provisional Application No. 62/552,157 filed on Aug. 30, 2017, the entire contents of each of which are incorporated herein by reference.

TECHNICAL FIELD

The disclosure relates to method of manufacturing semiconductor integrated circuits, and more particularly to method of manufacturing semiconductor devices including fin field effect transistors (FinFETs) and/or gate-all-around (GAA) FETs, and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A.

FIGS. 1E-1H show various views of a semiconductor FET device according to an embodiment of the present disclosure. FIG. 1E is a cross sectional view along the X direction (source-drain direction), FIG. 1F is a cross sectional view corresponding to Y1-Y1 of FIG. 1E, FIG. 1G is a cross sectional view corresponding to Y2-Y2 of FIG. 1E and FIG. 1H shows a cross sectional view corresponding to Y3-Y3 of FIG. 1E.

FIGS. 2A-2D show various views of a semiconductor FET device according to another embodiment of the present disclosure. FIG. 2A is a cross sectional view along the X direction (source-drain direction), FIG. 2B is a cross sectional view corresponding to Y1-Y1 of FIG. 2A, FIG. 2C is a cross sectional view corresponding to Y2-Y2 of FIG. 2A and FIG. 2D shows a cross sectional view corresponding to Y3-Y3 of FIG. 2A.

FIGS. 2E-2H show various views of a semiconductor FET device according to an embodiment of the present disclosure. FIG. 2E is a cross sectional view along the X direction (source-drain direction), FIG. 2F is a cross sectional view corresponding to Y1-Y1 of FIG. 2E, FIG. 2G is a cross sectional view corresponding to Y2-Y2 of FIG. 2E and FIG. 2H shows a cross sectional view corresponding to Y3-Y3 of FIG. 2E.

FIGS. 4A-4D show one of the various stages of manufacturing a semiconductor FET device according to an embodiment of the present disclosure. FIG. 4A is a cross sectional view along the X direction (source-drain direction), FIG. 4B is a cross sectional view corresponding to Y1-Y1 of FIG. 4A, FIG. 4C is a cross sectional view corresponding to Y2-Y2 of FIG. 4A and FIG. 4D shows a cross sectional view corresponding to Y3-Y3 of FIG. 4A.

FIGS. 5A-5D show one of the various stages of manufacturing a semiconductor FET device according to an embodiment of the present disclosure. FIG. 5A is a cross sectional view along the X direction (source-drain direction), FIG. 5B is a cross sectional view corresponding to Y1-Y1 of FIG. 5A, FIG. 5C is a cross sectional view corresponding to Y2-Y2 of FIG. 5A and FIG. 5D shows a cross sectional view corresponding to Y3-Y3 of FIG. 5A.

FIGS. 6A-6D show one of the various stages of manufacturing a semiconductor FET device according to an embodiment of the present disclosure. FIG. 6A is a cross sectional view along the X direction (source-drain direction), FIG. 6B is a cross sectional view corresponding to Y1-Y1 of FIG. 6A, FIG. 6C is a cross sectional view corresponding to Y2-Y2 of FIG. 6A and FIG. 6D shows a cross sectional view corresponding to Y3-Y3 of FIG. 6A.

FIGS. 7A-7D show one of the various stages of manufacturing a semiconductor FET device according to an embodiment of the present disclosure. FIG. 7A is a cross sectional view along the X direction (source-drain direction), FIG. 7B is a cross sectional view corresponding to Y1-Y1 of FIG. 7A, FIG. 7C is a cross sectional view corresponding to Y2-Y2 of FIG. 7A and FIG. 7D shows a cross sectional view corresponding to Y3-Y3 of FIG. 7A.

FIGS. 8A-8D show one of the various stages of manufacturing a semiconductor FET device according to an embodiment of the present disclosure. FIG. 8A is a cross sectional view along the X direction (source-drain direction), FIG. 8B is a cross sectional view corresponding to Y1-Y1 of FIG. 8A, FIG. 8C is a cross sectional view corresponding to Y2-Y2 of FIG. 8A and FIG. 8D shows a cross sectional view corresponding to Y3-Y3 of FIG. 8A.

FIGS. 9A-9D show one of the various stages of manufacturing a semiconductor FET device according to an embodiment of the present disclosure. FIG. 9A is a cross sectional view along the X direction (source-drain direction), FIG. 9B is a cross sectional view corresponding to Y1-Y1 of FIG. 9A, FIG. 9C is a cross sectional view corresponding to Y2-Y2 of FIG. 9A and FIG. 9D shows a cross sectional view corresponding to Y3-Y3 of FIG. 9A.

FIGS. 10A-10D show one of the various stages of manufacturing a semiconductor FET device according to an embodiment of the present disclosure. FIG. 10A is a cross sectional view along the X direction (source-drain direction), FIG. 10B is a cross sectional view corresponding to Y1-Y1 of FIG. 10A, FIG. 10C is a cross sectional view corresponding to Y2-Y2 of FIG. 10A and FIG. 10D shows a cross sectional view corresponding to Y3-Y3 of FIG. 10A.

FIGS. 11A-11D show one of the various stages of manufacturing a semiconductor FET device according to an embodiment of the present disclosure. FIG. 11A is a cross sectional view along the X direction (source-drain direction), FIG. 11B is a cross sectional view corresponding to Y1-Y1 of FIG. 11A, FIG. 11C is a cross sectional view corresponding to Y2-Y2 of FIG. 11A and FIG. 11D shows a cross sectional view corresponding to Y3-Y3 of FIG. 11A.

FIGS. 12A-12D show one of the various stages of manufacturing a semiconductor FET device according to an embodiment of the present disclosure. FIG. 12A is a cross sectional view along the X direction (source-drain direction), FIG. 12B is a cross sectional view corresponding to Y1-Y1 of FIG. 12A, FIG. 12C is a cross sectional view corresponding to Y2-Y2 of FIG. 12A and FIG. 12D shows a cross sectional view corresponding to Y3-Y3 of FIG. 12A.

FIG. 13A is a cross sectional view along the X direction (source-drain direction), FIG. 13B is a cross sectional view corresponding to Y1-Y1 of FIG. 13A, FIG. 13C is a cross sectional view corresponding to Y2-Y2 of FIG. 13A and FIG. 13D shows a cross sectional view corresponding to Y3-Y3 of FIG. 13A.

FIGS. 14A-14D show one of the various stages of manufacturing a semiconductor FET device according to another embodiment of the present disclosure. FIG. 14A is a cross sectional view along the X direction (source-drain direction), FIG. 14B is a cross sectional view corresponding to Y1-Y1 of FIG. 14A, FIG. 14C is a cross sectional view corresponding to Y2-Y2 of FIG. 14A and FIG. 14D shows a cross sectional view corresponding to Y3-Y3 of FIG. 14A.

FIGS. 15A-15D show one of the various stages of manufacturing a semiconductor FET device according to an embodiment of the present disclosure. FIG. 15A is a cross sectional view along the X direction (source-drain direction), FIG. 15B is a cross sectional view corresponding to Y1-Y1 of FIG. 15A, FIG. 15C is a cross sectional view corresponding to Y2-Y2 of FIG. 15A and FIG. 15D shows a cross sectional view corresponding to Y3-Y3 of FIG. 15A.

FIGS. 16A-16D show one of the various stages of manufacturing a semiconductor FET device according to an embodiment of the present disclosure. FIG. 16A is a cross sectional view along the X direction (source-drain direction), FIG. 16B is a cross sectional view corresponding to Y1-Y1 of FIG. 16A, FIG. 16C is a cross sectional view corresponding to Y2-Y2 of FIG. 16A and FIG. 16D shows a cross sectional view corresponding to Y3-Y3 of FIG. 16A.

FIGS. 17A-17D show one of the various stages of manufacturing a semiconductor FET device according to an embodiment of the present disclosure. FIG. 17A is a cross sectional view along the X direction (source-drain direction), FIG. 17B is a cross sectional view corresponding to Y1-Y1 of FIG. 17A, FIG. 17C is a cross sectional view corresponding to Y2-Y2 of FIG. 17A and FIG. 17D shows a cross sectional view corresponding to Y3-Y3 of FIG. 17A.

FIG. 18A is a cross sectional view along the X direction (source-drain direction), FIG. 18B is a cross sectional view corresponding to Y1-Y1 of FIG. 18A, FIG. 18C is a cross sectional view corresponding to Y2-Y2 of FIG. 18A and FIG. 18D shows a cross sectional view corresponding to Y3-Y3 of FIG. 18A.

FIG. 19A is a cross sectional view along the X direction (source-drain direction), FIG. 19B is a cross sectional view corresponding to Y1-Y1 of FIG. 19A, FIG. 19C is a cross sectional view corresponding to Y2-Y2 of FIG. 19A and FIG. 19D shows a cross sectional view corresponding to Y3-Y3 of FIG. 19A.

FIG. 20A is a cross sectional view along the X direction (source-drain direction), FIG. 20B is a cross sectional view corresponding to Y1-Y1 of FIG. 20A, FIG. 20C is a cross sectional view corresponding to Y2-Y2 of FIG. 20A and FIG. 20D shows a cross sectional view corresponding to Y3-Y3 of FIG. 20A.

FIG. 21A is a cross sectional view along the X direction (source-drain direction), FIG. 21B is a cross sectional view corresponding to Y1-Y1 of FIG. 21A, FIG. 21C is a cross sectional view corresponding to Y2-Y2 of FIG. 21A and FIG. 21D shows a cross sectional view corresponding to Y3-Y3 of FIG. 21A.

FIGS. 22A-22D show one of the various stages of manufacturing a semiconductor FET device according to an embodiment of the present disclosure. FIG. 22A is a cross sectional view along the X direction (source-drain direction), FIG. 22B is a cross sectional view corresponding to Y1-Y1 of FIG. 22A, FIG. 22C is a cross sectional view corresponding to Y2-Y2 of FIG. 22A and FIG. 22D shows a cross sectional view corresponding to Y3-Y3 of FIG. 22A.

FIG. 23A is a cross sectional view along the X direction (source-drain direction), FIG. 23B is a cross sectional view corresponding to Y1-Y1 of FIG. 23A, FIG. 23C is a cross sectional view corresponding to Y2-Y2 of FIG. 23A and FIG. 23D shows a cross sectional view corresponding to Y3-Y3 of FIG. 23A.

FIG. 24A is a cross sectional view along the X direction (source-drain direction), FIG. 24B is a cross sectional view corresponding to Y1-Y1 of FIG. 24A, FIG. 24C is a cross sectional view corresponding to Y2-Y2 of FIG. 24A and FIG. 24D shows a cross sectional view corresponding to Y3-Y3 of FIG. 24A.

FIG. 25A is a cross sectional view along the X direction (source-drain direction), FIG. 25B is a cross sectional view corresponding to Y1-Y1 of FIG. 25A, FIG. 25C is a cross sectional view corresponding to Y2-Y2 of FIG. 25A and FIG. 25D shows a cross sectional view corresponding to Y3-Y3 of FIG. 25A.

FIG. 27A is a cross sectional view along the X direction (source-drain direction), FIG. 27B is a cross sectional view corresponding to Y1-Y1 of FIG. 27A, FIG. 27C is a cross sectional view corresponding to Y2-Y2 of FIG. 27A and FIG. 27D shows a cross sectional view corresponding to Y3-Y3 of FIG. 27A.

FIG. 28A is a cross sectional view along the X direction (source-drain direction), FIG. 28B is a cross sectional view corresponding to Y1-Y1 of FIG. 28A, FIG. 28C is a cross sectional view corresponding to Y2-Y2 of FIG. 28A and FIG. 28D shows a cross sectional view corresponding to Y3-Y3 of FIG. 28A.

FIGS. 29A-29D show one of the various stages of manufacturing a semiconductor FET device according to an embodiment of the present disclosure. FIG. 29A is a cross sectional view along the X direction (source-drain direction), FIG. 29B is a cross sectional view corresponding to Y1-Y1 of FIG. 29A, FIG. 29C is a cross sectional view corresponding to Y2-Y2 of FIG. 29A and FIG. 29D shows a cross sectional view corresponding to Y3-Y3 of FIG. 29A.

FIG. 30A is a cross sectional view along the X direction (source-drain direction), FIG. 30B is a cross sectional view corresponding to Y1-Y1 of FIG. 30A, FIG. 30C is a cross sectional view corresponding to Y2-Y2 of FIG. 30A and FIG. 30D shows a cross sectional view corresponding to Y3-Y3 of FIG. 30A.

FIGS. 31A and 31B show one of the various stages of manufacturing a semiconductor FET device according to an embodiment of the present disclosure.

DETAILED DESCRIPTION

Figures 1A, 1B, 1C, 1D:
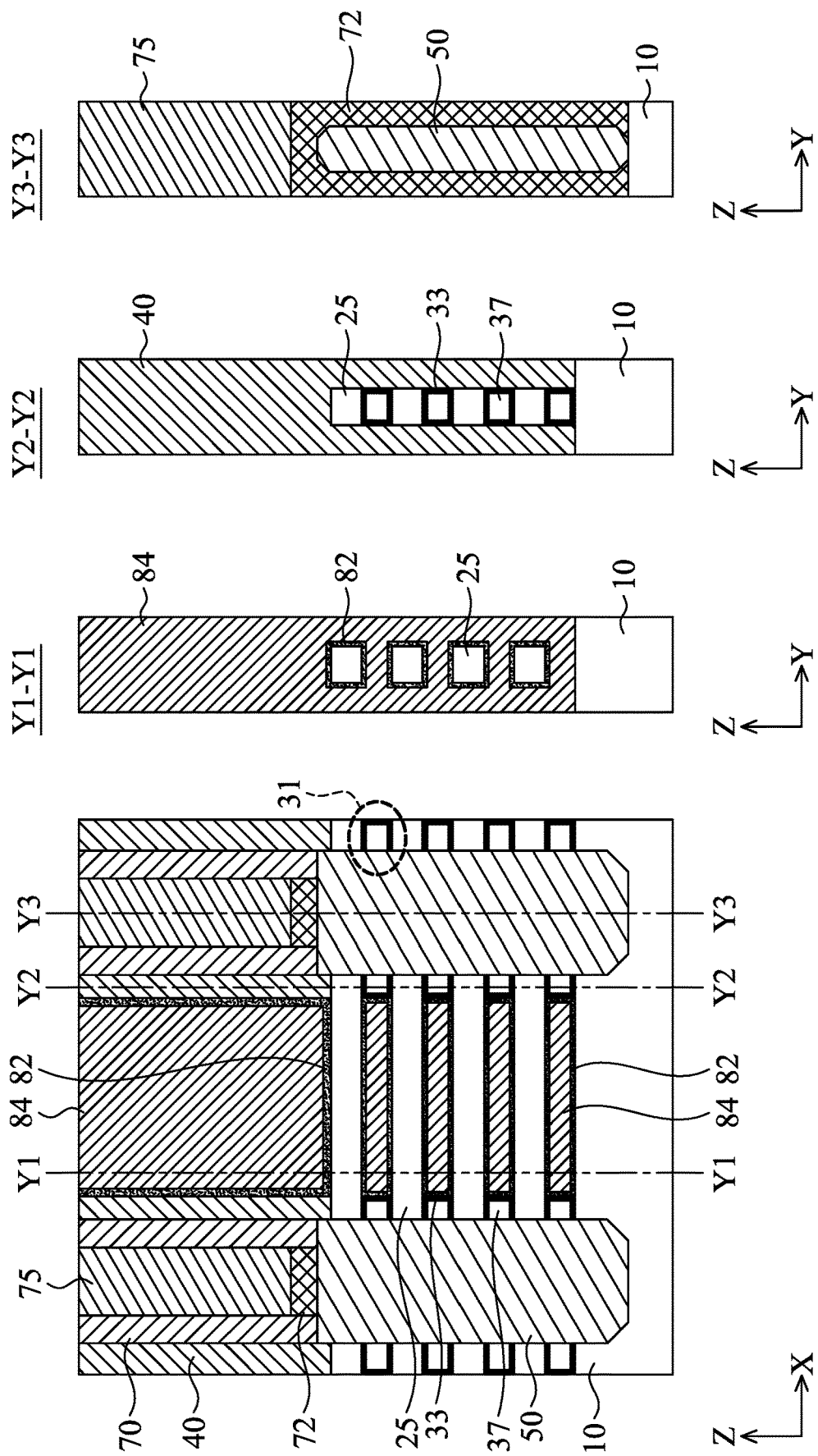
FIGS. 1A-1D show various views of a semiconductor FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Generally, it is difficult to control lateral etching amounts when the nanowires (NWs) are released by selectively etching sacrificial semiconductor layers. The lateral ends of the NWs may be etched when the NW release etching process is performed after dummy poly gate is removed, because a lateral etching control or an etching budget for NW release etch not sufficient. A gate electrode may touch a source/drain (S/D) epitaxial layer if there is no etch stop layer. Further, there is a lager impact on gate to drain capacitance Cgd. If no dielectric film existed between the gate and the S/D region, Cgd becomes larger, which would reduce circuit speed.

In the present disclosure, a method for fabricating an inner spacer between a metal gate electrode and a source/drain (S/D) epitaxial layer for a GAA FET and a stacked channel FET are provided. More specifically, the present disclosure relates to a semiconductor device and a method to overcome "a lateral etching problem" when a selective etching process is performed for nanowire (NW) formation. In particular, in the present disclosure, one or more low-k layers and/or air gaps are provided between a gate electrode and an S/D epitaxial layer in order to decrease a capacitance therebetween.

In this disclosure, a source/drain refers to a source and/or a drain. It is noted that in the present disclosure, a source and a drain are interchangeably used and the structures thereof are substantially the same.

FIGS. 1A-1D show various views of a semiconductor FET device according to an embodiment of the present disclosure. FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A.

As shown in FIGS. 1A-1D, semiconductor wires 25 are provided over a semiconductor substrate 10, and vertically arranged along the Z direction (the normal direction of the principal surface of the substrate 10). In some embodiments, the substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A-1C, the semiconductor wires 25, which are channel layers, are disposed over the substrate 10. In some embodiments, the semiconductor wires 25 are disposed over a fin structure (not shown) protruding from the substrate 10. Each of the channel layers 25 is wrapped around by a gate dielectric layer 82 and a gate electrode layer 84. In some embodiments, the gate dielectric layer 82 includes an interfacial layer and a high-k dielectric layer. The gate structure includes the gate dielectric layer 82, the gate electrode layer 84 and sidewall spacers 40. Although FIGS. 1A-1C show four semiconductor wires 25, the number of the semiconductor wires 25 is not limited to four, and may be as small as one or more than four and may be up to ten.

Further, a source/drain epitaxial layer 50 is disposed over the substrate 10. The source/drain epitaxial layer 50 is in direct contact with the channel layer 25, and is separated by inner spacer regions 31 and the gate dielectric layer 82. In some embodiments, each of the inner spacer regions 31 includes a first insulating layer 33 and an air gap 37. The first insulating layer 33 is conformally formed on the inner surface of the inner spacer regions 31, which include parts of end portions of adjacent two semiconductor wires 25 and the gate dielectric layer 82. As shown FIG. 1A, the cross section along the X direction of the inner spacer region 31 has a substantially rectangular shape.

An interlayer dielectric (ILD) layer 70 is disposed over the S/D epitaxial layer 50 and a conductive contact layer 72 is disposed on the S/D epitaxial layer 50, and a conductive plug 75 passing though the ILD layer 70 is disposed over the conductive contact layer 72. The conductive contact layer 72 includes one or more layers of conductive material. In some embodiments, the conductive contact layer 72 includes a silicide layer, such as WSi, NiSi, TiSi or CoSi or other suitable silicide material.

FIGS. 1E-1H show various views of a semiconductor FET device according to an embodiment of the present disclosure. FIG. 1E is a cross sectional view along the X direction (source-drain direction), FIG. 1F is a cross sectional view corresponding to Y1-Y1 of FIG. 1E, FIG. 1G is a cross sectional view corresponding to Y2-Y2 of FIG. 1E and FIG. 1H shows a cross sectional view corresponding to Y3-Y3 of FIG. 1E.

In this embodiment, the source/drain epitaxial layer 50 wraps around the second semiconductor layer 25 disposed at the source/drain regions.

FIGS. 2A-2D show various views of a semiconductor FET device according to another embodiment of the present disclosure. FIG. 2A is a cross sectional view along the X direction (source-drain direction), FIG. 2B is a cross sectional view corresponding to Y1-Y1 of FIG. 2A, FIG. 2C is a cross sectional view corresponding to Y2-Y2 of FIG. 2A and FIG. 2D shows a cross sectional view corresponding to Y3-Y3 of FIG. 2A. Material, configuration, dimensions and/or processes the same as or similar to the foregoing embodiments described with respect to FIGS. 1A-1D may be employed in the embodiment of FIGS. 2A-2D, and detailed explanation thereof may be omitted.

In this embodiment, as shown FIG. 2A, the cross section along the X direction of the inner spacer region 31 has a substantially triangular shape. The triangular shape is defined by (111) facets of the semiconductor wires 25.

FIGS. 2E-2H show various views of a semiconductor FET device according to an embodiment of the present disclosure. FIG. 2E is a cross sectional view along the X direction (source-drain direction), FIG. 2F is a cross sectional view corresponding to Y1-Y1 of FIG. 2E, FIG. 2G is a cross sectional view corresponding to Y2-Y2 of FIG. 2E and FIG. 2H shows a cross sectional view corresponding to Y3-Y3 of FIG. 2E.

In this embodiment, the source/drain epitaxial layer 50 wraps around the second semiconductor layer 25 disposed at the source/drain regions.

Figure 3A:
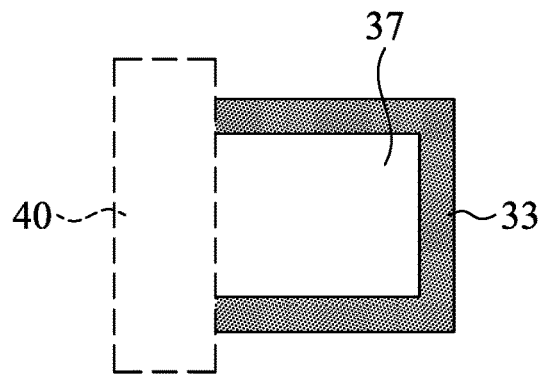
FIGS. 3A, 3B, 3C, 3D, 3E and 3F show various configurations of inner spacer regions according to embodiments of the present disclosure.
Figure 3B:
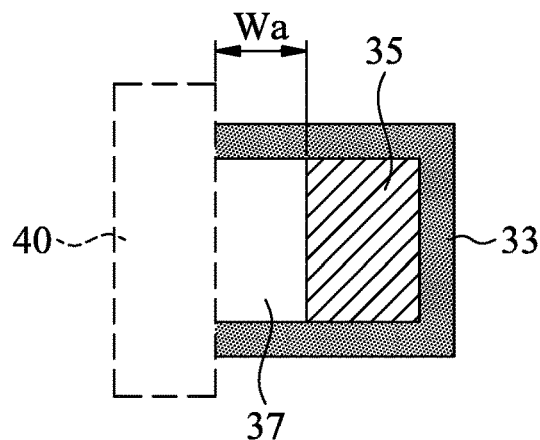
Figure 3C:
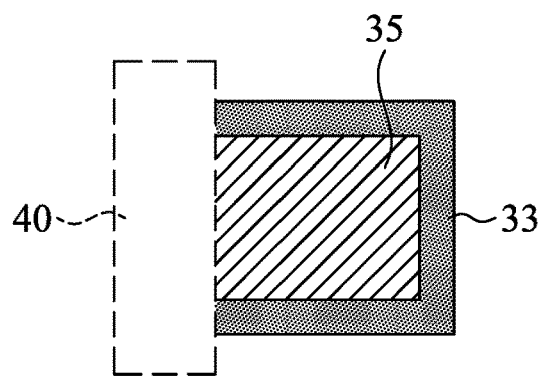
Figure 3D:
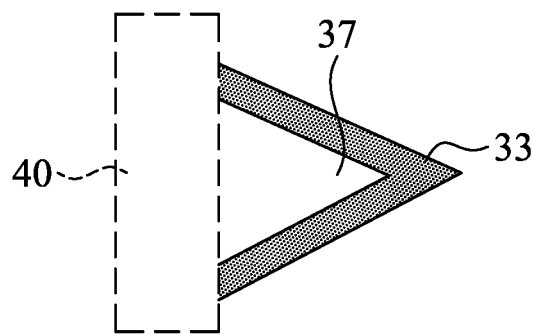
Figure 3E:
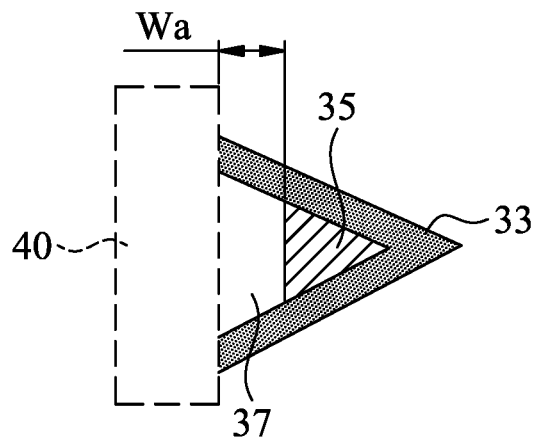
Figure 3F:
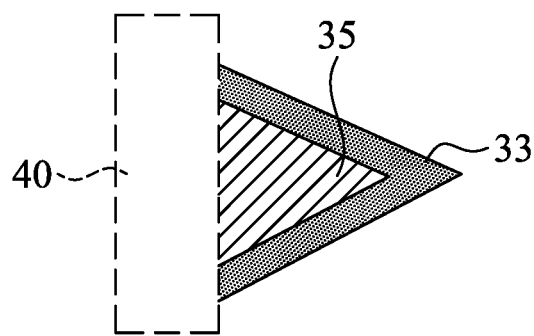
Figures 13A, 13B, 13C, 13D:
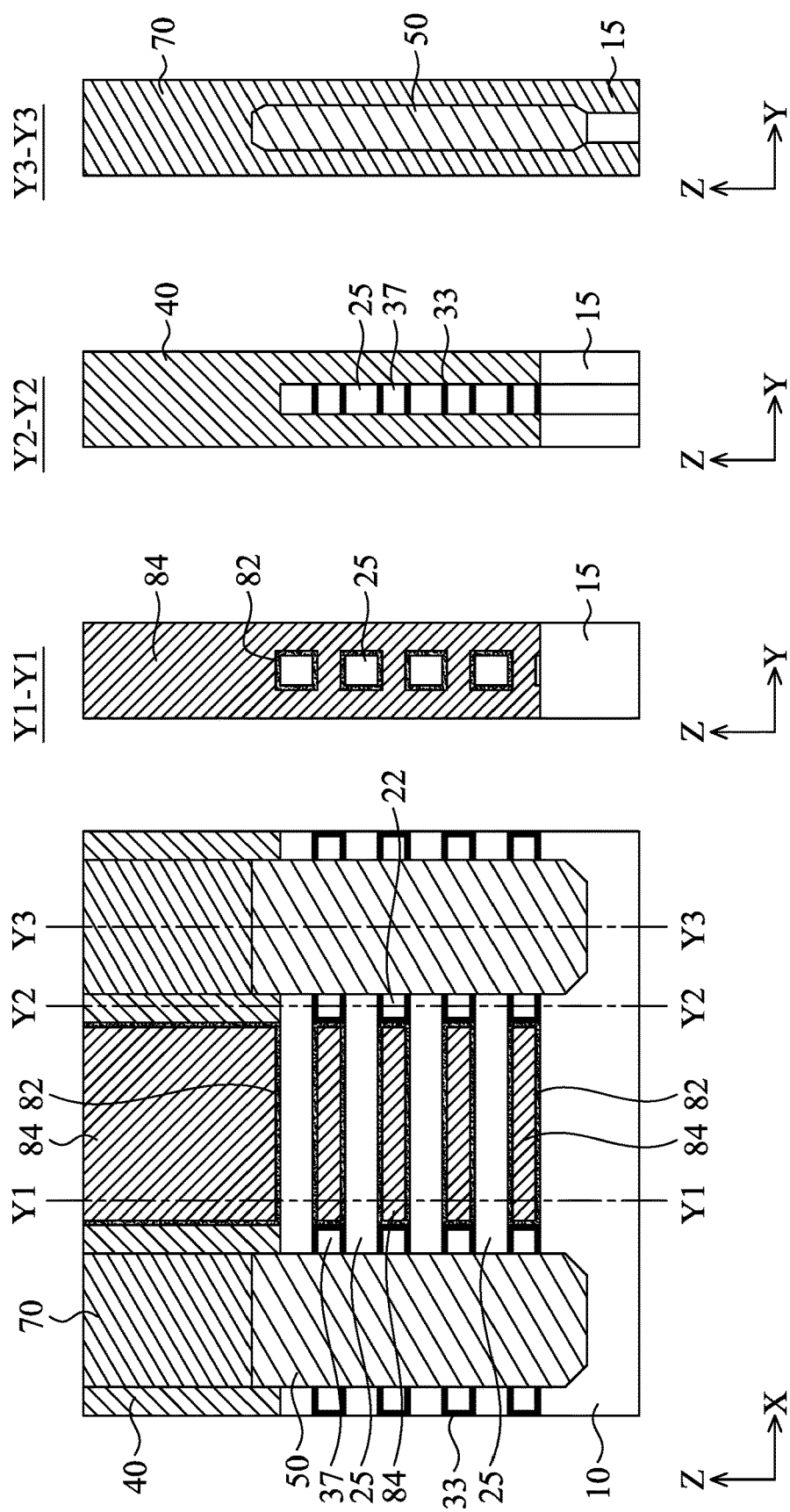
FIGS. 13A-13D show one of the various stages of manufacturing a semiconductor FET device according to an embodiment of the present disclosure.
Figures 18A, 18B, 18C, 18D:
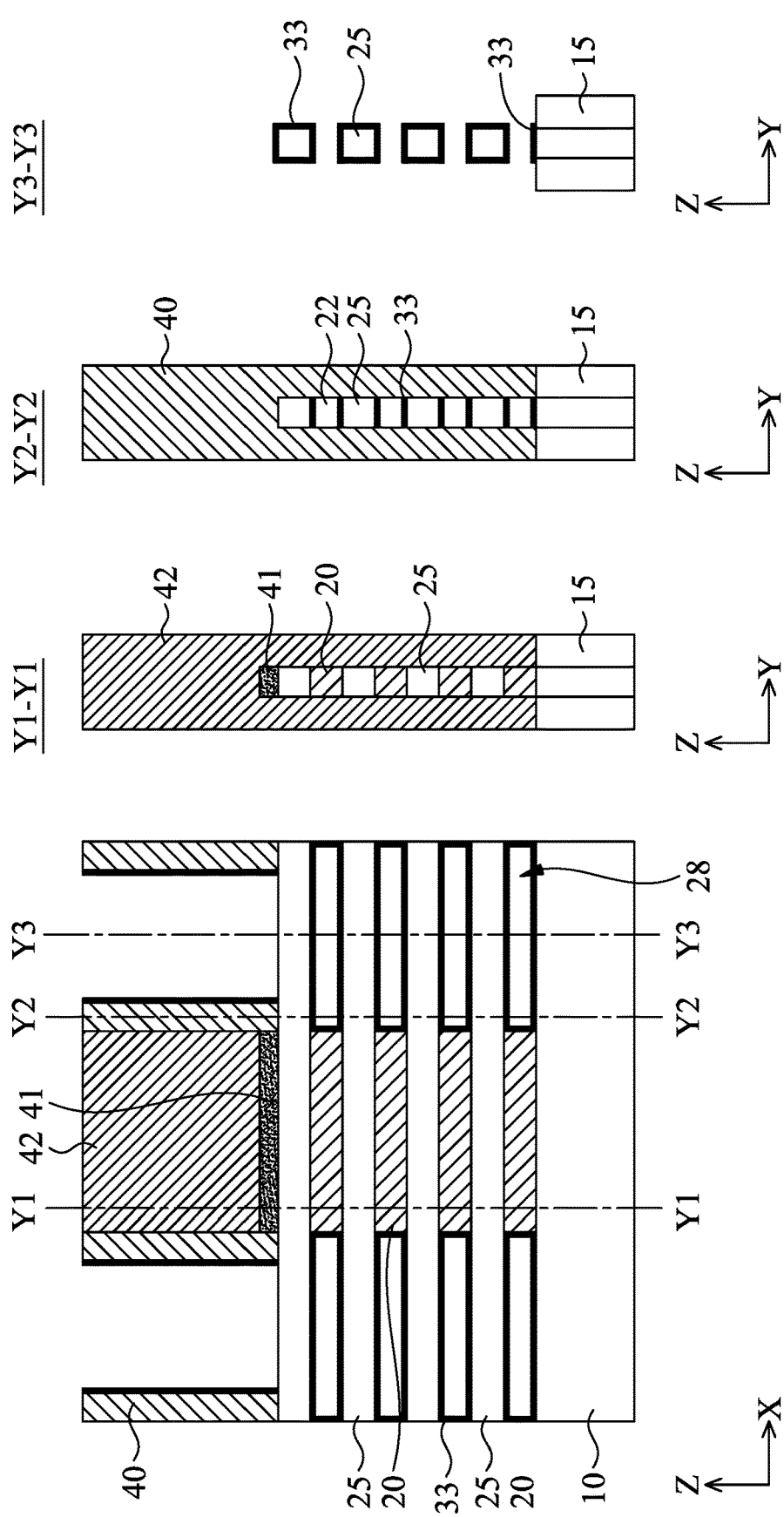
FIGS. 18A-18D show one of the various stages of manufacturing a semiconductor FET device according to an embodiment of the present disclosure.

FIGS. 3A, 3B, 3C, 3D, 3E and 3F show various configurations of inner spacer regions according to embodiments of the present disclosure. FIGS. 3A-3C show the inner spacer regions with a rectangular cross section, and FIGS. 3D-3F show the inner spacer regions with a triangular cross section.

As shown in FIGS. 3A and 3D, in some embodiments, the inner spacer region 31 includes the first insulating layer 33 and the air gap 37. The first insulating layer 33 has a U-shape (90 degree rotated) cross section. The air gap 37 is located at an S/D side to be in contact with the S/D epitaxial layer 50.

In other embodiments, the inner spacer region 31 includes the first insulating layer 33, a second insulating layer 35 and the air gap 37, as shown in FIGS. 3B and 3E. The air gap 37 is located at an S/D side to be in contact with the S/D epitaxial layer 50, and the second insulating layer 35 is located at a gate electrode side and is not in contact with the S/D epitaxial layer 50 in some embodiments. The width Wa of the air gap 37 is in a range from about 0.5 nm to about 2.0 nm in some embodiments, and is in a range from about 0.8 nm to about 1.5 nm in other embodiments.

In certain embodiments, as shown in FIGS. 3C and 3F, no air gap is formed in the inner spacer region 31. In such a case, the inner spacer region 31 includes two or more insulating layers. In some embodiments, the inner spacer region 31 includes the first insulating layer 33 and the second insulating layer 35, which are in contact with the S/D epitaxial layer 50.

In some embodiments, the first insulating layer 33 includes one of silicon nitride (SiN) and silicon oxide ($SiO_2$), and has a thickness in a range from about 0.5 nm to about 3.0 nm. In other embodiments, the first insulating layer 33 has a thickness in a range from about 1.0 nm to about 2.0 nm.

In some embodiments, the second insulating layer 35 is made of a low-k (dielectric constant lower than the dielectric constant of $SiO_2$) material. The low-k material includes SiOC, SiOCN, organic material or porous material, or any other suitable material. In some embodiments, the second insulating layer 35 has a thickness in a range from about 0.5 nm to about 3.0 nm, and in other embodiments, the second insulating layer 35 has a thickness in a range from about 1.0 nm to about 2.0 nm.

FIGS. 4A-4D to 13A-13D show various stages of manufacturing a semiconductor FET device according to an embodiment of the present disclosure. In FIGS. 4A-13D, the "A" figures are a cross sectional view along the X direction (source-drain direction), the "B" figures are a cross sectional view corresponding to Y1-Y1 of the respective "A" figure, the "C" figures are a cross sectional view corresponding to Y2-Y2 of the respective "A" figure, and the "D" figures are a cross sectional view corresponding to Y3-Y3 of the respective "A" figure. It is understood that additional operations can be provided before, during, and after processes shown by FIGS. 4A-13D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-3F may be employed in the embodiment of FIGS. 4A-13D, and detailed explanation thereof may be omitted.

FIGS. 4A-4D show the structure after the dummy gate structure is formed over a fin structure having first semiconductor layer 20 and second semiconductor layer 25 alternately stacked. This structure can be manufactured by the following operations shown by FIGS. 33-38. General methods of manufacturing a GAA FET can be found in U.S. patent application Ser. Nos. 15/157,139, 15/064,402 15,098, 073, the entire contents of each of which are incorporated herein by reference.

Figure 33:
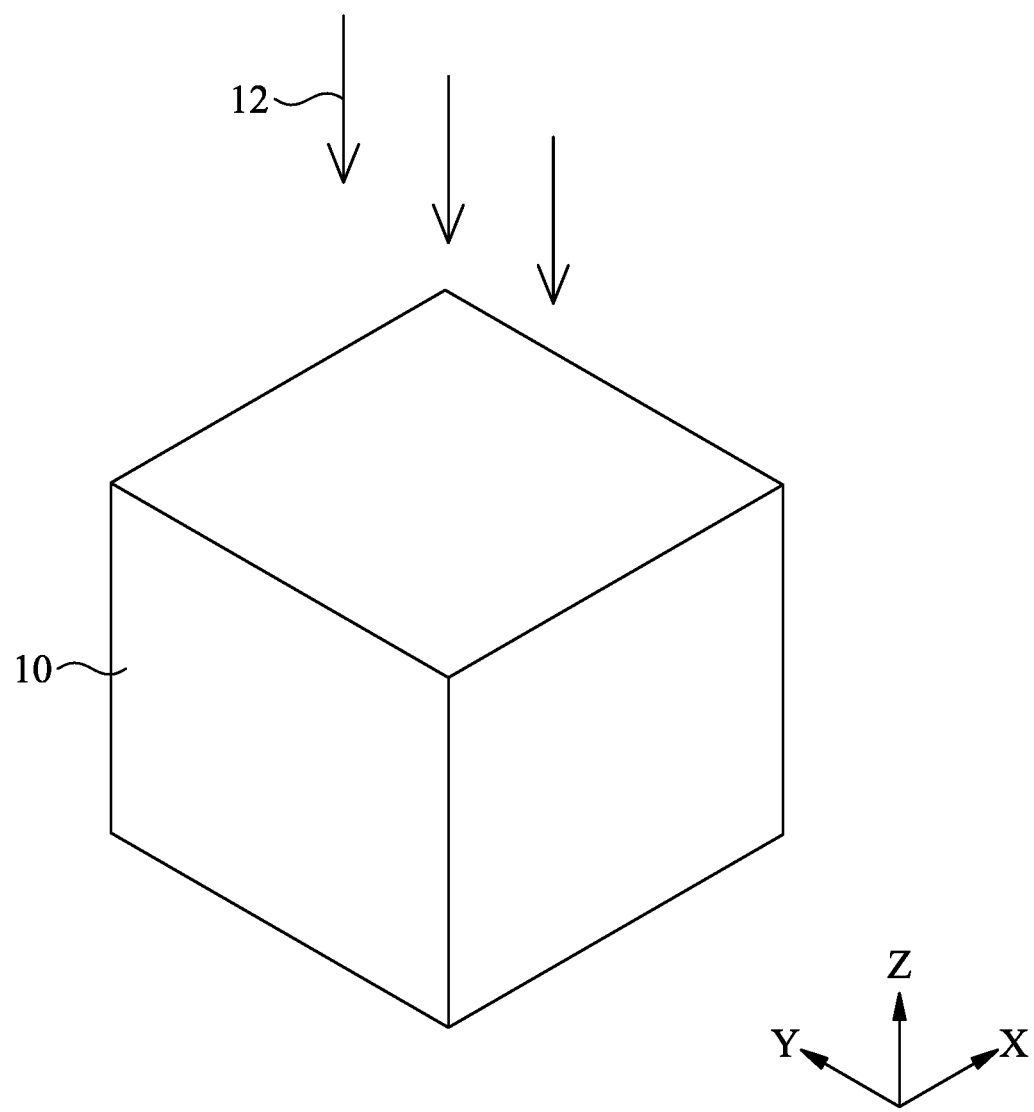
FIG. 33 shows one of the various stages of manufacturing a semiconductor FET device according to embodiments of the present disclosure.

As shown in FIG. 33, impurity ions (dopants) 12 are implanted into a silicon substrate 10 to form a well region. The ion implantation is performed to prevent a punch-through effect. The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

Figure 34:
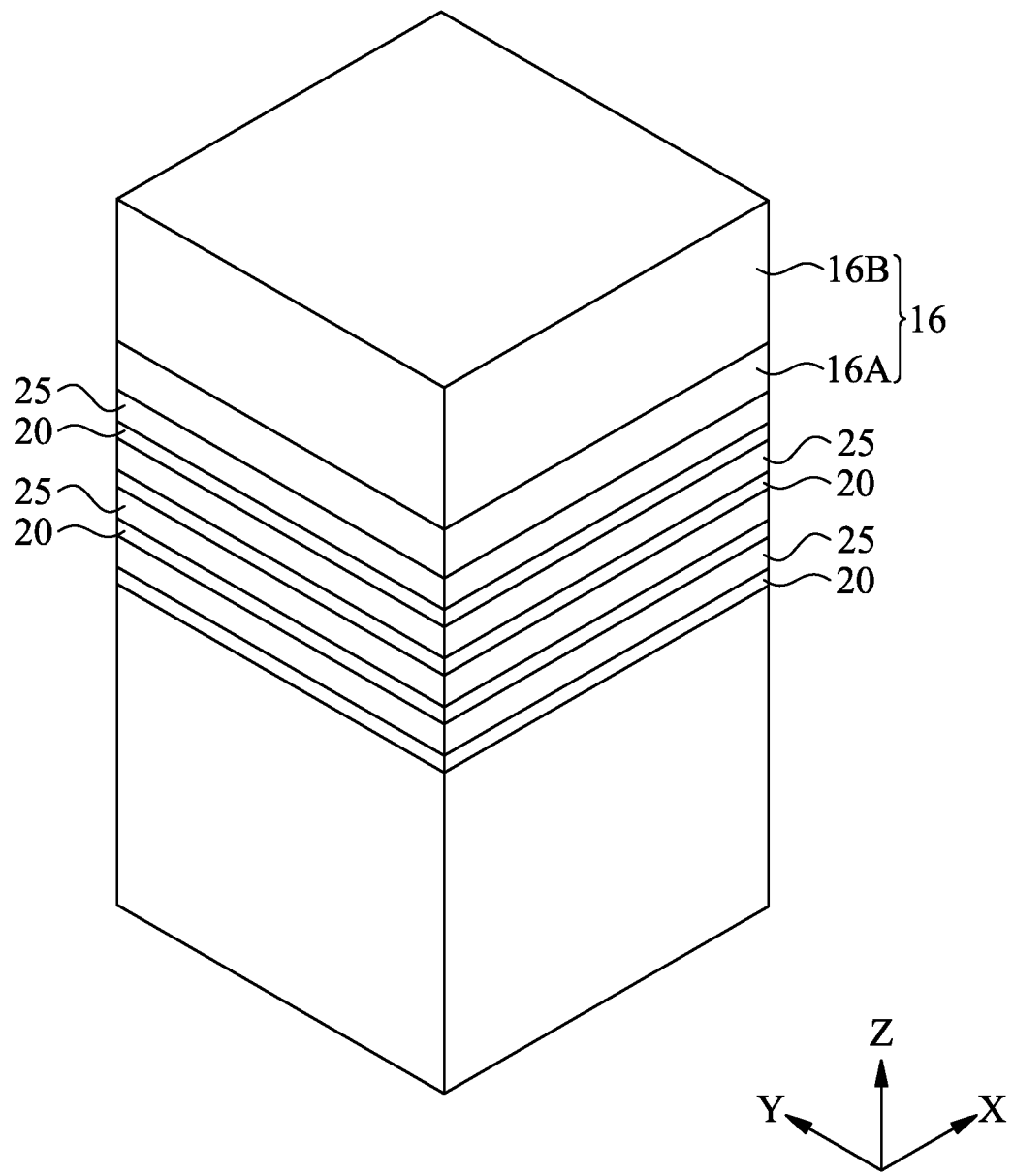
FIG. 34 shows one of the various stages of manufacturing a semiconductor FET device according to embodiments of the present disclosure.

Then, as shown in FIG. 34, stacked semiconductor layers are formed over the substrate 10. The stacked semiconductor layers include first semiconductor layers 20 and second semiconductor layers 25. Further, a mask layer 16 is formed over the stacked layers.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. In this disclosure, an "M" compound" or an "M based compound" means the majority of the compound is M.

In another embodiment, the second semiconductor layers 25 are $Si_{1-y}Ge_y$, where y is more than about 0.3, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.3 to about 0.8, and the second semiconductor layer 25 is made of $Si_{1-y}Ge_y$, where y is in a range from about 0.1 to about 0.4.

In FIG. 34, four layers of the first semiconductor layer 20 and four layers of the second semiconductor layer 25 are disposed. However, the number of the layers are not limited to four, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 2 nm to about 20 nm in some embodiments, and is in a range from about 5 nm to about 15 nm in other embodiments. The thickness of the second semiconductor layers 25 is in a range from about 2 nm to about 20 nm in some embodiments, and is in a range from about 5 nm to about 15 nm in other embodiments. The thickness of each of the first semiconductor layers 20 may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 16 includes a first mask layer 16A and a second mask layer 16B. The first mask layer 16A is a pad oxide layer made of a silicon oxide, which can be formed by a thermal oxidation. The second mask layer 16B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 16 is patterned into a mask pattern by using patterning operations including photo-lithography and etching.

Figure 35:
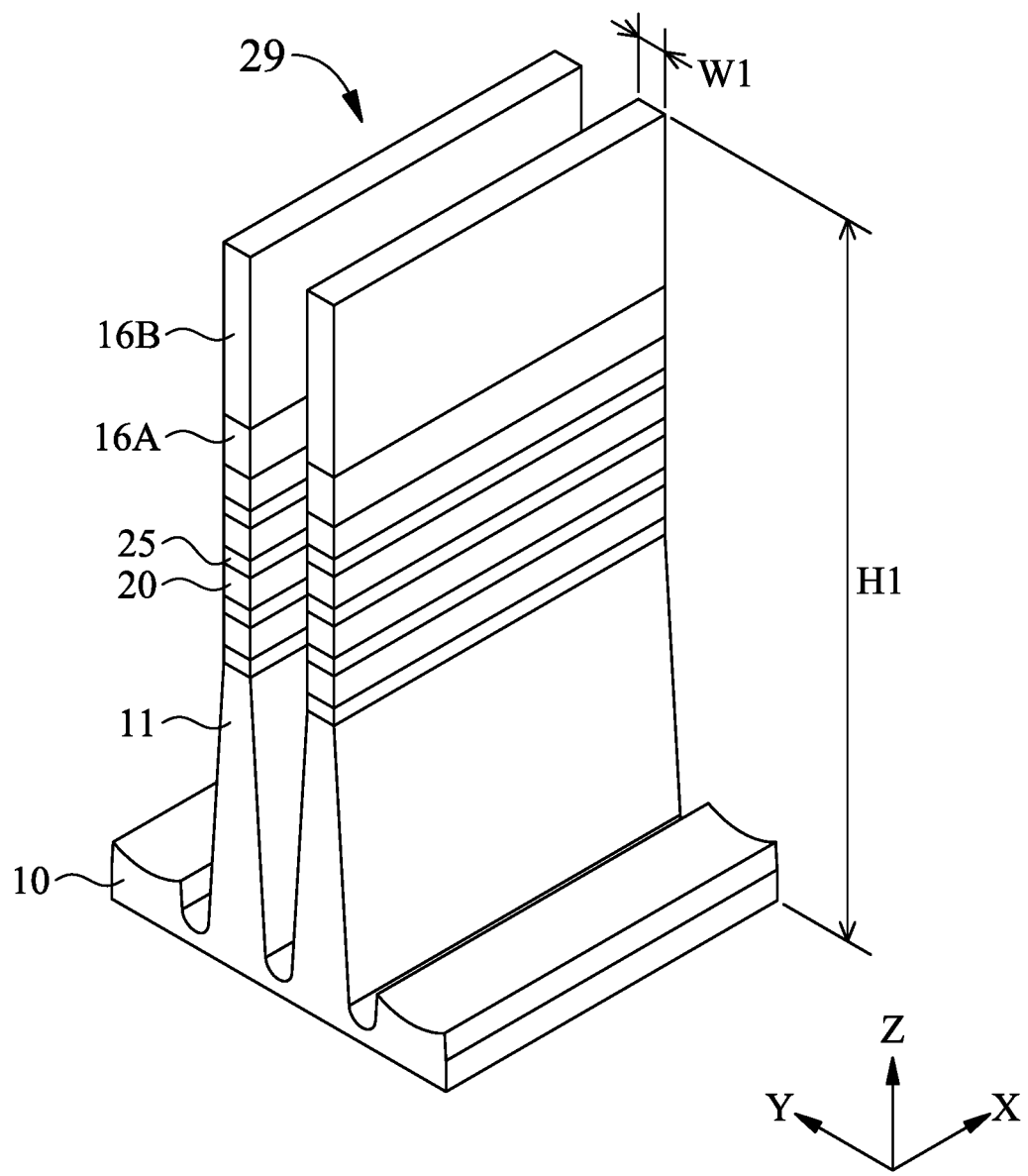
FIG. 35 shows one of the various stages of manufacturing a semiconductor FET device according to embodiments of the present disclosure.
Figure 36:
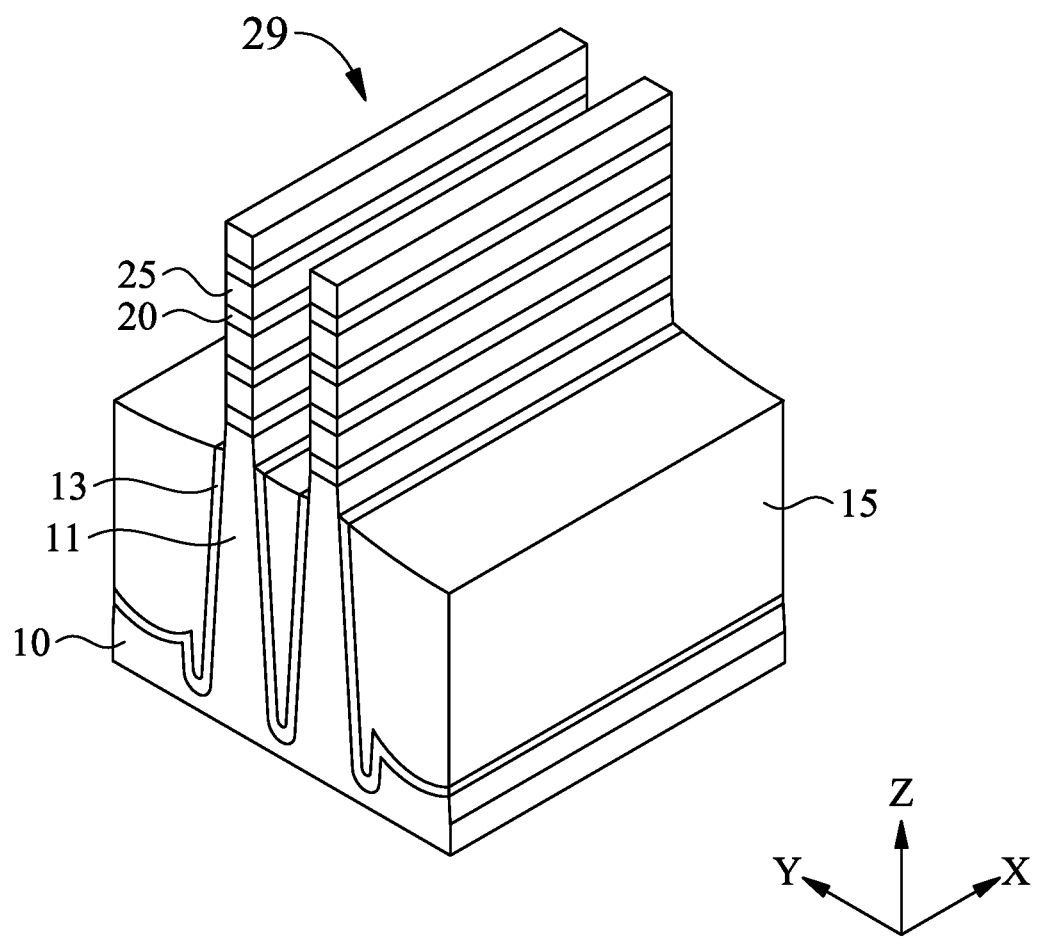
FIG. 36 shows one of the various stages of manufacturing a semiconductor FET device according to embodiments of the present disclosure.

Next, as shown in FIG. 35, the stacked layers of the first and second semiconductor layers 20, 25 are patterned by using the patterned mask layer 16, thereby the stacked layers are formed into fin structures 29 extending in the X direction. In FIG. 36, two fin structures 29 are arranged in the Y direction. But the number of the fin structures is not limited to two, and may be as small as one and three or more. In some embodiments, one or more dummy fin structures are formed on both sides of the fin structures 29 to improve pattern fidelity in the patterning operations. As shown in FIG. 35 the fin structures 29 have upper portions constituted by the stacked semiconductor layers 20, 25 and well portions 11.

The width W1 of the upper portion of the fin structure along the Y direction is in a range from about 10 nm to about 40 nm in some embodiments, and is in a range from about 20 nm to about 30 nm in other embodiments. The height H1 along the Z direction of the fin structure is in a range from about 100 nm to about 200 nm.

The stacked fin structure 29 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 29.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, a fin liner layer 13 is formed over the fin structures before forming the insulating material layer. The fin liner layer 13 is made of SiN or a silicon nitride-based material (e.g., SiON, SiCN or SiOCN).

In some embodiments, the fin liner layers 13 include a first fin liner layer formed over the substrate 10 and sidewalls of the bottom part of the fin structures 11, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

Then, as shown in FIG. 36, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In the embodiment shown in FIG. 36, the insulating material layer 15 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires as channel layers of a GAA FET.

Figure 37:
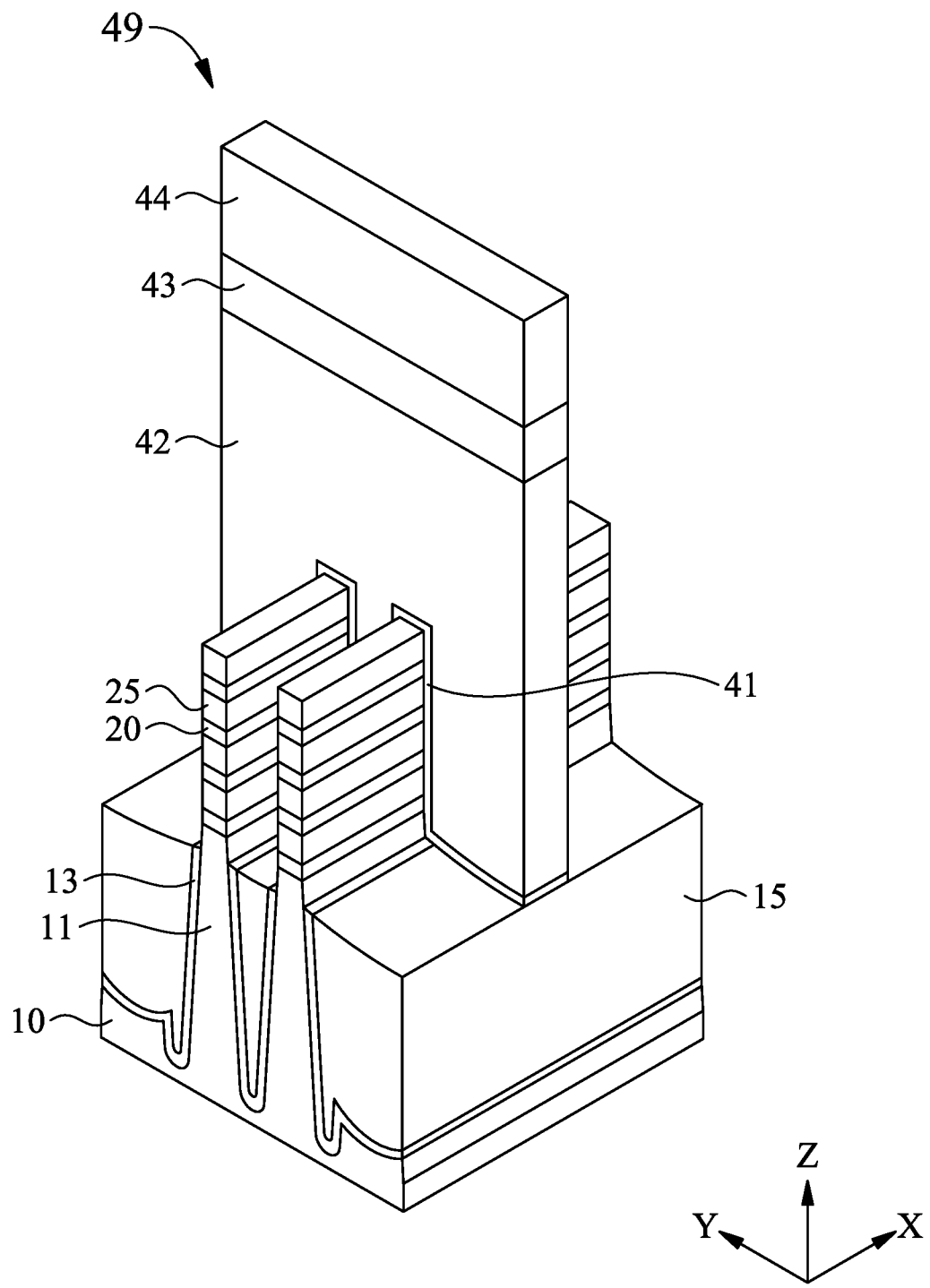
FIG. 37 shows one of the various stages of manufacturing a semiconductor FET device according to embodiments of the present disclosure.

After the isolation insulating layer 15 is formed, a sacrificial (dummy) gate structure 49 is formed, as shown in FIG. 37. FIG. 37 illustrates a structure after a sacrificial gate structure 49 is formed over the exposed fin structures 29. The sacrificial gate structure 49 is formed over a portion of the fin structures which is to be a channel region. The sacrificial gate structure 49 defines the channel region of the GAA FET. The sacrificial gate structure 49 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 49 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 43 and a silicon oxide mask layer 44.

Next, a patterning operation is performed on the mask layer and sacrificial gate electrode layer is patterned into the sacrificial gate structure 49, as shown in FIG. 37. The sacrificial gate structure includes the sacrificial gate dielectric layer 41, the sacrificial gate electrode layer 42 (e.g., poly silicon), the pad SiN layer 43 and the silicon oxide mask layer 44. By patterning the sacrificial gate structure, the stacked layers of the first and second semiconductor layers are partially exposed on opposite sides of the sacrificial gate structure, thereby defining source/drain (S/D) regions, as shown in FIG. 37. In this disclosure, a source and a drain are interchangeably used and the structures thereof are substantially the same. In FIG. 37, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 38:
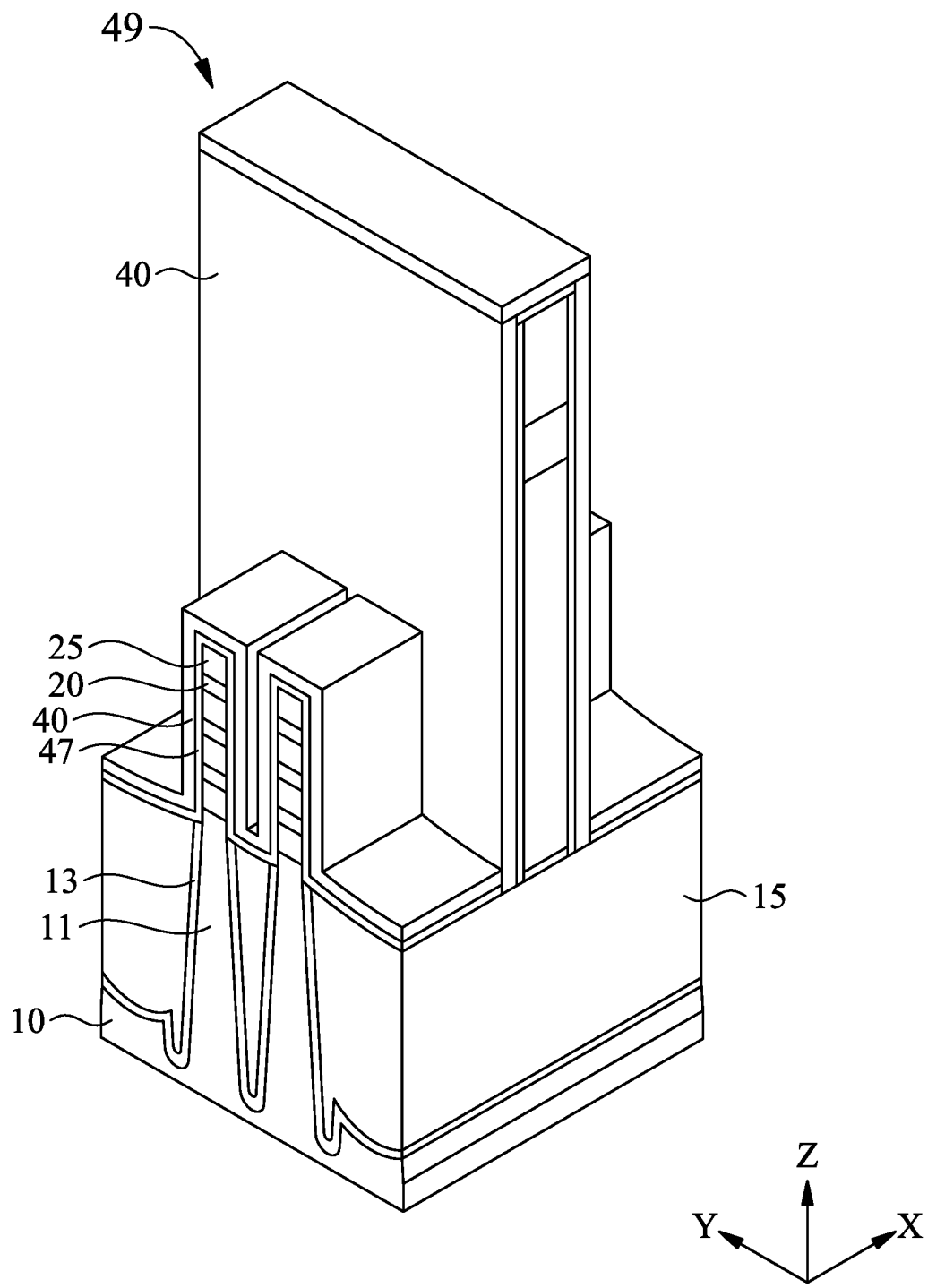
FIG. 38 shows one of the various stages of manufacturing a semiconductor FET device according to embodiments of the present disclosure.

Further, a cover layer 40 for sidewall spacers is formed over the sacrificial gate structure 49, as shown in FIG. 38. The cover layer 40 is deposited in a conformal manner so that it is formed to have substantially equal thicknesses on vertical surfaces, such as the sidewalls, horizontal surfaces, and the top of the sacrificial gate structure, respectively. In some embodiments, the cover layer 40 has a thickness greater than the first cover layer and has the thickness in a range from about 5 nm to about 20 nm. The cover layer 40 includes one or more of SiN, SiON and SiCN or any other suitable dielectric material. The cover layer 40 can be formed by ALD or CVD, or any other suitable method.

In certain embodiments, before the cover layer 40 is formed, an additional cover layer 47 made of an insulating material is conformally formed over the exposed fin structures and the sacrificial gate structure 49. In such a case, the additional cover layer and the cover layer are made of different materials so that one of them can be selectively etched. The additional cover layer 47 includes a low-k dielectric material, such as SiOC and/or SiOCN or any other suitable dielectric material and can be formed by ALD or CVD, or any other suitable method.

By the operations explained with FIGS. 33-38, the structure of FIGS. 4A-4D can be obtained. In FIGS. 4A-4D, the upper portion of the sacrificial gate structure is not shown.

Next, as shown in FIGS. 5A-5D, the stacked structure of the first semiconductor layers 20 and the second semiconductor layer 25 is etched down at the S/D region, by using one or more lithography and etching operations, thereby forming an S/D space 27. In some embodiments, the substrate 10 (or the bottom part of the fin structures 11) is also partially etched.

Further, as shown in FIGS. 6A-6D, the first semiconductor layers 25 are laterally etched in the X direction within the S/D space 27, thereby forming cavities 22. The amount of etching of the first semiconductor layer 25 is in a range from about 2 nm to about 10 nm in some embodiments. When the first semiconductor layers 20 are Ge or SiGe and the second semiconductor layers 25 are Si, the first semiconductor layers 20 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

In other embodiments, as shown in FIGS. 7A-7D, by selecting an appropriate crystal orientation of the first semiconductor layers 20 and an etchant, the etched surface of the lateral ends of the first semiconductor layers 20 has a quadrilateral cavity 23 defined by (111) facets. In the cross section along the X direction, the cavity 23 has a V-shape (or an open-triangle shape), as shown in FIG. 7A.

In the following figures, the manufacturing operations after the structure shown in FIGS. 6A-6D is formed are explained. However, the same operations can be applied to the structure shown in FIGS. 7A-7D.

As shown in FIGS. 8A-8D, a first insulating layer 33 is conformally formed on the lateral ends of the first semiconductor layer 20 and on the second semiconductor layer 25 in the S/D space 27. The first insulating layer 33 includes one of silicon nitride (SiN) and silicon oxide ($SiO_2$), and has a thickness in a range from about 0.5 nm to about 3.0 nm. In other embodiments, the first insulating layer 33 has a thickness in a range from about 1.0 nm to about 2.0 nm. The first insulating layer 33 can be formed by ALD or any other suitable method. By conformally forming the first insulating layer 33, the size of cavity 22 is reduced.

After the first insulating layer 33 is formed, an etching operation is performed to partially remove the first insulating layer, as shown in FIGS. 9A-9D. By this etching, the first insulating layer 33 remains substantially within the cavity 22, because of a small volume of the cavity. Generally, plasma dray etching etches a layer in wide and flat areas faster than a layer in concave (e.g., holes, grooves and/or slits) portions. Thus, the first insulating layer 33 can remain inside the cavities 22. In some embodiments, one or more additional insulating layers are formed on the first insulating layer 33 and then the etching operation is performed.

Subsequently, as shown in FIGS. 10A-10D, an S/D epitaxial layer 50 is formed in the S/D space. The source/drain epitaxial layer 50 includes one or more layers of Si, SiP, SiC and SiCP for an n-channel FET or Si, SiGe, Ge for a p-channel FET. For the P-channel FET, boron (B) may also be contained in the source/drain. The source/drain epitaxial layer 50 is formed by an epitaxial growth method using CVD, ALD or molecular beam epitaxy (MBE). As shown in FIGS. 10A-10D, the source/drain epitaxial layer 50 is formed in contact with the second semiconductor layers 25, and formed such that air gaps 37 are formed between the S/D epitaxial layer 50 and the first insulating layer 33.

Then, as shown in FIGS. 11A-11D, an interlayer dielectric (ILD) layer 70 is formed over the S/D epitaxial layer 50. The materials for the ILD layer 70 include compounds comprising Si, O, C and/or H, such as silicon oxide, SiCOH and SiOC. Organic materials, such as polymers, may be used for the ILD layer 70. After the ILD layer 70 is formed, a planarization operation, such as CMP, is performed, so that the top portion of the sacrificial gate electrode layer 42 is exposed.

Then, the sacrificial gate electrode layer 42 and sacrificial gate dielectric layer 41 are removed. The ILD layer 70 protects the S/D epitaxial layer 50 during the removal of the sacrificial gate structures. The sacrificial gate structures can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

After the sacrificial gate structures are removed, the first semiconductor layers 20 are removed, thereby forming wires of the second semiconductor layers 25, as shown in FIGS. 12A-12D. The first semiconductor layers 20 can be removed or etched using an etchant that can selectively etch the first semiconductor layers 20 against the second semiconductor layers 25, as set forth above. As shown in FIGS. 12A-12D, since the first insulating layer 33 is formed, the etching of the first semiconductor layers 20 stops at the first insulating layer 33. In other words, the first insulating layer 33 functions as an etch-stop layer for etching of the first semiconductor layers 20.

After the semiconductor wires of the second semiconductor layers 25 are formed, a gate dielectric layer 82 is formed around each channel layers (wires of the second semiconductor layers 25), and a gate electrode layer 84 is formed on the gate dielectric layer 82, as shown in FIGS. 13A-13D.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer (not shown) formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layers. The thickness of the gate dielectric layer 82 is in a range from about 1 nm to about 6 nm in one embodiment.

The gate electrode layer 84 is formed on the gate dielectric layer 82 to surround each channel layer. The gate electrode 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 84 may be formed by CVD, ALD, electro-plating, or other suitable method. The gate electrode layer is also deposited over the upper surface of the ILD layer 70. The gate dielectric layer and the gate electrode layer formed over the ILD layer 70 are then planarized by using, for example, CMP, until the top surface of the ILD layer 70 is revealed. In some embodiments, after the planarization operation, the gate electrode layer 84 is recessed and a cap insulating layer (not shown) is formed over the recessed gate electrode 84. The cap insulating layer includes one or more layers of a silicon nitride-based material, such as SiN. The cap insulating layer can be formed by depositing an insulating material followed by a planarization operation.

In certain embodiments of the present disclosure, one or more work function adjustment layers (not shown) are interposed between the gate dielectric layer 82 and the gate electrode 84. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Subsequently, contact holes are formed in the ILD layer 70 by using dry etching, thereby exposing the upper portion of the S/D epitaxial layer 50. In some embodiments, a silicide layer is formed over the S/D epitaxial layer 50. The silicide layer includes one or more of WSi, CoSi, NiSi, TiSi, MoSi and TaSi. Then, a conductive contact layer 72 is formed in the contact holes as shown in FIGS. 1A-1D. The conductive contact layer 72 includes one or more of Co, Ni, W, Ti, Ta, Cu, Al, TiN and TaN. Further, a conductive contact plug 75 is formed on the conductive contact layer 72. The conductive contact plug 75 includes one or more layers of Co, Ni, W, Ti, Ta, Cu, Al, TiN and TaN.

It is understood that the GAA FETs undergo further CMOS processes to form various features such as contacts/vias, interconnect metal layers, dielectric layers, passivation layers, etc.

FIGS. 14A-14D to 25A-25D show various stages of manufacturing a semiconductor FET device according to another embodiment of the present disclosure. In FIGS. 14A-25D, the "A" figures are a cross sectional view along the X direction (source-drain direction), the "B" figures are a cross sectional view corresponding to Y1-Y1 of the respective "A" figure, the "C" figures are a cross sectional view corresponding to Y2-Y2 of the respective "A" figure, and the "D" figures are a cross sectional view corresponding to Y3-Y3 of the respective "A" figure. It is understood that additional operations can be provided before, during, and after processes shown by FIGS. 14A-25D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-13D may be employed in the embodiment of FIGS. 14A-25D, and detailed explanation thereof may be omitted.

FIGS. 14A-14D are the same as FIGS. 4A-4D and the resultant structure fabricated by the manufacturing operations explained with FIGS. 33-38.

Unlike the operations explained with FIGS. 5A-5D, the source/drain etching is performed to selectively remove the first semiconductor layers 20, thereby leaving the second semiconductor layers 25 in the source/drain region, as shown in FIGS. 15A-15D. The etching can be dry etching and/or wet etching. The S/D space 28, in which the second semiconductor layers 25 laterally cross, is formed. In some embodiments, the substrate 10 (or the bottom part of the fin structures 11) is not substantially etched.

Further, similar to the operations explained with FIGS. 6A-6D, the first semiconductor layers 25 are laterally etched in the X direction within the S/D space 28, thereby forming cavities 22, as shown in FIGS. 16A-16D. The amount of etching of the first semiconductor layer 25 is in a range from about 2 nm to about 10 nm in some embodiments. When the first semiconductor layers 20 are Ge or SiGe and the second semiconductor layers 25 are Si, the first semiconductor layers 20 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

In other embodiments, similar to FIGS. 7A-7D, by selecting an appropriate crystal orientation of the first semiconductor layers 20 and an etchant, the etched surface of the lateral ends of the first semiconductor layers 20 has a quadrilateral cavity 23 defined by (111) facets, as shown in FIGS. 17A-17D. In the cross section along the X direction, the cavity 23 has a V-shape (or an open-triangle shape), as shown in FIG. 17A.

In the following figures, the manufacturing operations after the structure shown in FIGS. 16A-16D is formed are explained. However, the same operations can be applied to the structure shown in FIGS. 17A-17D.

As shown in FIGS. 18A-18D, a first insulating layer 33 is conformally formed on the lateral ends of the first semiconductor layer 20 and on the second semiconductor layer 25 in the S/D space 28. In this embodiment, the first insulating layer 33 wraps around the second semiconductor layer 25, respectively, in the S/D space 28. The first insulating layer 33 includes one of silicon nitride (SiN) and silicon oxide ($SiO_2$), and has a thickness in a range from about 0.5 nm to about 3.0 nm. In other embodiments, the first insulating layer 33 has a thickness in a range from about 1.0 nm to about 2.0 nm. The first insulating layer 33 can be formed by ALD or any other suitable method. By conformally forming the first insulating layer 33, the size of cavity 22 is reduced.

Figures 19A, 19B, 19C, 19D:
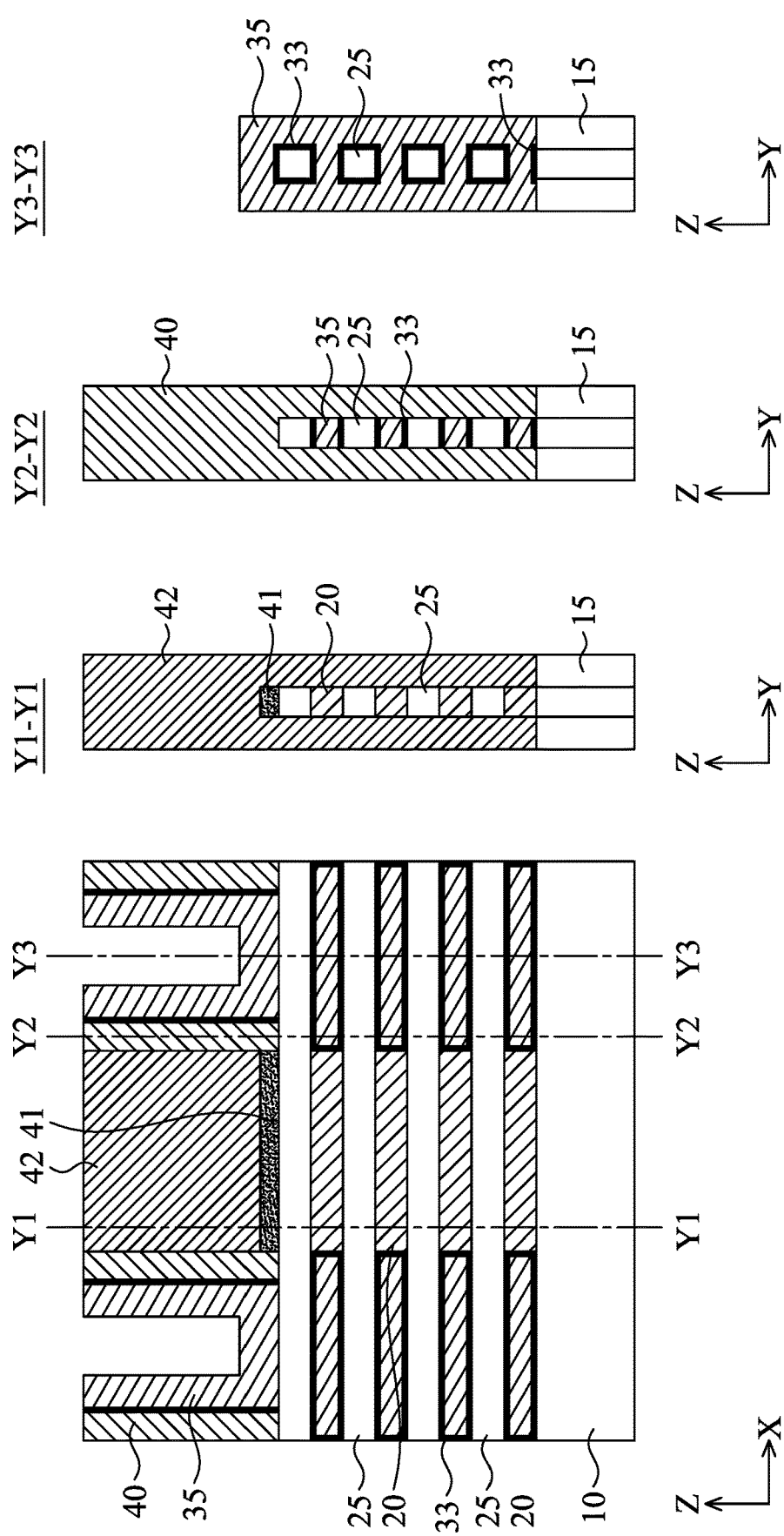
FIGS. 19A-19D show one of the various stages of manufacturing a semiconductor FET device according to an embodiment of the present disclosure.
Figures 20A, 20B, 20C, 20D:
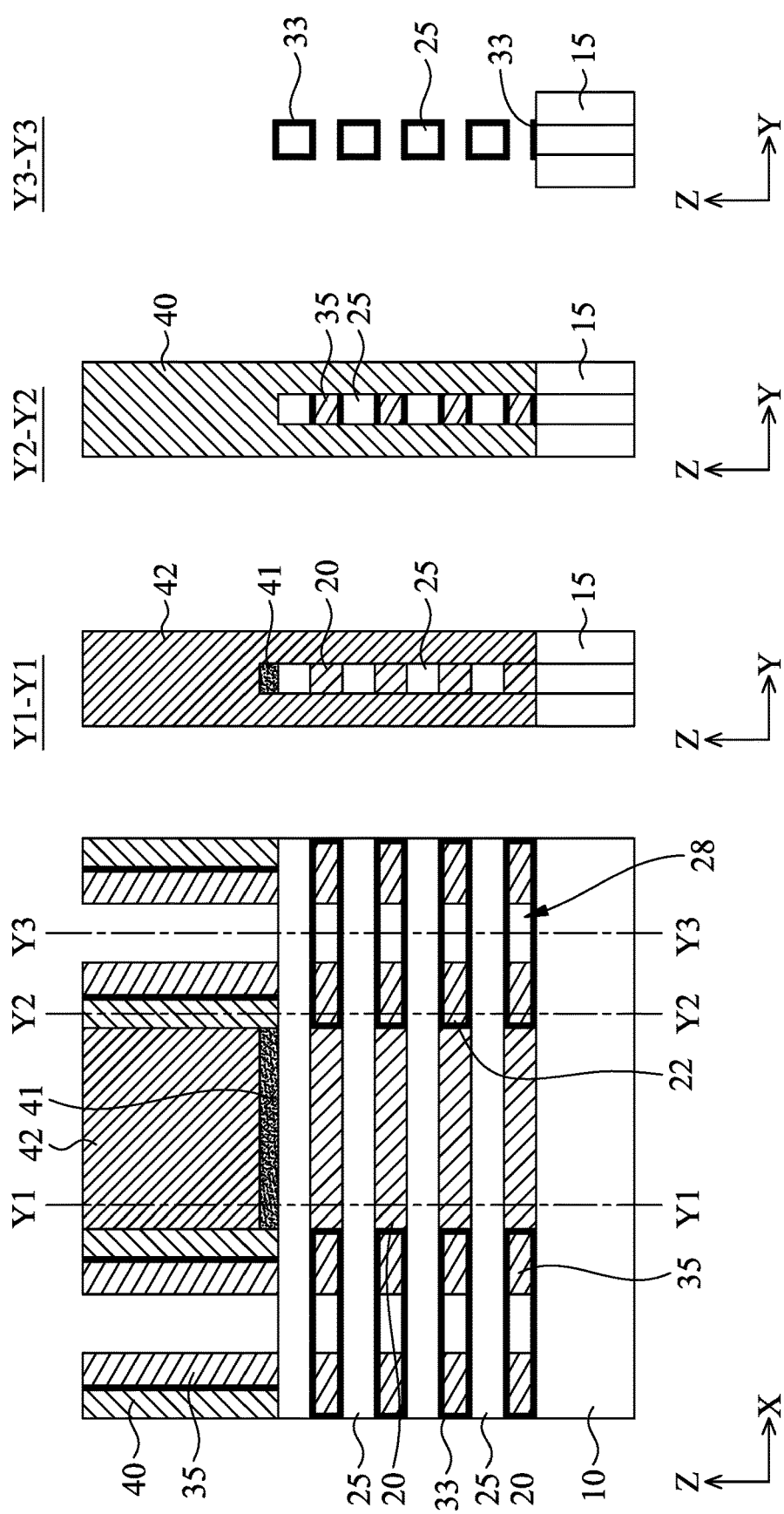
FIGS. 20A-20D show one of the various stages of manufacturing a semiconductor FET device according to an embodiment of the present disclosure.
Figures 21A, 21B, 21C, 21D:
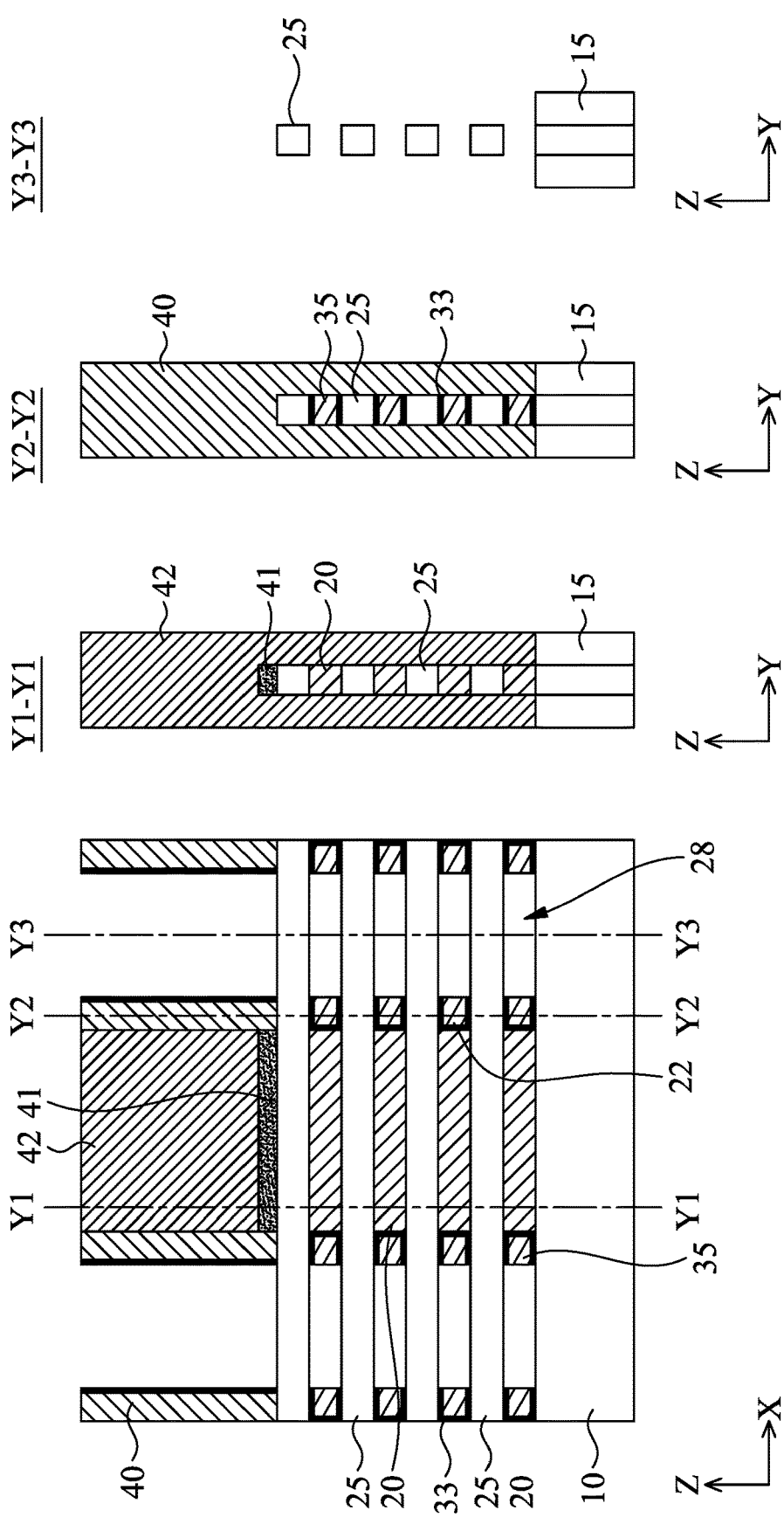
FIGS. 21A-21D show one of the various stages of manufacturing a semiconductor FET device according to an embodiment of the present disclosure.
Figures 23A, 23B, 23C, 23D:
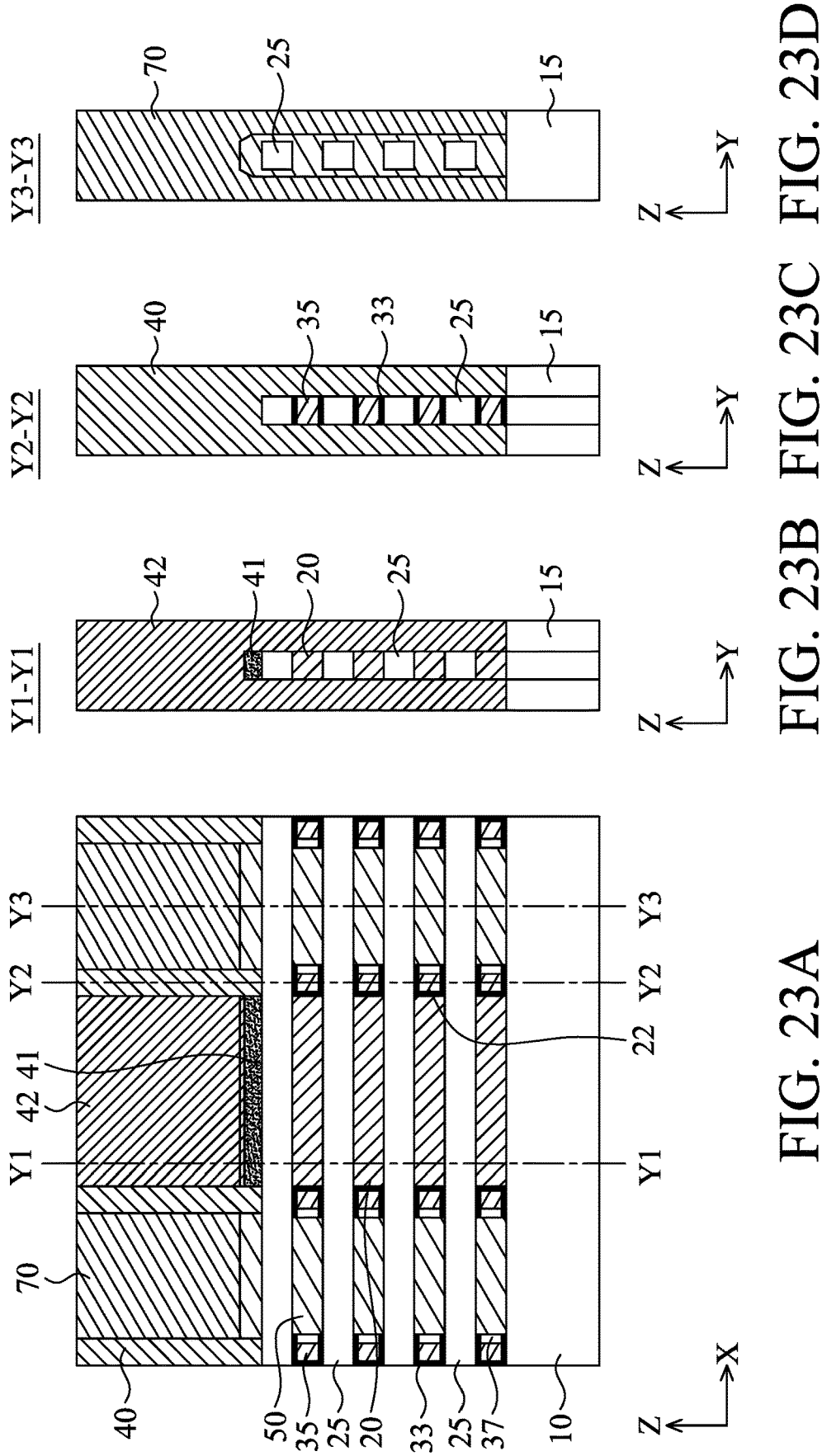
FIGS. 23A-23D show one of the various stages of manufacturing a semiconductor FET device according to an embodiment of the present disclosure.
Figures 24A, 24B, 24C, 24D:
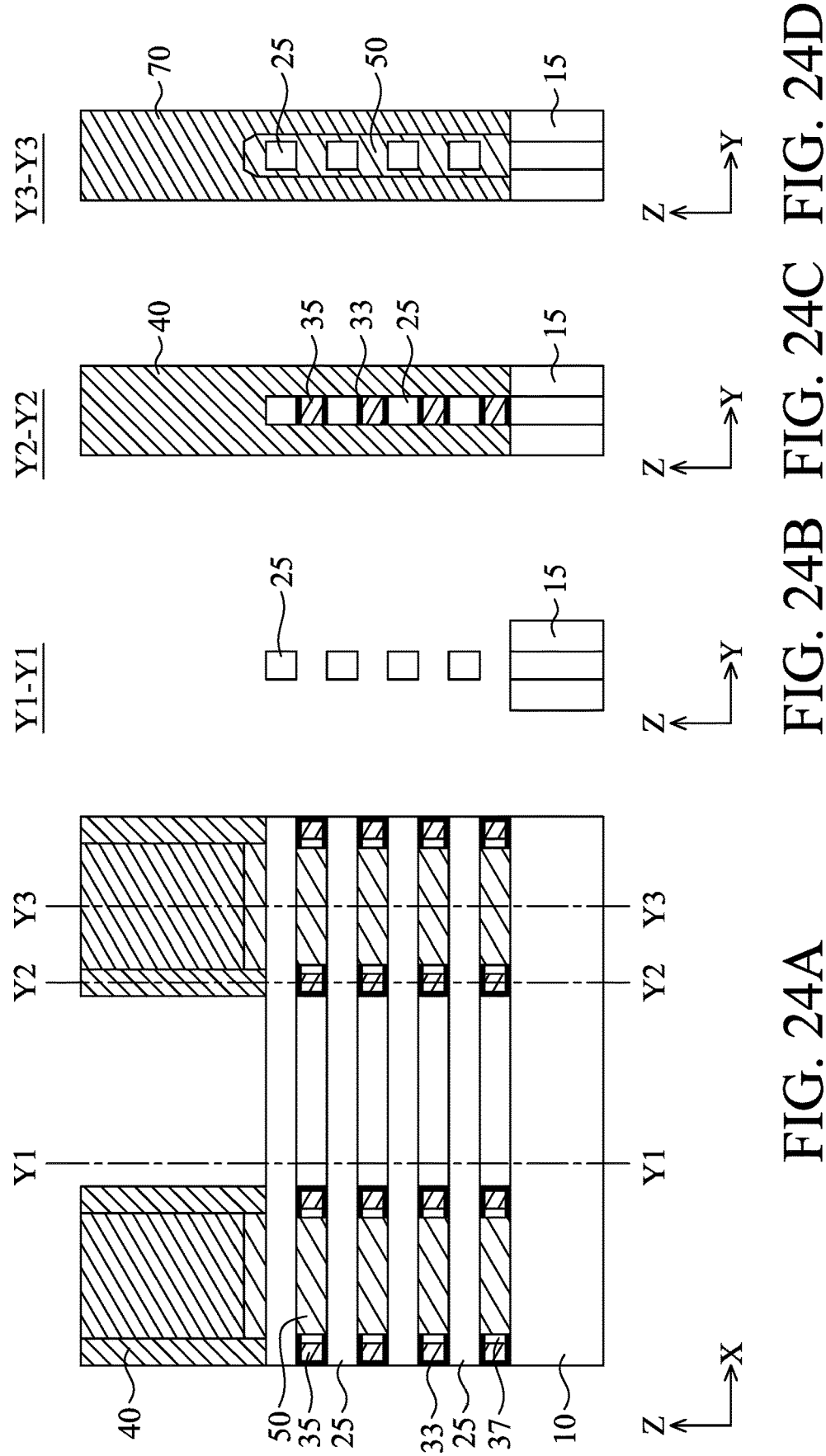
FIGS. 24A-24D show one of the various stages of manufacturing a semiconductor FET device according to an embodiment of the present disclosure.
Figures 25A, 25B, 25C, 25D:
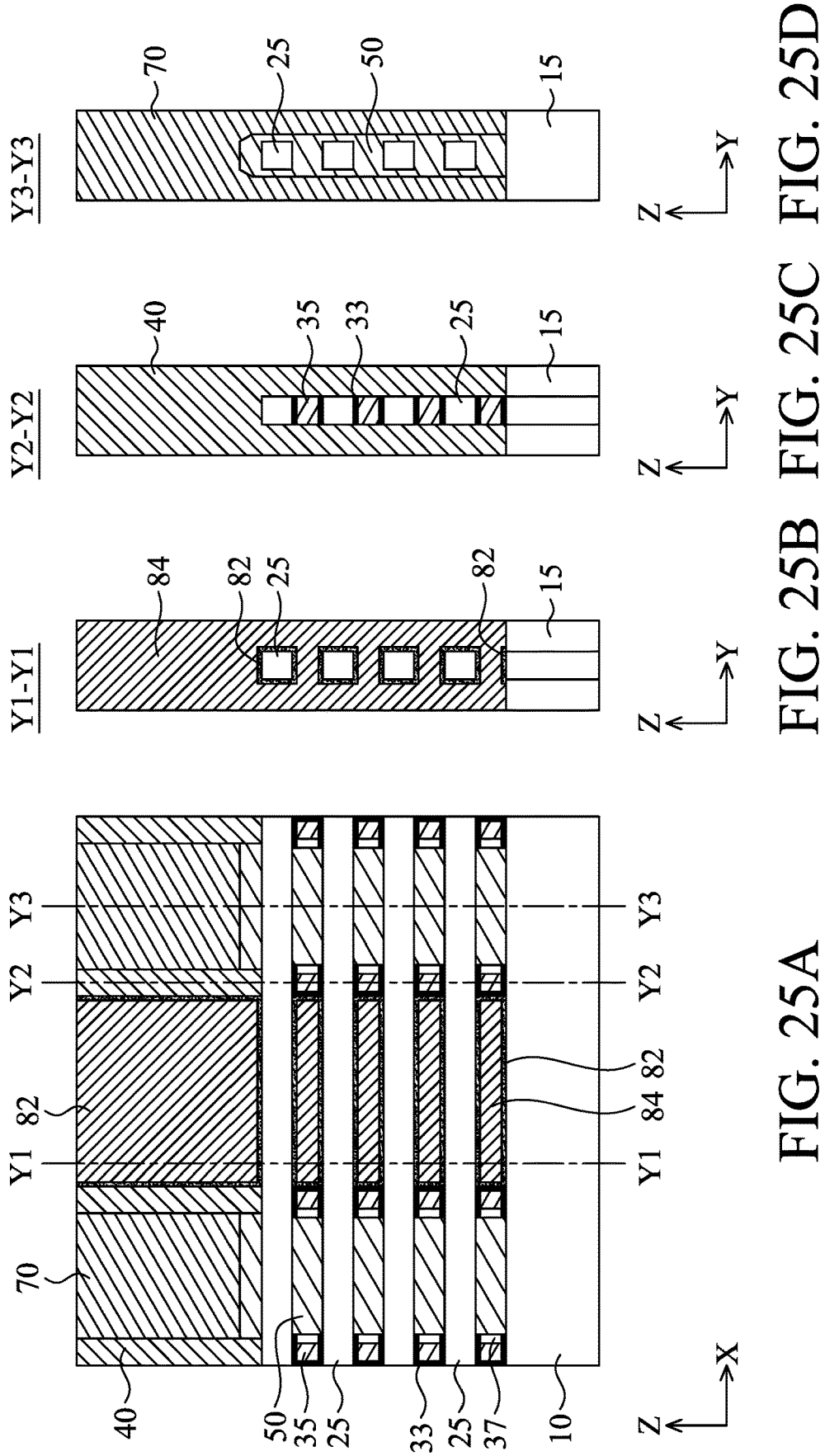
FIGS. 25A-25D show one of the various stages of manufacturing a semiconductor FET device according to an embodiment of the present disclosure.

Then, as shown in FIGS. 19A-19D, a second insulating layer 35 is formed on the first insulating layer 33 in the S/D space 28. The second insulating layer 35 is made of suitable dielectric materials such as silicon oxide, silicon oxynitride, fluorine-doped silicate glass (FSG), low-k dielectrics such as carbon doped oxides (SiOC, SiOCN), extremely low-k dielectrics such as porous carbon doped silicon dioxide, a polymer such as polyimide, combinations of these, or the like. In some embodiments, the second insulating layer 35 includes one or more layers of low-k dielectric material. The second insulating layer 35 is formed so as to fully fill the remaining S/D space 28 in some embodiments. In certain embodiments, the second insulating layer 35 does not fully fill the space between adjacent sacrificial gate structures (between opposing sidewalls) as shown in FIG. 19A. The second insulating layer 35 can be formed through a process such as CVD, flowable CVD (FCVD), or a spin-on-glass process, although any acceptable process may be utilized.

Next, as shown in FIGS. 20A-20D, the second insulating layer 35 is etched to be partially removed from the S/D space 28. Since the first insulating layer 33 and the second insulating layer 35 are made of different materials, the first insulating layer 33 substantially remains on the second semiconductor layers 25. In some embodiments, the second semiconductor layer 35 remains on side faces of the sacrificial gate structure (sidewall 40), but in other embodiments, no second semiconductor layer 35 remains on the side faces of the sacrificial gate structure.

Further, as shown in FIGS. 21A-21D, part of the remaining second insulating layer 35, if any remains, and the first insulating layer 33 formed on the second semiconductor layer 25 are removed by suitable etching. By this etching, the first insulating layer 33 and the second insulating layer 35 remain in the cavities 22, respectively. In some embodiments, the end of the first insulating layer 33 protrudes from the second insulating layer toward the S/D space 28 in the cavity 22.

Subsequently, as shown in FIGS. 22A-22D, an S/D epitaxial layer 50 is formed in the S/D space 28, similar to FIGS. 10A-10D. The source/drain epitaxial layer 50 includes one or more layers of Si, SiP, SiC and SiCP for an n-channel FET or Si, SiGe, Ge for a p-channel FET. For the P-channel FET, boron (B) may also be contained in the source/drain. The source/drain epitaxial layer 50 is formed by an epitaxial growth method using CVD, ALD or molecular beam epitaxy (MBE). As shown in FIGS. 22A-2D, the source/drain epitaxial layer 50 is formed in contact with the second semiconductor layers 25, and formed such that air gaps 37 are formed between the S/D epitaxial layer 50 and the first and second insulating layers 33, 35.

Then, as shown in FIGS. 23A-23D, an interlayer dielectric (ILD) layer 70 is formed over the S/D epitaxial layer 50. The materials for the ILD layer 70 include compounds comprising Si, O, C and/or H, such as silicon oxide, SiCOH and SiOC. Organic materials, such as polymers, may be used for the ILD layer 70. After the ILD layer 70 is formed, a planarization operation, such as CMP, is performed, so that the top portion of the sacrificial gate electrode layer 42 is exposed.

Then, the sacrificial gate electrode layer 42 and sacrificial gate dielectric layer 41 are removed, and then the first semiconductor layers 20 are removed, by similar or the same operations explained with reference to FIGS. 12A-12D, thereby forming wires of the second semiconductor layers 25, as shown in FIGS. 24A-24D.

After the semiconductor wires of the second semiconductor layers 25 are formed, a gate dielectric layer 82 is formed around each channel layers (wires of the second semiconductor layers 25), and a gate electrode layer 84 is formed on the gate dielectric layer 82, as shown in FIGS. 25A-25D, by similar or the same operations explained with FIGS. 13A-13D.

Figure 26C:
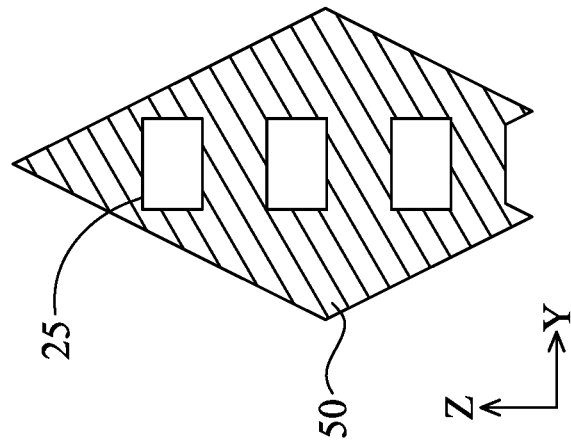
FIGS. 26A, 26B and 26C show various configurations of a source/drain region according to embodiments of the present disclosure.
Figure 26B:
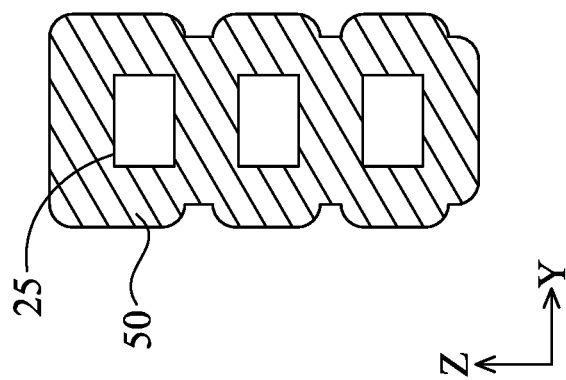
Figure 26A:
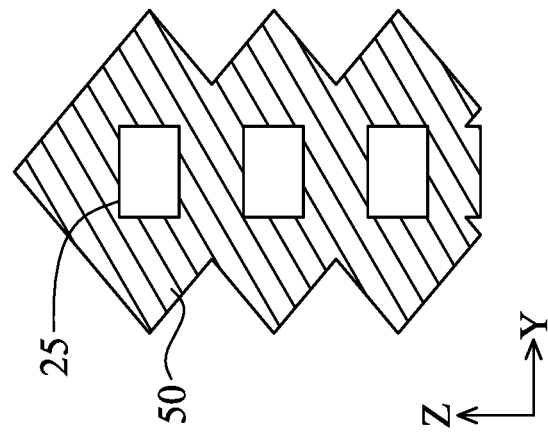
Figures 27A, 27B, 27C, 27D:
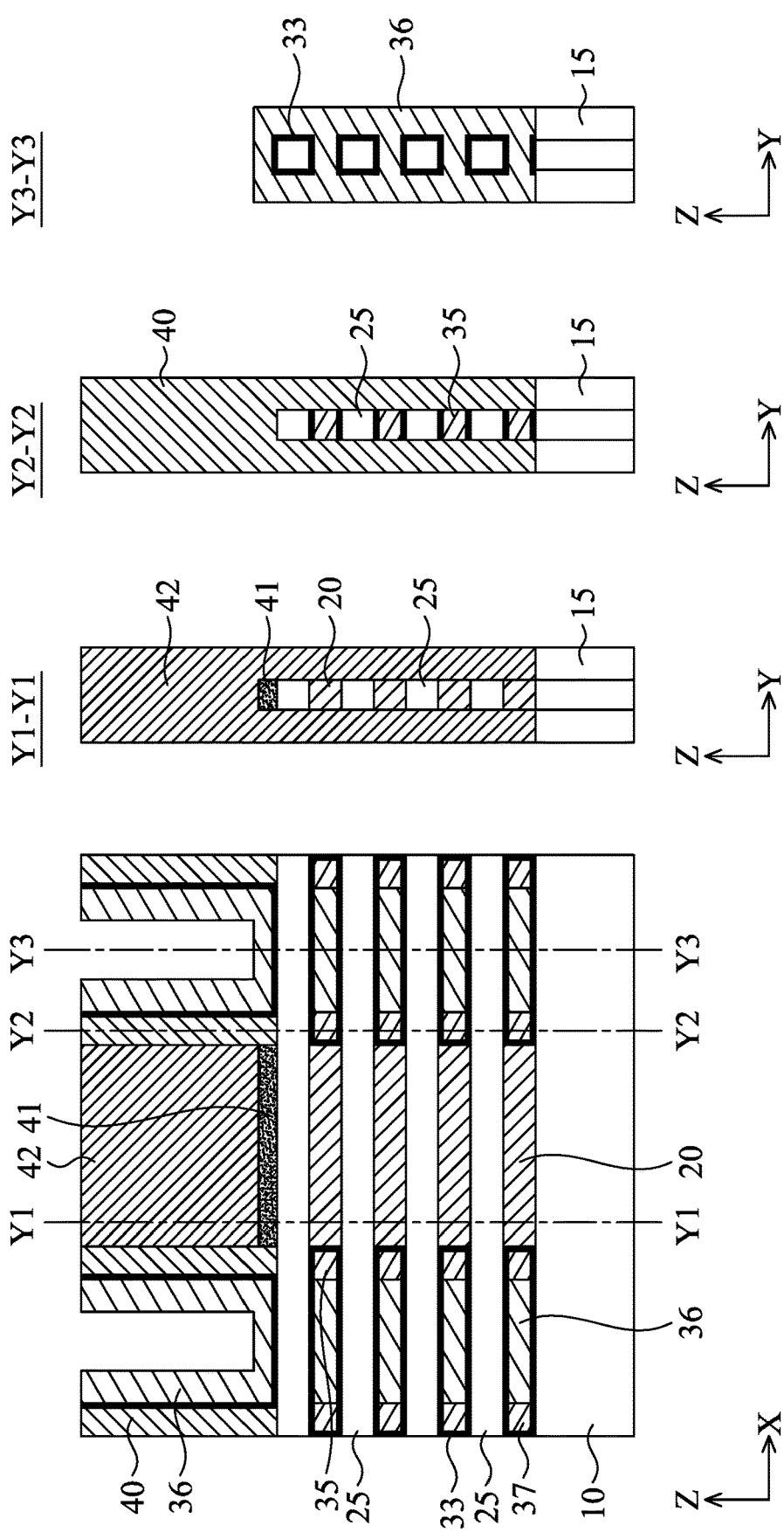
FIGS. 27A-27D show one of the various stages of manufacturing a semiconductor FET device according to an embodiment of the present disclosure.
Figures 28A, 28B, 28C, 28D:
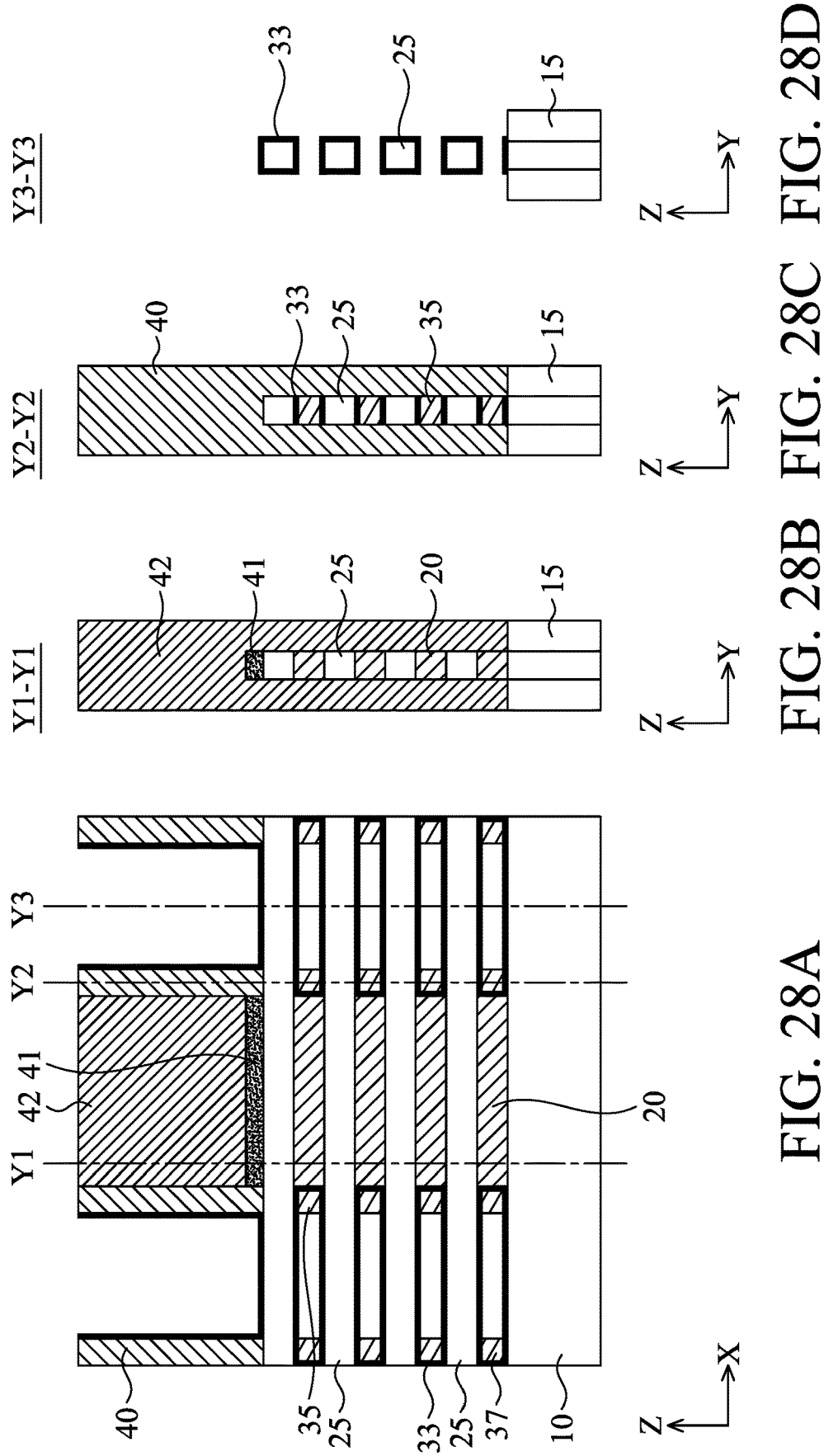
FIGS. 28A-28D show one of the various stages of manufacturing a semiconductor FET device according to an embodiment of the present disclosure.
Figures 30B, 30C, 30D:
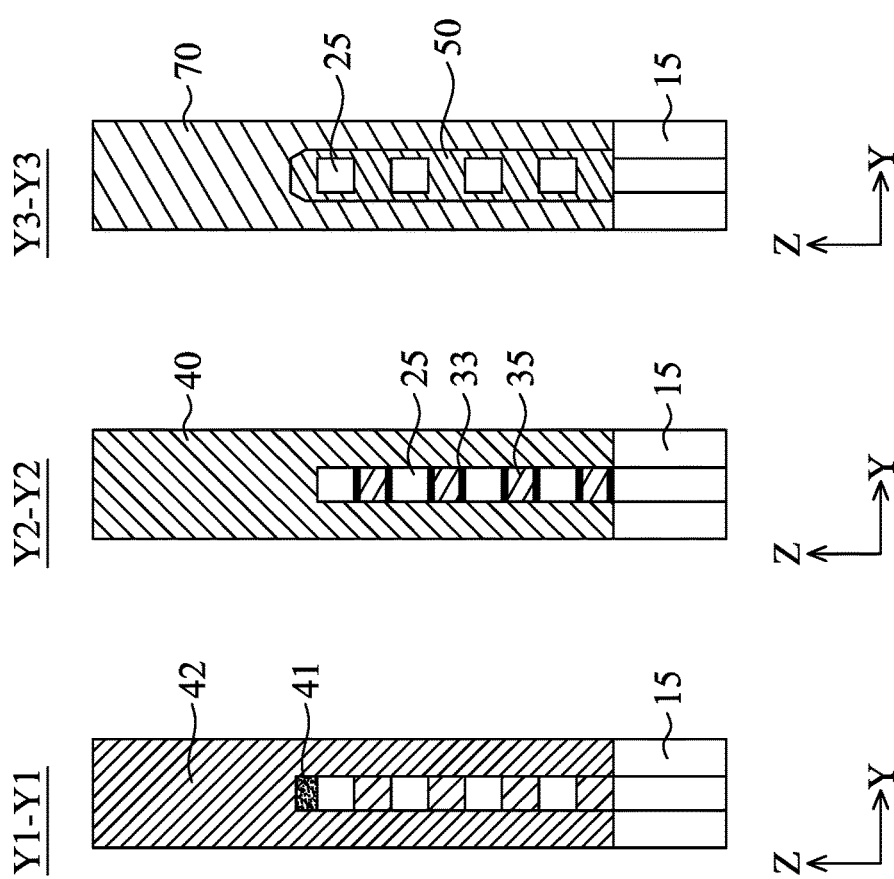
FIGS. 30A-30D show one of the various stages of manufacturing a semiconductor FET device according to an embodiment of the present disclosure.
Figure 30A:
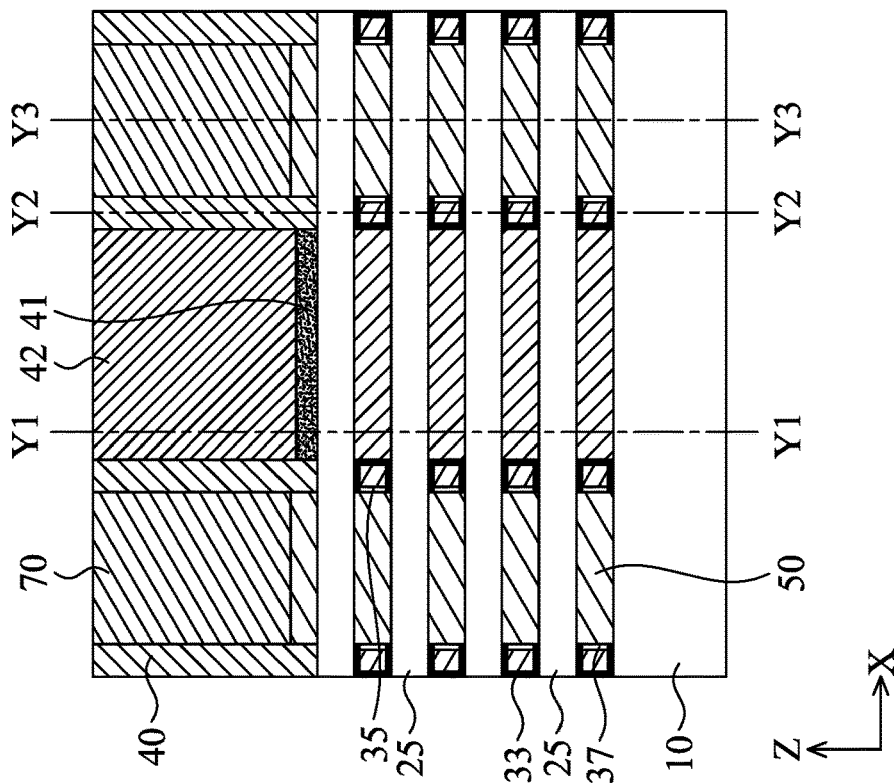

FIGS. 26A-26C show various configurations of a source/drain region according to embodiments of the present disclosure. FIGS. 26A-26C are cross sectional views along the Y direction (gate extending direction), similar to FIG. 25D. In some embodiments, the S/D epitaxial layer 50 is epitaxially formed on the second semiconductor layers 25, creating a diamond shape over the second semiconductor layers 25, respectively, as shown in FIG. 26A. In some embodiments, the S/D epitaxial layer 50 is epitaxially formed on the second semiconductor layers 25 conformally over the second semiconductor layers 25, respectively, as shown in FIG. 26B. In other embodiments, the S/D epitaxial layer 50 is epitaxially formed on the second semiconductor layers 25, creating a diamond shape over the second semiconductor layers 25, as a whole, as shown in FIG. 26C. In certain embodiments, the source/drain epitaxial layer 50 has a hexagonal shape, other polygonal shapes or a semi-circular shape in the cross section.

It is understood that the GAA FETs undergo further CMOS processes to form various features such as contacts/vias, interconnect metal layers, dielectric layers, passivation layers, etc.

FIGS. 27A-27D to 30A-30D show various stages of manufacturing a semiconductor FET device according to another embodiment of the present disclosure. In FIGS. 27A-30D, the "A" figures are a cross sectional view along the X direction (source-drain direction), the "B" figures are a cross sectional view corresponding to Y1-Y1 of the respective "A" figure, the "C" figures are a cross sectional view corresponding to Y2-Y2 of the respective "A" figure, and the "D" figures are a cross sectional view corresponding to Y3-Y3 of the respective "A" figure. It is understood that additional operations can be provided before, during, and after processes shown by FIGS. 27A-30D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-26D may be employed in the embodiment of FIGS. 27A-30D, and detailed explanation thereof may be omitted.

After the second insulating layer 35 is formed as shown in FIGS. 19A-19D, a structure modification operation is performed on the second insulating layer 35 to partially change the structure and/or property of the second insulating layer 35. The modified layer 36 shown in FIGS. 27A-27D, has a lower oxide density and/or has a higher etching rate than the second insulating layer 35 as deposited. In some embodiments, an ion implantation operation is performed on the second insulating layer 35. By implanting ions, for example, nitrogen ions, into the second insulating layer 35 from the top, the second insulating layer 35 except for the part of the second insulating layer under the sidewall spacers 40 is modified in the structure. Other ions, for example, Ge, P, B and/or As can be used. The ions are also implanted into the second semiconductor layer 25 in the source/drain region.

Then, as shown in FIGS. 28A-28D, the modified second insulating layer 36 is removed by suitable etching. In some embodiments, wet etching is employed. Since the first insulating layer 33 and the second insulating layer 35 (the modified layer 36) are made of different materials, the first insulating layer 33 substantially remains on the second semiconductor layers 25. The ion implantation to modify the second insulating layer 35 and the removal of the modified layer 36 may be repeated, so that the second insulating layer 35 is removed by a step-by-step manner.

Further, similar to FIGS. 21A-21D, the first insulating layer 33 formed on the second semiconductor layer 25 is removed by suitable etching. After this etching, the first insulating layer 33 and the second insulating layer 35 remain in the cavities 22, respectively, as shown in FIGS. 29A-29D. In some embodiments, the end of the first insulating layer 33 protrudes from the second insulating layer toward the S/D space 28 in the cavity 22.

Subsequently, similar to FIGS. 22A-22D, an S/D epitaxial layer 50 is formed in the S/D space 28, and an interlayer dielectric (ILD) layer 70 is formed over the S/D epitaxial layer 50, as shown in FIGS. 30A-30D. As shown in FIGS. 30A-30D, the source/drain epitaxial layer 50 is formed in contact with the second semiconductor layers 25, and formed such that air gaps 37 are formed between the S/D epitaxial layer 50 and the first and second insulating layers 33, 35.

Then, the sacrificial gate electrode layer 42 and sacrificial gate dielectric layer 41 are removed, and then the first semiconductor layers 20 are removed, by similar or the same operations explained with FIGS. 12A-12D and FIGS. 24A-24D. After the semiconductor wires of the second semiconductor layers 25 are formed, a gate dielectric layer is formed around each channel layers (wires of the second semiconductor layers 25), and a gate electrode layer is formed on the gate dielectric layer, by similar or the same operations explained with FIGS. 13A-13D and FIGS. 25A-25D.

It is understood that the GAA FETs undergoes further CMOS processes to form various features such as contacts/vias, interconnect metal layers, dielectric layers, passivation layers, etc.

FIGS. 31A-32B show various configurations of a semiconductor FET device according to embodiments of the present disclosure.

In FIG. 31A, after the lateral etching of the second semiconductor layer 25 as explained with FIGS. 16A-16D, the width W2 of the second semiconductor layer 25 is equal to or smaller than the width W1 of the sacrificial gate electrode 42. Accordingly, after the metal gate electrode 84 is formed, the gate length Lg2 (along the X direction) at the bottom portion of the gate electrode 84 (between the semiconductors 25) is equal to or smaller than the gate length Lg1 (along the X direction) at the upper portion of the gate electrode 84, as shown in FIG. 31B.

Figure 32A:
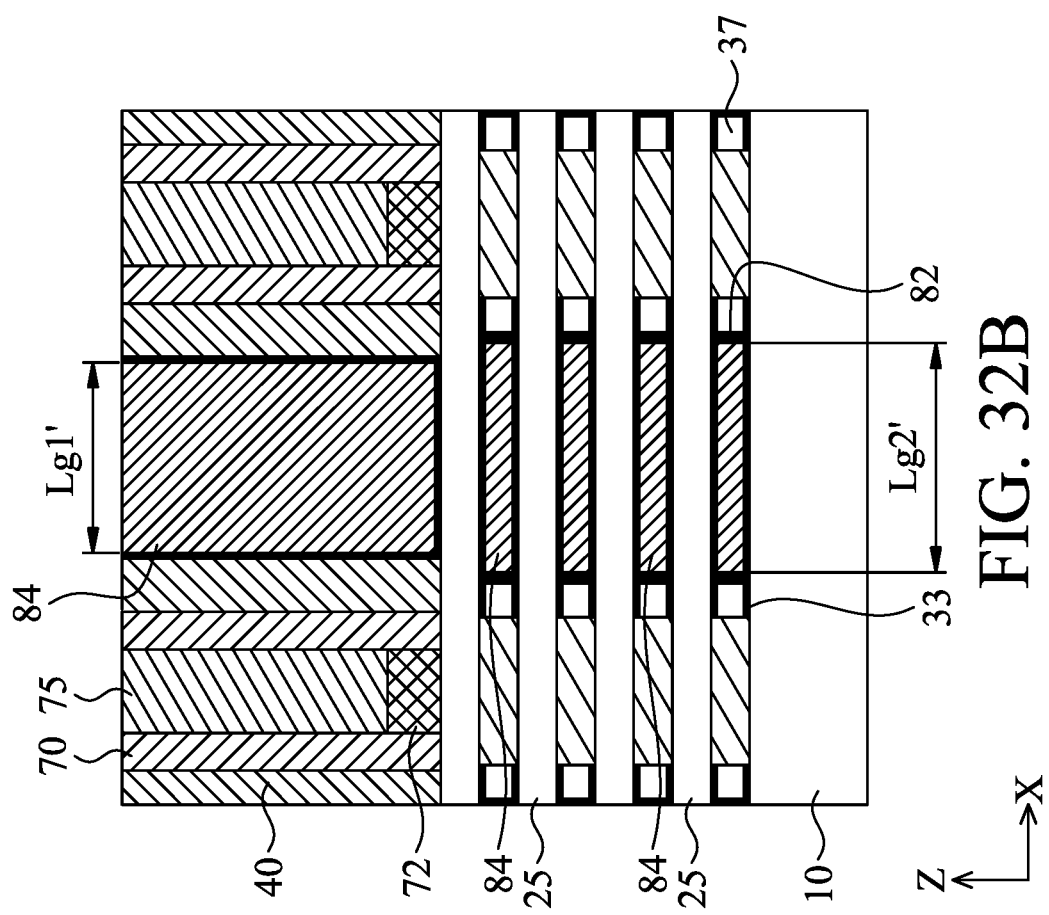
FIGS. 32A and 32B show one of the various stages of manufacturing a semiconductor FET device according to another embodiment of the present disclosure.
Figure 32B:
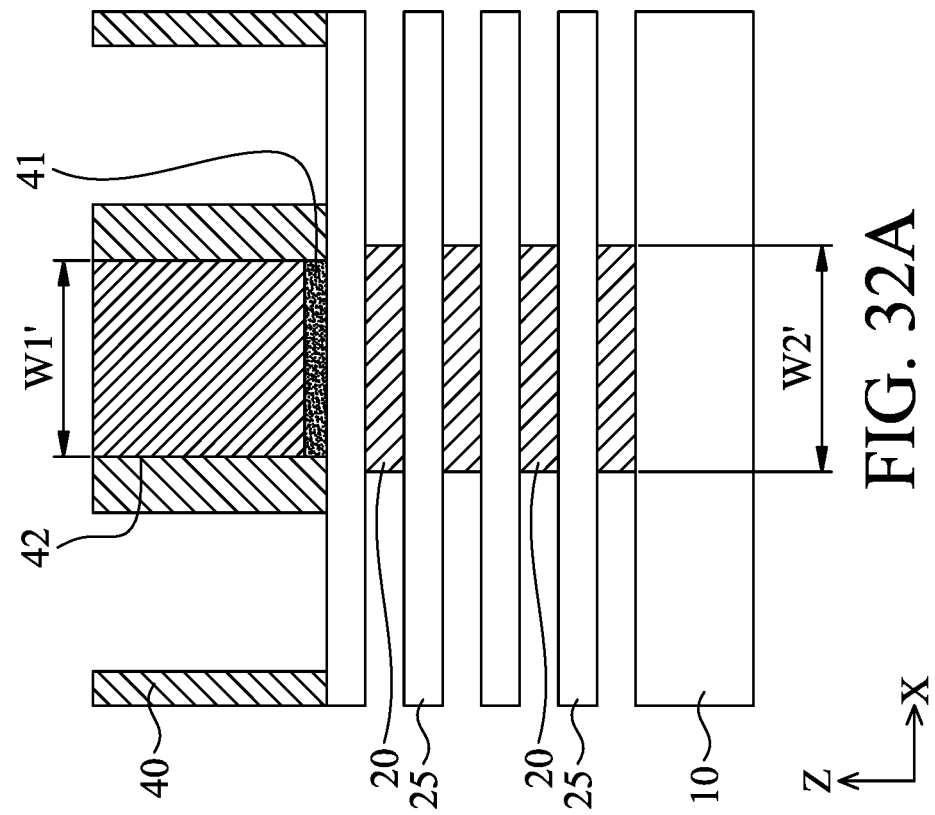

In FIG. 32A, after the lateral etching of the second semiconductor layer 25 as explained with FIGS. 16A-16D, the width W2' of the second semiconductor layer 25 is greater than the width W1' of the sacrificial gate electrode 42. In some embodiments, the sidewall spacers 40 are formed to have a greater thickness than that in the case of FIG. 31A. In certain embodiments, the thickness of the sidewall spacers 40 is in a range from about 5 nm to about 15 nm and is in a range from about 6 nm to about 10 nm in other embodiments. It is also possible to adjust at least one of the width of the sacrificial gate electrode 42 and a lateral etching amount of the second semiconductor layers 25. Accordingly, after the metal gate electrode 84 is formed, the gate length Lg2' at the bottom portion of the gate electrode 84 is greater than the gate length Lg1' (along the X direction) at the upper portion of the gate electrode 84, as shown in FIG. 32B. In some embodiments, W2'/W1' is in a range from about 1.2 to about 1.5, and Lg2'/Lg1' is in a range from about 1.2 to about 1.5. By adjusting Lg2' larger than lg1', the effective gate length can become greater and better gate control is possible.

The various embodiments or examples described herein offer several advantages over the existing art. For example, in the present disclosure, since the inner space regions includes an air gap, it is possible to reduce a capacitance. Further, by using a first insulating layer as an etch-stop layer, it is possible to more precisely control etching of the first semiconductor layers when the nanowires are formed. With the foregoing embodiments, it is possible to more precisely control the thickness, the shape and/or the location of the inner spacers and thus to control capacitances around the source/drain and the gate.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure, in which first semiconductor layers and second semiconductor layers are alternately stacked, is formed. A sacrificial gate structure is formed over the fin structure. A source/drain region of the fin structure, which is not covered by the sacrificial gate structure, is etched, thereby forming a source/drain space. The first semiconductor layers are laterally etched through the source/drain space. A first insulating layer is formed, in the source/drain space, at least on etched first semiconductor layers. A source/drain epitaxial layer is formed in the source/drain space, thereby forming air gaps between the source/drain epitaxial layer and the first semiconductor layers. In one or more of the foregoing or following embodiments, each of the air gaps is defined by the source/drain epitaxial layer and the first insulating layer disposed on a lateral end of one of the first semiconductor layer and on two adjacent second semiconductor layers. In one or more of the foregoing or following embodiments, the lateral end of one of the first semiconductor layer has a flat surface. In one or more of the foregoing or following embodiments, the lateral end of one of the first semiconductor layer has a V-shaped cross section. In one or more of the foregoing or following embodiments, the first insulating layer includes at least one of silicon nitride and silicon oxide. In one or more of the foregoing or following embodiments, a second insulating layer is further formed on the first insulating layer. Each of the air gaps is defined by the source/drain epitaxial layer and the second insulating layer. In one or more of the foregoing or following embodiments, the second insulating layer includes a low-k dielectric material. In one or more of the foregoing or following embodiments, after the source/drain epitaxial layer is formed, the sacrificial gate structure is removed, thereby exposing a part of the fin structure. The first semiconductor layers are removed from the exposed fin structure, thereby forming channel layers including the second semiconductor layers. A gate dielectric layer and a gate electrode layer are formed around the channel layers. In one or more of the foregoing or following embodiments, the gate electrode layer is isolated from the source/drain epitaxial layer by the air gaps and the first insulating layer. In one or more of the foregoing or following embodiments, the first semiconductor layers are made of SiGe, and the second semiconductor layers are made of Si.

In accordance with another aspect of the present disclosure, in a method of manufacturing a semiconductor device, a fin structure, in which first semiconductor layers and second semiconductor layers are alternately stacked, is formed. A sacrificial gate structure is formed over the fin structure. The first semiconductor layers are removed from a source/drain region of the fin structure, which is not covered by the sacrificial gate structure. A first insulating layer is formed around the second semiconductor layers in the source/drain region and on lateral ends of the first semiconductor layers. The first insulating layer is partially removed from the second semiconductor layers in the source/drain region. A source/drain epitaxial layer is formed on the source/drain region, thereby forming air gaps between the source/drain epitaxial layer and the lateral ends of the first semiconductor layers. In one or more of the foregoing or following embodiments, when the first semiconductor layers are removed, the first semiconductor layers are laterally etched under the sacrificial gate structure. In one or more of the foregoing or following embodiments, after the first insulating layer is formed and before the first insulating layer is partially removed, a second insulating layer is formed on the first insulating layer, and the second insulating layer is partially etched. Each of the air gaps is defined at least by the source/drain epitaxial layer and the second insulating layer. In one or more of the foregoing or following embodiments, before the second insulating layer is partially etched, a structure of the second insulating layer is partially modified. In one or more of the foregoing or following embodiments, the structure of the second insulating layer is partially modified by ion implantation. In one or more of the foregoing or following embodiments, the second insulating layer includes a low-k dielectric material. In one or more of the foregoing or following embodiments, the first insulating layer includes at least one of silicon nitride and silicon oxide formed by atomic layer deposition.

In accordance with another aspect of the present disclosure, in a method of manufacturing a semiconductor device, a fin structure, in which first semiconductor layers and second semiconductor layers are alternately stacked, is formed. A sacrificial gate structure is formed over the fin structure. At least the first semiconductor layers are partially removed from a source/drain region of the fin structure, which is not covered by the sacrificial gate structure. A first insulating layer is formed at least on lateral ends of the first semiconductor layers. A second insulating layer is formed on the first semiconductor layers. A source/drain epitaxial layer is formed in contact with the second semiconductor layers. In one or more of the foregoing or following embodiments, after the source/drain epitaxial layer is formed, the sacrificial gate structure is removed, thereby exposing a part of the fin structure. The first semiconductor layers are removed from the exposed fin structure, thereby forming channel layers including the second semiconductor layers. A gate dielectric layer and a gate electrode layer are formed around the channel layers. In one or more of the foregoing or following embodiments, the gate electrode layer is isolated from the source/drain epitaxial layer by the first and second insulating layers.

In accordance with an aspect of the present disclosure, a semiconductor device includes semiconductor wires disposed over a substrate, a source/drain region in contact with the semiconductor wires, a gate dielectric layer disposed on and wrapping around each channel region of the semiconductor wires, a gate electrode layer disposed on the gate dielectric layer and wrapping around the each channel region, first insulating spacers disposed in spaces, respectively, and air gaps disposed in the spaces, respectively. The spaces are defined by adjacent semiconductor wires, the gate electrode layer and the source/drain region. In one or more of the foregoing or following embodiments, the semiconductor device further includes second insulating spacers disposed in the spaces, respectively. In one or more of the foregoing or following embodiments, the air gaps are in contact with the source/drain region. In one or more of the foregoing or following embodiments, the second insulating spacers are made of a low-k dielectric material. In one or more of the foregoing or following embodiments, the first insulating spacers are made of at least one selected from the group consisting of $SiO_2$ and SiN. In one or more of the foregoing or following embodiments, each of the first insulating spacers has a V-shaped cross section. In one or more of the foregoing or following embodiments, the source/drain region and the gate electrode layer are separated by the first insulating spacers, the air gaps and a gate dielectric layer. In one or more of the foregoing or following embodiments, the source/drain region is in contact with ends of the semiconductor wires. In one or more of the foregoing or following embodiments, the source/drain region wraps around parts of the semiconductor wires.

In accordance with another aspect of the present disclosure, a semiconductor device includes semiconductor wires disposed over a substrate, a source/drain epitaxial layer wrapping around source/drain regions of the semiconductor wires, a gate dielectric layer disposed on and wrapping around each channel region of the semiconductor wires, a gate electrode layer disposed on the gate dielectric layer and wrapping around the each channel region, and first insulating spacers disposed in spaces, respectively, and air gaps disposed in the spaces, respectively. The spaces are defined by adjacent semiconductor wires, the gate electrode layer and the source/drain region. In one or more of the foregoing or following embodiments, the semiconductor wires are made of SiGe or Ge. In one or more of the foregoing or following embodiments, the semiconductor device further includes second insulating spacers disposed in the spaces, respectively. In one or more of the foregoing or following embodiments, the air gaps are in contact with the source/drain region. In one or more of the foregoing or following embodiments, the second insulating spacers are made of a low-k dielectric material. In one or more of the foregoing or following embodiments, the first insulating spacers are made of at least one selected from the group consisting of $SiO_2$ and SiN. In one or more of the foregoing or following embodiments, each of the first insulating spacers has a V-shaped cross section. In one or more of the foregoing or following embodiments, the source/drain region and the gate electrode layer are separated by the first insulating spacers, the air gaps and the gate dielectric layer.

In accordance with another aspect of the present disclosure, a semiconductor device includes semiconductor wires disposed over a substrate, a source/drain epitaxial layer wrapping around source/drain regions of the semiconductor wires, a gate dielectric layer disposed on and wrapping around each channel region of the semiconductor wires, a gate electrode layer disposed on the gate dielectric layer and wrapping around the each channel region, first insulating spacers disposed in spaces, respectively, and second insulating spacers disposed in the spaces, respectively. The spaces being defined by adjacent semiconductor wires, the gate electrode layer and the source/drain region. In one or more of the foregoing or following embodiments, the first insulating spacers are made of at least one selected from the group consisting of $SiO_2$ and SiN. In one or more of the foregoing or following embodiments, the second insulating spacers are made of at least one selected from the group consisting of SiOC and SiOCN.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
semiconductor wires disposed over a substrate, each of the semiconductor wires including a channel region;

a source/drain region in contact with the first semiconductor wires;
a gate dielectric layer disposed on and wrapping around the channel region of each of the first semiconductor wires;
a gate electrode layer disposed on the gate dielectric layer and wrapping around the channel region; and
inner spacers each comprising:
a first insulating layer disposed in a space defined by adjacent first semiconductor wires, the gate dielectric layer and the source/drain region;
a second insulating layer disposed on the first insulating layer in the space; and
an air gap disposed in the space, wherein:
the air gap is defined by and in direct contact with the source/drain region, the first insulating layer and the second insulating layer, and
a lateral end of the first insulating layer is located closer to the source/drain region than a lateral end of the second insulating layer.

2. The semiconductor device of claim 1, wherein each of the inner spacers has a rectangular cross section.

3. The semiconductor device of claim 1, wherein:
the second insulating layer is made of a low-k dielectric material, and
the first insulating layer is made of at least one selected from the group consisting of $SiO_2$ and SiN.

4. The semiconductor device of claim 1, wherein the air gap is located between the second insulating layer and the source/drain region.

5. The semiconductor device of claim 1, wherein the source/drain region and the gate electrode layer are separated by the first insulating layer, the second insulating layer, the air gap and the gate dielectric layer.

6. The semiconductor device of claim 1, wherein the source/drain region is in contact with ends of the semiconductor wires.

7. The semiconductor device of claim 1, wherein the source/drain region wraps around parts of the semiconductor wires.

8. A semiconductor device, comprising:
semiconductor wires disposed over a substrate, each of the semiconductor wires having a channel region and a source/drain region;
a source/drain epitaxial layer wrapping around the source/drain region of each of the first semiconductor wires;
a gate dielectric layer disposed on and wrapping around the channel region of each of the first semiconductor wires;
a gate electrode layer disposed on the gate dielectric layer and wrapping around the channel region; and
inner spacers in direct contact with the gate dielectric layer, and each comprising multiple insulating layers made of different material from each other and disposed in a space which is defined by the gate dielectric layer and the source/drain epitaxial layer,
wherein a width of the inner spacers decreases toward the gate electrode layer.

9. The semiconductor device of claim 8, wherein the semiconductor wires are made of SiGe or Ge.

10. The semiconductor device of claim 8, wherein:
each of the inner spacers further comprises an air gap disposed in the space, and
the multiple insulating layers comprises:
a first insulating layer formed on and in contact with the adjacent first semiconductor wires and the gate dielectric layer, and
a second insulating layer disposed in contact with the first insulating layer and the air gap in the space.

11. The semiconductor device of claim 10, wherein the air gap is in contact with the source/drain region.

12. The semiconductor device of claim 10, wherein the second insulating layer is made of a low-k dielectric material.

13. The semiconductor device of claim 12, wherein the first insulating layer is made of at least one selected from the group consisting of $SiO_2$ and SiN.

14. The semiconductor device of claim 10, wherein a thickness of the first insulating layer is smaller than a thickness of the second insulating layer.

15. The semiconductor device of claim 8, wherein:
each of the inner spacers has a rectangular cross section, and
the source/drain region and the gate electrode layer are separated by the inner spacers and the gate dielectric layer.

16. The semiconductor device of claim 8, wherein the semiconductor wires pass through the source/drain epitaxial layer.

17. A semiconductor device, comprising:
semiconductor wires disposed over a substrate, each of the semiconductor wires having a channel region and a source/drain region;
a source/drain epitaxial layer disposed on the source/drain region of each of the first semiconductor wires;
a gate dielectric layer disposed on and wrapping around the channel region of each of the first semiconductor wires;
a gate electrode layer disposed on the gate dielectric layer and wrapping around the channel region; and
inner spacers each consisting of a first insulating layer conformally disposed in a space and a second insulating layer disposed on the first insulating layer in the space and made of a different material from the first insulating layer, the space being defined by adjacent first semiconductor wires, the gate dielectric layer and the source/drain epitaxial layer, and fully filled by the first and second insulating layers.

18. The semiconductor device of claim 17, wherein the second insulating layer is made of a material having a lower dielectric constant than the first insulating layer.

19. The semiconductor device of claim 17, wherein each of the inner spacers has a rectangular cross section.

20. The semiconductor device of claim 18, wherein:
the first insulating layer is made of at least one selected from the group consisting of $SiO_2$ and SiN, and
the second insulating layer is made of at least one selected from the group consisting of SiOC and SiOCN.

* * * * *